US012727321B2

(12) United States Patent
Ohsawa et al.

(10) Patent No.: US 12,727,321 B2
(45) Date of Patent: Sep. 1, 2026

(54) LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Nobuharu Ohsawa, Zama (JP); Satoshi Seo, Sagamihara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 587 days.

(21) Appl. No.: 18/266,908

(22) PCT Filed: Dec. 6, 2021

(86) PCT No.: PCT/IB2021/061348
§ 371 (c)(1),
(2) Date: Jun. 13, 2023

(87) PCT Pub. No.: WO2022/130107
PCT Pub. Date: Jun. 23, 2022

(65) Prior Publication Data

US 2024/0065024 A1 Feb. 22, 2024

(30) Foreign Application Priority Data

Dec. 18, 2020 (JP) ................................ 2020-210174

(51) Int. Cl.
*H10K 50/844* (2023.01)
*H10K 50/18* (2023.01)
(Continued)

(52) U.S. Cl.
CPC ......... *H10K 50/181* (2023.02); *H10K 50/826* (2023.02); *H10K 59/122* (2023.02);
(Continued)

(58) Field of Classification Search
CPC .... H05B 33/12; H05B 33/22; H10K 2101/50; H10K 50/125; H10K 50/15; H10K 50/157;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 102484923 A 5/2012
EP 2 474 204 A 7/2012
(Continued)

OTHER PUBLICATIONS

International Search Report (Application No. PCT/IB2021/061348) Dated Mar. 8, 2022.
(Continued)

*Primary Examiner* — Jaehwan Oh
(74) *Attorney, Agent, or Firm* — Husch Blackwell LLP

(57) ABSTRACT

A novel light-emitting device that is highly convenient, useful, or reliable is provided. A light-emitting device including a second electrode over a first electrode with an EL layer sandwiched therebetween is provided. The EL layer includes a light-emitting layer and an oxidation-resistant layer over the light-emitting layer. The EL layer includes a side surface. The light-emitting device includes a block layer in contact with a top surface and the side surface of the EL layer. The second electrode is in contact with the side surface of the EL layer through the block layer. The oxidation-resistant layer includes any one or a plurality of oxides of metals belonging to Group 4 to Group 8 of the periodic table and an organic compound having an electron-withdrawing group.

9 Claims, 22 Drawing Sheets

(51) Int. Cl.

| | |
|---|---|
| ***H10K 50/826*** | (2023.01) |
| ***H10K 59/122*** | (2023.01) |
| *H10K 50/125* | (2023.01) |
| *H10K 50/15* | (2023.01) |
| *H10K 59/35* | (2023.01) |
| *H10K 101/50* | (2023.01) |

(52) U.S. Cl.
CPC ........... *H10K 50/125* (2023.02); *H10K 50/15* (2023.02); *H10K 59/35* (2023.02); *H10K 2101/50* (2023.02)

(58) Field of Classification Search
CPC .. H10K 50/181; H10K 50/826; H10K 59/122; H10K 59/35
See application file for complete search history.

(56) References Cited

U.S. PATENT DOCUMENTS

| | | | | |
|---|---|---|---|---|
| 7,785,718 | B2 | 8/2010 | Yatsunami et al. | |
| 8,415,658 | B2 | 4/2013 | Kashiwabara | |
| 8,916,861 | B2 | 12/2014 | Kashiwabara | |
| 8,993,126 | B2 | 3/2015 | Nowatari et al. | |
| 9,209,415 | B2 | 12/2015 | Shitagaki et al. | |
| 2002/0072139 | A1 | 6/2002 | Kashiwabara | |
| 2009/0160325 | A1 | 6/2009 | Yatsunami et al. | |
| 2010/0320479 | A1* | 12/2010 | Minato | H10H 20/8514 257/E33.072 |
| 2010/0320481 | A1* | 12/2010 | Kashiwabara | H10K 59/876 257/E51.019 |
| 2011/0057178 | A1* | 3/2011 | Shitagaki | H10K 50/11 257/E51.026 |
| 2011/0148290 | A1 | 6/2011 | Oota | |
| 2011/0315968 | A1* | 12/2011 | Nowatari | H10K 50/19 257/E51.026 |
| 2012/0119201 | A1* | 5/2012 | Ueno | H05B 33/10 257/E51.026 |
| 2012/0132935 | A1* | 5/2012 | Isobe | H10K 50/17 257/E51.026 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1* | 4/2013 | Hamaguchi | H10K 71/233 430/319 |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2014/0061710 | A1* | 3/2014 | Kim | H10H 20/819 257/98 |
| 2015/0048355 | A1 | 2/2015 | Kashiwabara | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0244059 | A1 | 8/2017 | Sasaki et al. | |
| 2017/0256754 | A1 | 9/2017 | Defranco et al. | |
| 2018/0190908 | A1 | 7/2018 | Ke et al. | |
| 2020/0203662 | A1 | 6/2020 | Mollard et al. | |
| 2022/0209162 | A1 | 6/2022 | Seo et al. | |
| 2023/0066492 | A1* | 3/2023 | Kanehiro | H10K 50/15 |
| 2024/0099052 | A1* | 3/2024 | Ohsawa | H10K 50/181 |

FOREIGN PATENT DOCUMENTS

| | | | |
|---|---|---|---|
| JP | 2008-251270 | A | 10/2008 |
| JP | 2010-113899 | A | 5/2010 |
| JP | 2011-029322 | A | 2/2011 |
| JP | 2012-028318 | A | 2/2012 |
| JP | 2012-160473 | A | 8/2012 |
| JP | 2013-134847 | A | 7/2013 |
| JP | 2014-022221 | A | 2/2014 |
| JP | 2020-025137 | A | 2/2020 |
| KR | 2012-0073271 | A | 7/2012 |
| KR | 2013-0097647 | A | 9/2013 |
| TW | 201125165 | | 7/2011 |
| TW | 201214756 | | 4/2012 |
| WO | WO 2011/027653 | A1 | 3/2011 |
| WO | WO 2011/162105 | A1 | 12/2011 |

OTHER PUBLICATIONS

Written Opinion (Application No. PCT/IB2021/061348) Dated Mar. 8, 2022.

Zakhidov, A. et al., "Orthogonal Processing: A new Strategy for Organic Electronics," Chemical Science, Apr. 7, 2011, vol. 2, No. 6, pp. 1178-1182.

Malinowski, P. et al., "High Resolution Photolithography for Direct View Active Matrix Organic Light-Emitting Diode Augmented Reality Displays," Journal of the Society for Information Display, Apr. 2, 2018, vol. 26, No. 3, pp. 128-136.

Malinowski, P. et al., "Photolithographic Patterning of Organic Photodetectors with a Non-Fluorinated Photoresist System," Organic Electronics, Jul. 12, 2014, vol. 15, No. 10, pp. 2355-2359.

Malinowski, P. et al., "Multicolor 1250 ppi OLED Arrays Patterened by Photolithography," SID Digest '16: SID International Symposium Digest of Technical Papers, May 22, 2016, vol. 47, No. 1, pp. 1009-1012.

Papadopoulos, N. et al., "AMOLED Displays with In-Pixel Photodetector," Liquid Crystals and Display Technology, Jul. 9, 2020, pp. 1-19.

Ke, T. et al., "Technology Developments in High-Resolution FMM-free OLED and BEOL IGZO TFTs for Power-Efficient Microdisplays," SID Digest '21: SID International Symposium Digest of Technical Papers, May 1, 2021, vol. 52, No. 1, pp. 127-130.

Malinowski, P. et al., "Integration of Additional Functionalities into the Frontplane of AMOLED Displays," SID Digest '20: SID International Symposium Digest of Technical Papers, Aug. 1, 2020, vol. 51, No. 1, pp. 646-649.

Malinowski, P. et al., "Organic Photolithography for Displays with Integrated Fingerprint Scanner," SID Digest '19: SID International Symposium Digest of Technical Papers, May 29, 2019, vol. 50, No. 1, pp. 1007-1010.

Ke, T. et al., "Island and Hole Fabrication on OLED Stack for High-Resolution Sensor in Display Application", IDW '20: Proceedings of the 27th International Display Workshops, Dec. 9, 2020, vol. 27, pp. 902-905.

Gather, M. et al., "Solution-Processed Full-Color Polymer-OLED Displays Fabricated by Direct Photolithography," SID Digest '06: SID International Symposium Digest of Technical Papers, Jun. 1, 2006, vol. 37, No. 1, pp. 909-911.

Malinowski, P. et al., "Photolithography as Enabler of AMOLED Displays Beyond 1000 ppi," SID Digest '17: SID International Symposium Digest of Technical Papers, May 1, 2017, vol. 48, No. 1, pp. 623-626.

* cited by examiner

LIGHT-EMITTING DEVICE, LIGHT-EMITTING APPARATUS, ELECTRONIC DEVICE, AND LIGHTING DEVICE

This application is a 371 of international application PCT/IB2021/061348 filed on Dec. 6, 2021, which is incorporated herein by reference.

TECHNICAL FIELD

One embodiment of the present invention relates to a light-emitting device, a light-emitting apparatus, an electronic device, and a lighting device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting apparatus, a power storage device, a memory device, a method of driving any of them, and a method of manufacturing any of them.

BACKGROUND ART

A method of manufacturing an organic EL display in which a light-emitting layer can be formed without using a fine metal mask is known. An example is a method of manufacturing an organic EL display (Patent Document 1) having a step of forming a first light-emitting layer as a continuous film across a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film across a display region by deposition of a second luminescent organic material that contains a mixture of a host material and a dopant material but differs from the first luminescent organic material, over the first light-emitting layer; and a step of forming a counter electrode over the second light-emitting layer.

REFERENCE

Patent Document

[Patent Document 1] Japanese Published Patent Application No. 2012-160473

SUMMARY OF THE INVENTION

Problems to be Solved by the Invention

An object of one embodiment of the present invention is to provide a novel light-emitting device that is highly convenient, useful, or reliable. Another object of one embodiment of the present invention is to provide a novel light-emitting apparatus that is highly convenient, useful, or reliable. Another object of one embodiment of the present invention is to provide a novel electronic device that is highly convenient, useful, or reliable. Another object of one embodiment of the present invention is to provide a novel lighting device that is highly convenient, useful, or reliable.

Note that the description of these objects does not preclude the existence of other objects. In one embodiment of the present invention, there is no need to achieve all these objects. Other objects will be apparent from and can be derived from the description of the specification, the drawings, the claims, and the like.

Means for Solving the Problems

One embodiment of the present invention is a light-emitting device including a second electrode over a first electrode with an EL layer sandwiched therebetween. The EL layer includes a light-emitting layer and an oxidation-resistant layer over the light-emitting layer. The EL layer includes a side surface. The light-emitting device includes a block layer in contact with a top surface and the side surface of the EL layer. The second electrode is in contact with the side surface of the EL layer through the block layer. The block layer includes a hole-transport material.

Thus, the EL layer can be protected. For example, the oxidation-resistant layer can prevent oxidation of the EL layer even in the case where the EL layer is exposed to the atmosphere in a process of manufacturing the light-emitting device. Furthermore, the side surface (or an end portion) of the EL layer can be protected by the block layer. Even in a structure in which the second electrode is in contact with the side surface (or the end portion) of the EL layer, the block layer can prevent electrical continuity between the first electrode and the second electrode; therefore, various structures can be employed for the light-emitting device.

In the light-emitting device with the above structure, the oxidation-resistant layer may include any one or a plurality of oxides of metals belonging to Group 4 to Group 8 of the periodic table and an organic compound having an electron-withdrawing group.

In the light-emitting device with the above structure, the oxidation-resistant layer may include any one or a plurality of a molybdenum oxide, a vanadium oxide, a niobium oxide, a tantalum oxide, a chromium oxide, a tungsten oxide, a manganese oxide, a rhenium oxide, 7,7,8,8-tetracyano-2,3,5,6-tetrafluoroquinodimethane, 3,6-difluoro-2,5,7,7,8,8-hexacyanoquinodimethane, chloranil, 2,3,6,7,10,11-hexacyano-1,4,5,8,9,12-hexaazatriphenylene, 1,3,4,5,7,8-hexafluorotetracyano-naphthoquinodimethane, and 2-(7-dicyanomethylen-1,3,4,5,6,8,9,10-octafluoro-7H-pyren-2-ylidene)malononitrile.

With this structure, from the oxidation-resistant layer, holes are injected to the second electrode and electrons are injected to the electron-injection/transport layer when voltage is applied to the light-emitting device. Thus, in the light-emitting device of one embodiment of the present invention, electrons are not injected from the electrode to a layer containing an organic substance as a main component and electrons are injected from a layer containing an organic substance as a main component to another layer containing an organic substance as a main component. With a process of injecting electrons from an electrode to a layer containing an organic substance as a main component, the driving voltage of the light-emitting device might be increased; however, the light-emitting device of one embodiment of the present invention has no such a process and thus can have a low driving voltage. Experiments have shown that an increase in driving voltage over time is large in a light-emitting device with a high driving voltage; accordingly, an increase in driving voltage over time can be small in the light-emitting device with a low driving voltage of one embodiment of the present invention.

The light-emitting device with the above structure may include a block layer. The block layer may have a region sandwiched between the second electrode and the oxidation-resistant layer. The EL layer may have a side wall. The block layer may be in contact with the side wall.

Thus, the end portion of the EL layer can be protected. Even in a structure in which the second electrode surrounds the EL layer, electrical continuity between the first electrode and the second electrode can be prevented; therefore, various structures can be employed for the light-emitting device. For example, when a plurality of light-emitting devices are arranged, the second electrodes of the adjacent light-emitting devices can be connected to each other.

Another embodiment of the present invention is a light-emitting apparatus including the light-emitting device, and a transistor or a substrate.

Another embodiment of the present invention is a light-emitting apparatus including a first light-emitting device, a second light-emitting device, and a partition. The first light-emitting device includes a second electrode over a first electrode with a first EL layer sandwiched therebetween. The first EL layer includes a first light-emitting layer and a first oxidation-resistant layer over the first light-emitting layer. The second light-emitting device includes the second electrode over a third electrode with a second EL layer sandwiched therebetween. The second EL layer includes a second light-emitting layer and a second oxidation-resistant layer over the second light-emitting layer. A space is provided between the second EL layer and the first EL layer. The space includes a region overlapping with the partition and the second electrode. The space prevents electrical continuity between the first EL layer and the second EL layer.

When electrical continuity is established between a plurality of EL layers in a light-emitting apparatus (a display panel) with a high resolution exceeding 1000 ppi, crosstalk occurs, which narrows the displayable color gamut of the light-emitting apparatus. By providing a space in the light-emitting apparatus with a high resolution, the light-emitting apparatus can display bright colors.

In the light-emitting apparatus with the above structure, the first oxidation-resistant layer may include any one or a plurality of oxides of metals belonging to Group 4 to Group 8 of the periodic table and an organic compound having an electron-withdrawing group.

In the light-emitting apparatus with the above structure, the first oxidation-resistant layer may include any one or a plurality of a molybdenum oxide, a vanadium oxide, a niobium oxide, a tantalum oxide, a chromium oxide, a tungsten oxide, a manganese oxide, a rhenium oxide, 7,7,8,8-tetracyano-2,3,5,6-tetrafluoroquinodimethane, 3,6-difluoro-2,5,7,7,8,8-hexacyanoquinodimethane, chloranil, 2,3,6,7,10,11-hexacyano-1,4,5,8,9,12-hexaazatriphenylene, 1,3,4,5,7,8-hexafluorotetracyano-naphthoquinodimethane, and 2-(7-dicyano methylen-1,3,4,5,6,8,9,10-octafluoro-7H-pyren-2-ylidene)malononitrile.

In the light-emitting apparatus with the above structure, the first EL layer may include a first side surface, the second EL layer may include a second side surface, the light-emitting apparatus may include a block layer in contact with top surfaces of the first EL layer and the second EL layer and side surfaces of the first EL layer and the second EL layer, and the second electrode may be in contact with side surfaces of the first EL layer and the second EL layer through the block layer.

Formation of the block layer can protect the side surfaces (or end portions) of the EL layers and can prevent short circuit between the electrode formed over the EL layers and some parts of the EL layers.

One embodiment of the present invention is an electronic device including the light-emitting apparatus with the above structure, and a sensor, an operation button, a speaker, or a microphone.

One embodiment of the present invention is a lighting device including the light-emitting apparatus with the above structure and a housing.

Although the block diagram in drawings attached to this specification shows components classified by their functions in independent blocks, it is difficult to classify actual components according to their functions completely, and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; actually, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state in which current, voltage, or a potential can be supplied or transmitted. Accordingly, connection means not only direct connection but also indirect connection through a circuit element such as a wiring, a resistor, a diode, or a transistor that allows current, voltage, or a potential to be supplied or transmitted.

In this specification, even when independent components are connected to each other in a circuit diagram, there is actually a case where one conductive film has functions of a plurality of components, such as a case where part of a wiring serves as an electrode. The term "connection" in this specification also includes such a case where one conductive film has functions of a plurality of components, in its category.

In this specification, one of a first electrode and a second electrode of a transistor refers to a source electrode and the other refers to a drain electrode.

Effect of the Invention

With one embodiment of the present invention, a novel light-emitting device that is highly convenient, useful, or reliable can be provided. With one embodiment of the present invention, a novel light-emitting apparatus that is highly convenient, useful, or reliable can be provided. With one embodiment of the present invention, a novel electronic device that is highly convenient, useful, or reliable can be provided. With one embodiment of the present invention, a novel lighting device that is highly convenient, useful, or reliable can be provided.

Note that the description of these effects does not preclude the existence of other effects. One embodiment of the present invention does not necessarily have all these effects. Other effects will be apparent from and can be derived from the description of the specification, the drawings, the claims, and the like.

MODE FOR CARRYING OUT THE INVENTION

Figure 1A:
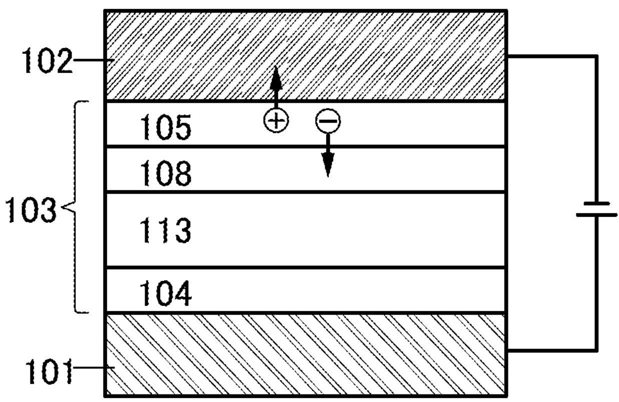
FIG. 1A and FIG. 1B are diagrams illustrating structures of a light-emitting device of an embodiment.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, structures of a light-emitting device and a display panel of one embodiment of the present invention will be described with reference to FIG. 1 and FIG. 2.

Figure 1B:
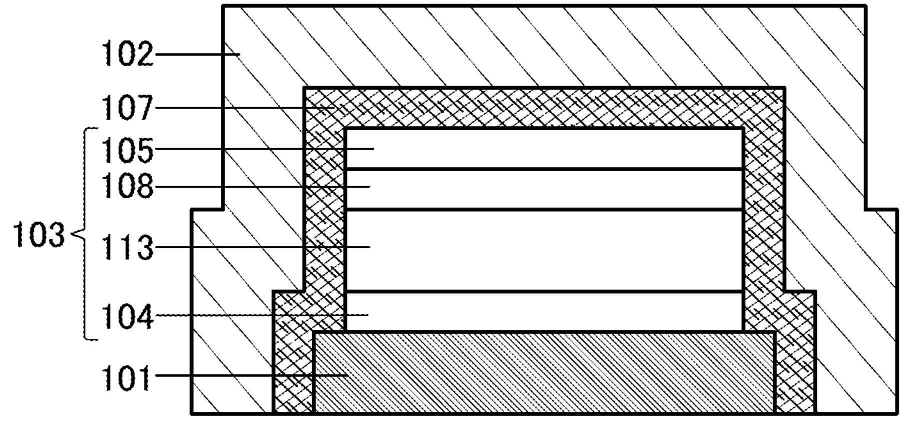

FIG. 1A and FIG. 1B are cross-sectional views illustrating a light-emitting device 100 of one embodiment of the present invention.

As illustrated in FIG. 1A and FIG. 1B, the light-emitting device 100 includes a first electrode 101, a second electrode 102, and an EL layer 103. The EL layer 103 includes an oxidation-resistant layer 105, a hole-injection/transport layer 104, an electron-injection/transport layer 108, and a light-emitting layer 113. The first electrode 101 includes a region overlapping with the second electrode 102, and the EL layer 103 includes a region sandwiched between the first electrode 101 and the second electrode 102.

The oxidation-resistant layer 105 is positioned in the uppermost layer of the EL layer 103. Thus, the EL layer 103 can be protected. For example, the oxidation-resistant layer 105 can prevent oxidation of the EL layer 103 even in the case where the EL layer 103 is exposed to the atmosphere in a process of manufacturing the light-emitting device 100.

Note that the oxidation-resistant layer 105 is formed with an oxidation-resistant material. Specifically, in this embodiment, a composite material obtained by adding an electron-acceptor material to a hole-transport material, which is an organic compound described later as a material that can be used for a charge-generation layer of the EL layer, or a stacked-layer structure of a hole-transport material and an electron-acceptor material can be used. As the electron-acceptor material, a material described later in this embodiment as an organic acceptor material used for the hole-injection layer can be used.

As the electron-acceptor material, specifically, an oxide of metal that belong to any of Group 4 to Group 8 of the periodic table or an organic compound having an electron-withdrawing group (a halogen group or a cyano group), such as a quinodimethane derivative, a chloranil derivative, or a hexaazatriphenylene derivative, is preferably used.

Specific examples of the oxides of metals that belong to Group 4 to Group 8 of the periodic table include molybdenum oxide, vanadium oxide, niobium oxide, tantalum oxide, chromium oxide, tungsten oxide, manganese oxide, and rhenium oxide. The use of the metal oxide as the electron-acceptor material can improve the oxidation resistance of the oxidation-resistant layer 105. Among the above, molybdenum oxide is preferable as a material for forming the oxidation-resistant layer 105 because it is stable in the air, has a low hygroscopic property, and is easily handled.

As the organic compound having an electron-withdrawing group such as a quinodimethane derivative, a chloranil derivative, or a hexaazatriphenylene derivative, specifically, 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: $F_6$-TCNNQ), 2-(7-dicyanomethylen-1,3,4,5,6,8,9,10-octafluoro-7H-pyren-2-ylidene)malononitrile, or the like can be used. In particular, a compound in which an electron-withdrawing group is bonded to a condensed aromatic ring having a plurality of heteroatoms, such as HAT-CN, is preferable as the material for forming the oxidation-resistant layer 105 because the film quality is thermally stable.

When the oxidation-resistant layer 105 has the above structure and voltage is applied to the light-emitting device 100, from the oxidation-resistant layer 105, holes are injected to the second electrode 102 and electrons are injected to the electron-injection/transport layer 108. Thus, in the light-emitting device 100, electrons are not injected from the electrode to a layer containing an organic substance as a main component and electrons are injected from a layer containing an organic substance as a main component to another layer containing an organic substance as a main component. With a process of injecting electrons from an electrode to a layer containing an organic substance as a main component, the driving voltage of the light-emitting device might be increased; however, the light-emitting device 100 has no such a process and thus can have a low driving voltage. Experiments have shown that an increase in driving voltage over time is large in a light-emitting device with a high driving voltage; accordingly, an increase in driving voltage over time can be small in the light-emitting device 100 with a low driving voltage of one embodiment of the present invention.

When voltage is applied to the light-emitting device 100 as illustrated in FIG. 1A, the first electrode 101 functions as an anode and the second electrode 102 functions as a cathode.

As illustrated in FIG. 1B, the light-emitting device 100 may include a block layer 107. The block layer 107 includes a region sandwiched between the second electrode 102 and the oxidation-resistant layer 105. The block layer 107 includes a region in contact with a top surface (or an upper portion) and a side surface (or an end portion) of the EL layer 103. The second electrode 102 includes a region in contact with the side surface (or the end portion) of the EL layer 103 through the block layer 107.

Thus, the side surface (or the end portion) of the EL layer 103 can be protected. Even in a structure in which the second electrode 102 is in contact with the side surface (or the end portion) of the EL layer 103 as illustrated in FIG. 1B, the block layer 107 can prevent electrical continuity between the first electrode 101 and the second electrode 102; therefore, various structures can be employed for the light-emitting device 100. For example, when a plurality of light-emitting devices 100 are arranged, the second electrodes 102 of the adjacent light-emitting devices 100 can be connected to each other.

A hole-transport material is preferably used as a material for forming the block layer 107. Specific examples of the hole-transport material are described later in this embodiment. Note that the block layer 107 may function as an EL layer. The block layer 107 may have a function of an EL layer.

As a material for forming the hole-injection/transport layer 104, materials for a hole-injection layer and a hole-transport layer that will be described later in this embodiment can be used. Note that the hole-injection/transport layer 104 may be formed using a single layer or a plurality of layers. Alternatively, a hole-injection layer and a hole-transport layer may be formed separately. Further alternatively, only one of a hole-injection layer and a hole-transport layer may be provided instead of the hole-injection/transport layer 104.

As a material for forming the electron-injection/transport layer 108, materials for an electron-injection layer and a hole-transport layer that will be described later in this embodiment can be used. Note that the electron-injection/transport layer 108 may be formed using a single layer or a plurality of layers. Alternatively, a hole-injection layer and a hole-transport layer may be formed separately. Further alternatively, only one of an electron-injection layer and an electron-transport layer may be provided instead of the electron-injection/transport layer 108.

Note that the structure of the light-emitting device of one embodiment of the present invention is not limited to the structure illustrated in FIG. 1. A basic structure of a light-emitting device will be described with reference to FIG. 2.

Basic Structure of Light-Emitting Device

Figure 2A:
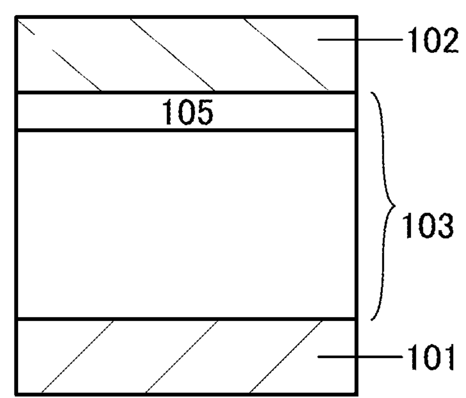
FIG. 2A to FIG. 2E are diagrams illustrating structures of a light-emitting device of an embodiment.

A basic structure of a light-emitting device is described. FIG. 2A illustrates a light-emitting device including, between a pair of electrodes, an EL layer including a light-emitting layer. Specifically, the light-emitting device has a structure in which the EL layer 103 is sandwiched between the first electrode 101 and the second electrode 102. Note that the EL layer 103 includes the oxidation-resistant layer 105.

Figure 2B:
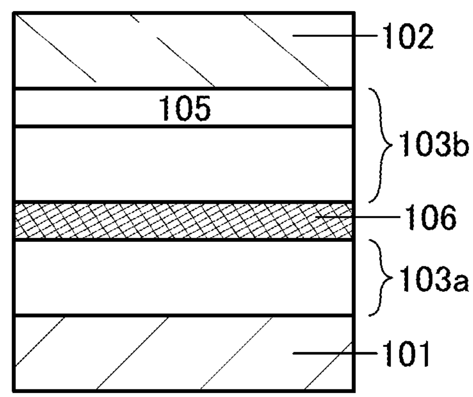

FIG. 2B illustrates a light-emitting device with a stacked-layer structure (a tandem structure) in which a plurality of EL layers (103*a* and 103*b*, two layers in FIG. 2B) are provided between a pair of electrodes and a charge-generation layer 106 is provided between the EL layers. With a tandem light-emitting device, a light-emitting apparatus enabling low-voltage driving and low power consumption can be obtained. Note that the EL layer 103*b* includes the oxidation-resistant layer 105.

The charge-generation layer 106 has a function of injecting electrons to one of the EL layers (103*a* or 103*b*) and injecting holes to the other of the EL layers (103*b* or 103*a*) when a potential difference is generated between the first electrode 101 and the second electrode 102. Thus, when voltage is applied in FIG. 2B such that the potential of the first electrode 101 is higher than that of the second electrode 102, electrons are injected to the EL layer 103*a* and holes are injected to the EL layer 103*b* from the charge-generation layer 106.

Note that in terms of light extraction efficiency, the charge-generation layer 106 preferably has a light-transmitting property with respect to visible light (specifically, the visible light transmittance with respect to the charge-generation layer 106 is 40% or higher). Furthermore, the charge-generation layer 106 functions even when having lower conductivity than the first electrode 101 or the second electrode 102.

Figure 2C:
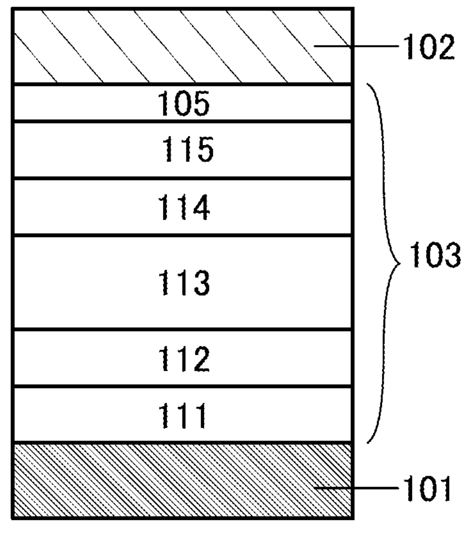

FIG. 2C illustrates a stacked-layer structure of the EL layer 103 in the light-emitting device of one embodiment of the present invention. Note that in this case, the first electrode 101 functions as an anode and the second electrode 102 functions as a cathode. The EL layer 103 has a structure in which a hole-injection layer 111, a hole-transport layer 112, the light-emitting layer 113, an electron-transport layer 114, an electron-injection layer 115, and the oxidation-resistant layer 105 are stacked sequentially over the first electrode 101. Note that the light-emitting layer 113 may have a stacked-layer structure of a plurality of light-emitting layers that emit light of different colors. For example, a light-emitting layer containing a light-emitting substance that emits red light, a light-emitting layer containing a light-emitting substance that emits green light, and a light-emitting layer containing a light-emitting substance that emits blue light may be stacked with or without a layer containing a carrier-transport material therebetween. Alternatively, a light-emitting layer containing a light-emitting substance that emits yellow light and a light-emitting layer containing a light-emitting substance that emits blue light may be used in combination. Note that the stacked-layer structure of the light-emitting layer 113 is not limited to the above. For example, the light-emitting layer 113 may have a stacked-layer structure of a plurality of light-emitting layers that emit light of the same color. For example, a first light-emitting layer containing a light-emitting substance that emits blue light and a second light-emitting layer containing a light-emitting substance that emits blue light may be stacked with or without a layer containing a carrier-transport material therebetween. The structure in which a plurality of light-emitting layers that emit light of the same color are stacked can achieve higher reliability than a single-layer structure in some cases. Even in the case where a plurality of EL layers are provided as in the tandem structure illustrated in FIG. 2B, the layers in each EL layer are sequentially stacked from the anode side as described above. When the first electrode 101 is a cathode and the second electrode 102 is an anode, the stacking order in the EL layer 103 is reversed. Specifically, the layer 111 over the first electrode 101 serving as the cathode is an electron-injection layer; the layer 112 is an electron-transport layer; the layer 113 is a light-emitting layer; the layer 114 is a hole-transport layer; and the layer 115 is a hole-injection layer.

The light-emitting layers 113 included in the EL layers (103, 103*a*, and 103*b*) each contain an appropriate combination of a light-emitting substance and a plurality of substances, so that fluorescent light or phosphorescent light of a desired emission color can be obtained. Furthermore, the light-emitting layer 113 may have a stacked-layer structure having different emission colors. In that case, different materials may be used for the light-emitting substance and other substances used in each of the light-emitting layers that are stacked. Furthermore, a structure in which different emission colors can be obtained from the plurality of EL layers (103*a* and 103*b*) illustrated in FIG. 2B may be employed. Also in that case, different materials may be used for the light-emitting substance and other substances used in each of the light-emitting layers.

In addition, the light-emitting device of one embodiment of the present invention can have a micro optical resonator (microcavity) structure with the first electrode 101 being a reflective electrode and the second electrode 102 being a transflective electrode in FIG. 2C, for example, and light emission obtained from the light-emitting layer 113 in the EL layer 103 can be resonated between the electrodes and light emission obtained through the second electrode 102 can be intensified.

Note that when the first electrode 101 of the light-emitting device is a reflective electrode having a stacked-layer structure of a reflective conductive material and a light-transmitting conductive material (a transparent conductive film), optical adjustment can be performed by adjusting the thickness of the transparent conductive film. Specifically, when the wavelength of light obtained from the light-emitting layer 113 is $\lambda$, the optical path length (the product of the film thickness and the refractive index) between the first electrode 101 and the second electrode 102 is preferably adjusted to $m\lambda/2$ (m is a natural number larger than or equal to 1) or the vicinity thereof.

To amplify desired light (wavelength: $\lambda$) obtained from the light-emitting layer 113, the optical path length from the first electrode 101 to a region where the desired light is obtained in the light-emitting layer 113 (a light-emitting region) and the optical path length from the second electrode 102 to the region where the desired light is obtained in the light-emitting layer 113 (the light-emitting region) are preferably adjusted to $(2m'+1)\lambda/4$ (m' is a natural number larger than or equal to 1) or the vicinity thereof. Here, the light-emitting region refers to a region where holes and electrons are recombined in the light-emitting layer 113.

By performing such optical adjustment, the spectrum of specific monochromatic light obtained from the light-emitting layer 113 can be narrowed and light emission with high color purity can be obtained.

Note that in the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained with given positions in the first electrode 101 and the second electrode 102 being supposed to be reflective regions. Furthermore, the optical path length between the first electrode 101 and the light-emitting layer from which the desired light is obtained is, to be exact, the optical path length between the reflective region in the first electrode 101 and the light-emitting region in the light-emitting layer from which the desired light is obtained. However, it is difficult to precisely determine the reflective region in the first electrode 101 and the light-emitting region in the light-emitting layer from which the desired light is obtained; thus, it is assumed that the above effect can be sufficiently obtained with a given position in the first electrode 101 being supposed to be the reflective region and a given position in the light-emitting layer from which the desired light is obtained being supposed to be the light-emitting region.

Figure 2D:
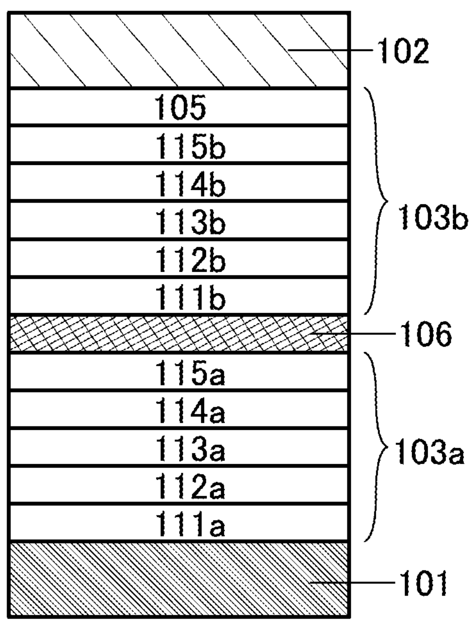

The light-emitting device illustrated in FIG. 2D is a light-emitting device having a tandem structure. Owing to a microcavity structure of the light-emitting device, light (monochromatic light) with different wavelengths from the EL layers (103*a* and 103*b*) can be extracted. Thus, side-by-side patterning for obtaining different emission colors (e.g., RGB) is not necessary. Therefore, higher resolution can be easily achieved. In addition, a combination with coloring layers (color filters) is also possible. Furthermore, the emission intensity of light with a specific wavelength in the front direction can be increased, whereby power consumption can be reduced. Note that the EL layer 103*b* includes the oxidation-resistant layer 105.

Figure 2E:
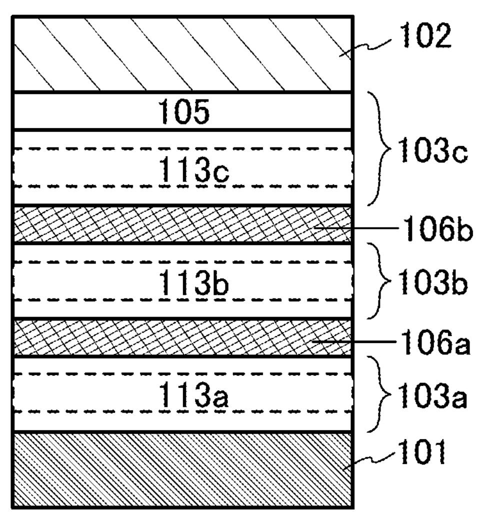

A light-emitting device illustrated in FIG. 2E is an example of the light-emitting device with the tandem structure illustrated in FIG. 2B, and includes three EL layers (103*a*, 103*b*, and 103*c*) stacked with charge-generation layers (106*a* and 106*b*) therebetween, as illustrated in the drawing. Note that the three EL layers (103*a*, 103*b*, and 103*c*) include respective light-emitting layers (113*a*, 113*b*, and 113*c*) and the emission colors of the respective light-emitting layers can be combined freely. For example, the light-emitting layer 113*a* can emit blue light, the light-emitting layer 113*b* can emit red, green, or yellow light, and the light-emitting layer 113*c* can emit blue light; for another example, the light-emitting layer 113*a* can emit red light, the light-emitting layer 113*b* can emit blue, green, or yellow light, and the light-emitting layer 113*c* can emit red light. Note that the EL layer 103*c* includes the oxidation-resistant layer 105.

In the above light-emitting device of one embodiment of the present invention, at least one of the first electrode 101 and the second electrode 102 is a light-transmitting electrode (a transparent electrode, a transflective electrode, or the like). In the case where the light-transmitting electrode is a transparent electrode, the visible light transmittance of the transparent electrode is 40% or higher. In the case where the light-transmitting electrode is a transflective electrode, the visible light reflectance of the transflective electrode is higher than or equal to 20% and lower than or equal to 80%, preferably higher than or equal to 40% and lower than or equal to 70%. The resistivity of these electrodes is preferably $1\times10^{-2}$ Ωcm or lower.

In the case where one of the first electrode 101 and the second electrode 102 is an electrode having a reflecting property (a reflective electrode) in the above light-emitting device of one embodiment of the present invention, the visible light reflectance of the electrode having a reflecting property is higher than or equal to 40% and lower than or equal to 100%, preferably higher than or equal to 70% and lower than or equal to 100%. The resistivity of this electrode is preferably $1\times10^{-2}$ Ωcm or lower.

Specific Structure of Light-Emitting Device

Next, specific structures of light-emitting devices of embodiments of the present invention will be described with reference to FIG. 2. Here, description is made using FIG. 2D illustrating the tandem structure. Note that the structure of the EL layer applies also to the light-emitting devices having a single structure in FIG. 2A and FIG. 2C. In the case where the light-emitting device illustrated in FIG. 2D has a microcavity structure, the first electrode 101 is formed as a reflective electrode and the second electrode 102 is formed as a transflective electrode. Thus, a single-layer structure or a stacked-layer structure can be formed using one or more kinds of desired electrode materials. Note that the second electrode 102 is formed after formation of the EL layer 103*b*, with the use of a material selected as described above.

First Electrode and Second Electrode

As materials for forming the first electrode 101 and the second electrode 102, any of the following materials can be used in an appropriate combination as long as the functions of the both electrodes described above can be fulfilled. For example, a metal, an alloy, an electrically conductive compound, and a mixture of these can be used as appropriate. Specifically, an In—Sn oxide (also referred to as ITO), an In—Si—Sn oxide (also referred to as ITSO), an In—Zn oxide, and an In—W—Zn oxide are given. In addition, it is also possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not listed above as an example (for example, lithium (Li), cesium (Cs), calcium (Ca), or strontium (Sr)), a rare earth metal such as europium (Eu) or ytterbium (Yb), an alloy containing an appropriate combination of any of these elements, graphene, or the like.

In the light-emitting device illustrated in FIG. 2D, when the first electrode 101 is an anode, a hole-injection layer 111*a* and a hole-transport layer 112*a* of the EL layer 103*a* are sequentially stacked over the first electrode 101 by a vacuum evaporation method. After the EL layer 103*a* and the charge-generation layer 106 are formed, a hole-injection layer 111*b* and a hole-transport layer 112*b* of the EL layer 103*b* are sequentially stacked over the charge-generation layer 106 in a similar manner.

Hole-Injection Layer

The hole-injection layers (111, 111*a*, and 111*b*) are each a layer that injects holes from the first electrode 101 which is an anode or from the charge-generation layer (106, 106*a*, or 106*b*) to the EL layer (103, 103*a*, or 103*b*) and contains any one or both of an organic acceptor material and a material with a high hole-injection property.

The organic acceptor material is a material that allows holes to be generated in another organic compound whose HOMO level value is close to the LUMO level value of the organic acceptor material when charge separation is caused between the organic acceptor material and the organic compound. Thus, as the organic acceptor material, a compound having an electron-withdrawing group (e.g., a halogen group or a cyano group), such as a quinodimethane derivative, a chloranil derivative, or a hexaazatriphenylene derivative, can be used. For example, it is possible to use 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: $F_6$-TCNNQ), or 2-(7-dicyanomethylen-1,3,4,5,6,8,9,10-octafluoro-7H-pyren-2-ylidene)malononitrile. Note that among organic acceptor materials, a compound in which electron-withdrawing groups are bonded to condensed aromatic rings each having a plurality of heteroatoms, such as HAT-CN, is particularly preferred because it has a high acceptor property and stable film quality against heat. Alternatively, a [3]radialene derivative having an electron-withdrawing group (in particular, a cyano group or a halogen group such as a fluoro group) has a very high electron-accepting property and thus is preferable. Specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3- cyclopropanetriylidenetris[2,3,4,5,6-pentafluorobenzeneacetonitrile], or the like can be used.

As the material having a high hole-injection property, an oxide of a metal belonging to Group 4 to Group 8 in the periodic table (e.g., a transition metal oxide such as a molybdenum oxide, a vanadium oxide, a ruthenium oxide, a tungsten oxide, or a manganese oxide) can be used. As specific examples, molybdenum oxide, vanadium oxide, niobium oxide, tantalum oxide, chromium oxide, tungsten oxide, manganese oxide, and rhenium oxide are given. In particular, molybdenum oxide is preferable because it is stable in the air, has a low hygroscopic property, and is easily handled. It is also possible to use a phthalocyanine-based compound such as phthalocyanine (abbreviation: $H_2Pc$) or copper phthalocyanine (abbreviation: CuPc), or the like.

In addition to the above materials, it is also possible to use an aromatic amine compound, which is a low molecular compound, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

It is also possible to use a high molecular compound (an oligomer, a dendrimer, a polymer, or the like) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), or poly[N,N-bis(4-butylphenyl)-N,N-bis(phenyl)benzidine] (abbreviation: Poly-TPD). It is also possible to use a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

As the material with a high hole-injection property, a composite material containing a hole-transport material and the above-described organic acceptor material (an electron-accepting material) can be used. In that case, the organic acceptor material extracts electrons from the hole-transport material, so that holes are generated in the hole-injection layer 111 and the holes are injected into the light-emitting layer 113 through the hole-transport layer 112. Note that the hole-injection layer 111 may be formed as a single layer formed of a composite material containing a hole-transport material and an organic acceptor material (an electron-accepting material), or may be formed by stacking a layer containing a hole-transport material and a layer containing an organic acceptor material (an electron-accepting material).

The hole-transport material is preferably a substance having a hole mobility higher than or equal to $1\times10^{-6}$ $cm^2/Vs$ in the case where the square root of the electric field strength [V/cm] is 600. Note that other substances can be used as long as they have a property of transporting more holes than electrons.

As the hole-transport material, a material having a high hole-transport property, such as a π-electron rich heteroaromatic compound (e.g., a carbazole derivative, a furan derivative, or a thiophene derivative) or an aromatic amine (a compound having an aromatic amine skeleton), is preferable.

Examples of the above carbazole derivative (a compound having a carbazole skeleton) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(biphenyl-4-yl)-3,3'-bi-9H-carbazole (abbreviation: BisBPCz), bis-{9-(1,1'-biphenyl-3-yl)-9H,9'H-3,3'-bicarbazole} (abbreviation: BismBPCz), 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the above aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N-diphenyl-9,9-dimethylfluorene-2,7-diamine (abbreviation: YGA2F), and 4,4',4"-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (the compound having a furan skeleton) include 4,4',4"-(benzene-1,3,5-triyl)tri(dibenzofuran) (abbreviation: DBF3P-II), and 4-{3-

[3-(9-phenyl-9H-fluoren-9-yl)phenyl]phenyl}dibenzofuran (abbreviation: mmDBFFLBi-II).

Specific examples of the above thiophene derivative (a compound having a thiophene skeleton) include compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Specific examples of the aromatic amine include 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]spiro-9,9'-bifluorene (abbreviation: DPA2SF), 4,4',4"-tris[N-(1-naphthyl)-N-phenylamino]triphenylamine (abbreviation: l'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), NA-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)-triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Alternatively, it is also possible to use, as the hole-transport material, a high molecular compound (e.g., an oligomer, a dendrimer, or a polymer) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N-bis(phenyl)benzidine] (abbreviation: Poly-TPD). Alternatively, it is also possible to use a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

Note that the hole-transport material is not limited to the above, and one of or a combination of various known materials may be used as the hole-transport material.

Note that the hole-injection layers (111, 111*a*, and 111*b*) can be formed by any of various known deposition methods, and can be formed by a vacuum evaporation method, for example.

Hole-Transport Layer

The hole-transport layers (112, 112*a*, and 112*b*) are each a layer that transports the holes, which are injected from the first electrode 101 by the hole-injection layers (111, 111*a*, and 111*b*), to the light-emitting layers (113, 113*a*, and 113*b*). Note that the hole-transport layers (112, 112*a*, and 112*b*) are each a layer containing a hole-transport material. Thus, for the hole-transport layers (112, 112*a*, and 112*b*), a hole-transport material that can be used for the hole-injection layers (111, 111*a*, and 111*b*) can be used.

Note that in the light-emitting device of one embodiment of the present invention, the organic compound used for the hole-transport layers (112, 112*a*, and 112*b*) can also be used for the light-emitting layers (113, 113*a*, and 113*b*). The use of the same organic compound for the hole-transport layers (112, 112*a*, and 112*b*) and the light-emitting layers (113, 113*a*, and 113*b*) is preferable, in which case holes can be efficiently transported from the hole-transport layers (112, 112*a*, and 112*b*) to the light-emitting layers (113, 113*a*, and 113*b*).

Light-Emitting Layer

The light-emitting layers (113, 113*a*, 113*b*, and 113*c*) are each a layer containing a light-emitting substance. Note that as the light-emitting substance that can be used for the light-emitting layers (113, 113*a*, 113*b*, and 113*c*), a substance that exhibits an emission color of blue, purple, bluish purple, green, yellowish green, yellow, orange, red, or the like can be used as appropriate. In the case where the number of light-emitting layers is two or more, different light-emitting substances are used for the light-emitting layers; thus, different emission colors can be exhibited (for example, complementary emission colors are combined to obtain white light emission). Furthermore, one light-emitting layer may have a stacked-layer structure containing different light-emitting substances.

The light-emitting layers (113, 113*a*, 113*b*, and 113*c*) may each contain one or more kinds of organic compounds (a host material and the like) in addition to a light-emitting substance (a guest material).

In the case where a plurality of host materials are used in the light-emitting layers (113, 113*a*, 113*b*, and 113*c*), a second host material that is additionally used is preferably a substance having a larger energy gap than those of a known guest material and a first host material. Preferably, the lowest singlet excitation energy level (S1 level) of the second host material is higher than the Si level of the first host material, and the lowest triplet excitation energy level (Ti level) of the second host material is higher than the Ti level of the guest material. Furthermore, the lowest triplet excitation energy level (T1 level) of the second host material is preferably higher than the Ti level of the first host material. With such a structure, an exciplex can be formed by the two kinds of host materials. To form an exciplex efficiently, it is particularly preferable to combine a compound that easily accepts holes (a hole-transport material) and a compound that easily accepts electrons (an electron-transport material). With this structure, high efficiency, low voltage, and a long lifetime can be achieved at the same time.

As an organic compound used as the host material (including the first host material and the second host material), organic compounds such as the hole-transport materials usable for the hole-transport layers (112, 112*a*, and 112*b*) described above and electron-transport materials usable for electron-transport layers (114, 114*a*, and 114*b*) described later can be used as long as they satisfy requirements for the host material used in the light-emitting layer. Another example is an exciplex formed by two or more kinds of organic compounds (the first host material and the second host material). An exciplex (also referred to as Exciplex) whose excited state is formed by a plurality of kinds of organic compounds has an extremely small difference between the Si level and the Ti level and functions as a TADF material that can convert triplet excitation energy into singlet excitation energy. As a combination of the plurality of kinds of organic compounds forming an exciplex, for example, it is preferable that one have a π-electron deficient heteroaromatic ring and the other have a π-electron rich heteroaromatic ring. A phosphorescent substance such as an iridium-, rhodium-, or platinum-based organometallic complex or a metal complex may be used as one of the combination forming an exciplex.

The light-emitting substance that can be used in the light-emitting layers (113, 113*a*, 113*b*, and 113*c*) is not particularly limited, and a light-emitting substance that converts singlet excitation energy into light emission in the visible light range or a light-emitting substance that converts triplet excitation energy into light emission in the visible light range can be used.

Light-Emitting Substance that Converts Singlet Excitation Energy into Light

The following substances emitting fluorescent light (fluorescent substances) are given as the light-emitting substance that can be used for the light-emitting layer 113 and convert singlet excitation energy into light emission. The examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N-bis(3-methylphenyl)-N,N-bis[3-(9-phenyl-9H-fluoren-9-yl)phenyl]pyrene-1,6-diamine (abbreviation: 1, 6mMemFLPAPrn), (N,N'-diphenyl-N,N'-bis[4-(9-phenyl-9H-fluoren-9-yl)phenyl]pyrene-1,6-diamine) (abbreviation: 1,6FLPAPrn), N,N'-bis(dibenzofuran-2-yl)-N,N-diphenylpyrene-1,6-diamine (abbreviation: 1,6FrAPrn), N,N'-bis(dibenzothiophen-2-yl)-N,N-diphenylpyrene-1,6-diamine (abbreviation: 1,6ThAPrn), N,N'-(pyrene-1,6-diyl)bis[(N-phenylbenzo[b]naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine] (abbreviation: 1,6BnfAPrn-02), and N,N-(pyrene-1,6-diyl)bis[(6,N-diphenylbenzo[b]naphtho[1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-di phenyl-2-anthryl)tri phenyl amine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra-tert-butylperylene (abbreviation: TBP), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), or the like.

It is also possible to use, for example, N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9- amine (abbreviation: DPhAPhA), coumarin 545T, N,N-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 1,6BnfAPrn-03, 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). In particular, pyrenediamine compounds such as 1,6FLPAPrn, 1,6mMemFLPAPrn, and 1,6BnfAPrn-03 can be used, for example.

Light-Emitting Substance that Converts Triplet Excitation Energy into Light

Next, as examples of the light-emitting substance that converts triplet excitation energy into light and can be used for the light-emitting layer 113, a substance that emits phosphorescent light (a phosphorescent substance) and a thermally activated delayed fluorescent (TADF) material that exhibits thermally activated delayed fluorescence are given.

A phosphorescent substance refers to a compound that exhibits phosphorescence but does not exhibit fluorescence at a temperature higher than or equal to low temperatures (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), a rare earth metal complex, or the like. Specifically, a transition metal element is preferable and it is particularly preferable that a platinum group element (ruthenium (Ru), rhodium (Rh), palladium (Pd), osmium (Os), iridium (Ir), or platinum (Pt)), especially iridium, be contained, in which case the transition probability relating to direct transition between the singlet ground state and the triplet excited state can be increased.

Phosphorescent Substance (from 450 nm to 570 nm: Blue or Green)

As a phosphorescent substance that exhibits blue or green and whose emission spectrum has a peak wavelength at greater than or equal to 450 nm and less than or equal to 570 nm, the following substances are given.

The examples include: organometallic complexes having a 4H-triazole skeleton, such as tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: [Ir($CF_3$ppy)$_2$(pic)]), and bis[2-(4',6'-difluorophenyl)pyridinato-N,$C^{2'}$]iridium(III) acetylacetonate (abbreviation: FIr(acac)).

Phosphorescent Substance (from 495 nm to 590 nm: Green or Yellow)

As a phosphorescent substance that exhibits green or yellow and whose emission spectrum has a peak wavelength at greater than or equal to 495 nm and less than or equal to 590 nm, the following substances are given.

The examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κ$N^3$]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)

$_3$]), bis(2-phenylquinolinato-N,$C^{2'}$)iridium(III) acetylacetonate (abbreviation: [Ir(pq)$_2$(acac)]), bis[2-(2-pyridinyl-κ2)phenyl-κC][2-(5-phenyl-2-pyridinyl-κN2) phenyl-κC]iridium(III) (abbreviation: [Ir(ppy)$_2$(4dppy)]), and bis[2-(2-pyridinyl-κN)phenyl-κC][2-(4-methyl-5-phenyl-2-pyridinyl-κN)phenyl-κC]; organometallic complexes such as bis(2,4-diphenyl-1,3-oxazolato-N,$C^{2'}$)iridium(III) acetylacetonate (abbreviation: [Ir(dpo)$_2$(acac)]), bis{2-[4'-(perfluorophenyl)phenyl]pyridinato-N,$C^{2'}$}iridium(III) acetylacetonate (abbreviation: [Ir(p-PF-ph)$_2$(acac)]), and bis (2-phenylbenzothiazolato-N,$C^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]).

Phosphorescent Substance (from 570 nm to 750 nm: Yellow or Red)

As a phosphorescent material that exhibits yellow or red and whose emission spectrum has a peak wavelength at greater than or equal to 570 nm and less than or equal to 750 nm, the following substances are given.

The examples include organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl) pyrimidinato](dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(d1npm)$_2$(dpm)]); organometallic complexes having a pyrazine skeleton, such as (acetylacetonato) bis(2,3,5-triphenylpyrazinato)iridium(III) (abbreviation: [Ir (tppr)$_2$(acac)]), bis(2,3,5-triphenylpyrazinato) (dipivaloylmethanato)iridium(III) (abbreviation: [Ir(tppr)$_2$ (dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir (dmdppr-P)$_2$(dibm)]), bis{4,6-dimethyl-2-[5-(4-cyano-2,6-dimethylphenyl)-3-(3,5-dimethylphenyl)-2-pyrazinyl-N] phenyl-κC}(2,2,6,6-tetramethyl-3,5-heptanedionato-κ$^2$O, O')iridium(III) (abbreviation: [Ir(dmdppr-dmCP)$_2$(dpm)]), bis[2-(5-(2,6-dimethylphenyl)-3-(3,5-dimethylphenyl)-2-pyrazinyl-κN)-4,6-dimethylphenyl-κC](2,2',6,6'-tetramethyl-3,5-heptadionato-κ$^2$O,O')iridium(III) (abbreviation: [Ir(dmdppr-dmp)$_2$(dpm)]), (acetylacetonato)bis[2-methyl-3-phenylquinoxalinato-N,$C^{2'}$]iridium(III) (abbreviation: [Ir (mpq)$_2$(acac)]), (acetylacetonato)bis(2,3-diphenylquinoxalinato-N,$C^{2'}$)iridium(III) (abbreviation: [Ir(dpq)$_2$(acac)]), and (acetylacetonato)bis[2,3-bis(4-fluorophenyl)quinoxalinato] iridium(III) (abbreviation: [Ir(Fdpq)$_2$(acac)]); organometallic complexes having a pyridine skeleton, such as tris(1-phenylisoquinolinato-N,$C^{2'}$)iridium(III) (abbreviation: [Ir (piq)$_3$]), bis(1-phenylisoquinolinato-N,$C^{2'}$)iridium(III) acetylacetonate (abbreviation: [Ir(piq)$_2$(acac)]), and bis[4,6-dimethyl-2-(2-quinolinyl-κN)phenyl-κC](2,4-pentanedionato-κ$^2$O,O')iridium(III) (abbreviation: [Ir(dmpqn)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]).

Tadf Material

Any of materials shown below can be used as the TADF material. The TADF material refers to a material that has a small difference (preferably, less than or equal to 0.2 eV) between the S1 level and the T1 level, can up-convert triplet excited state into singlet excited state (reverse intersystem crossing) using a little thermal energy, and efficiently exhibits light emission (fluorescence) from the singlet excited state. The thermally activated delayed fluorescence is efficiently obtained under the condition where the difference in energy between the triplet excited energy level and the singlet excited energy level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $1\times10^{-6}$ seconds or longer, preferably $1\times10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

[Chemical formula 1]

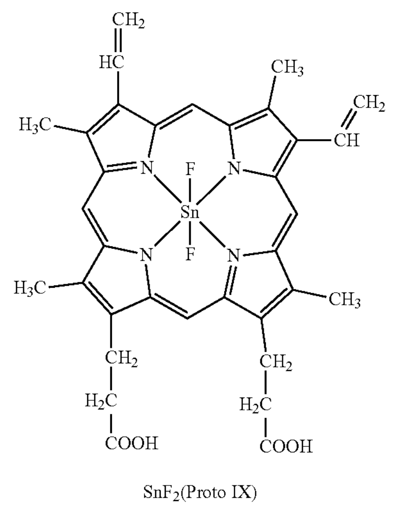

$SnF_2$(Proto IX)

-continued

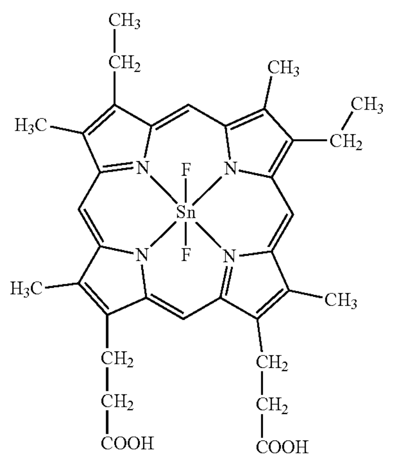

$SnF_2$(Meso IX)

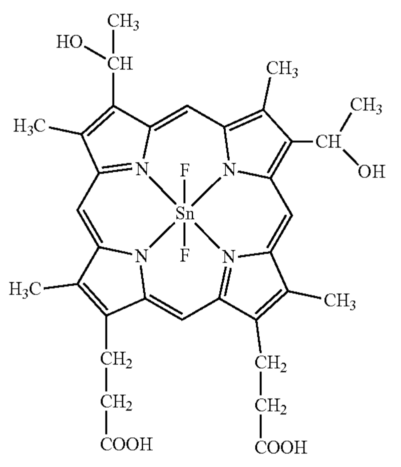

$SnF_2$(Hemato IX)

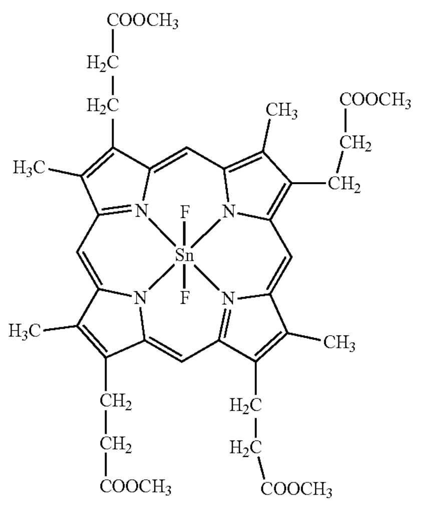

$SnF_2$(Copro III-4Me)

-continued

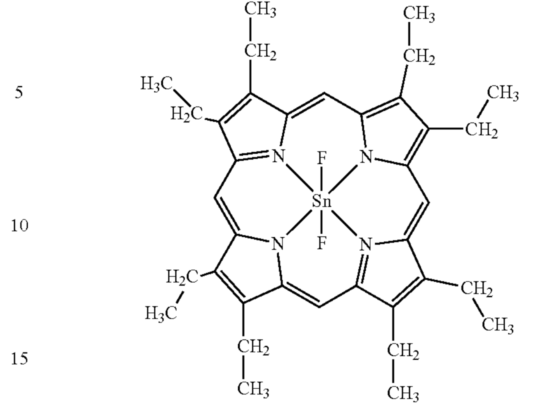

$SnF_2$(OEP)

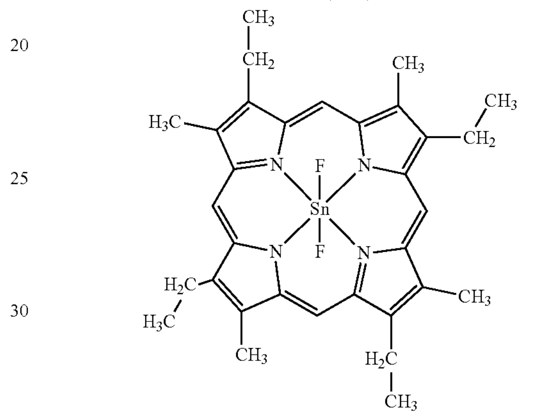

$SnF_2$(Etio 1)

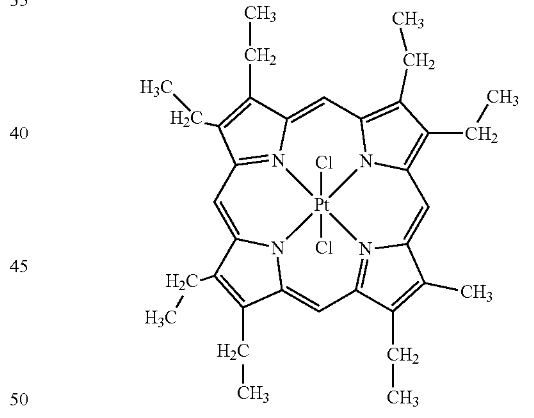

$PtCl_2OEP$

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), and 9-[3-(4,6-diphenyl-1,3,5-triazin-2-yl)phenyl]-9'-phenyl-2,3'-bi-9H-carbazole (abbreviation: mPCCzPTzn-02), may be used.

Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

[Chemical formula 2]

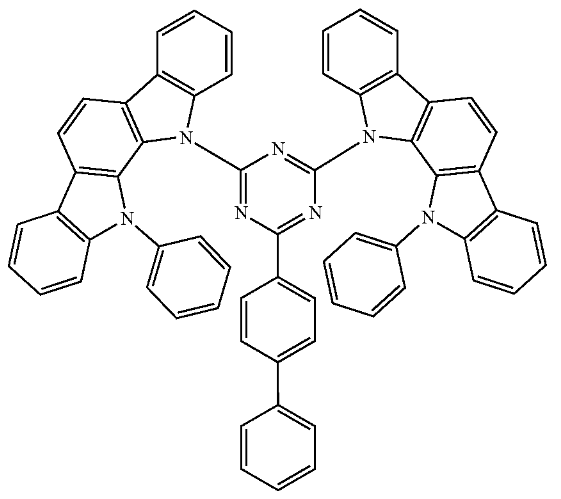

PIC-TRZ

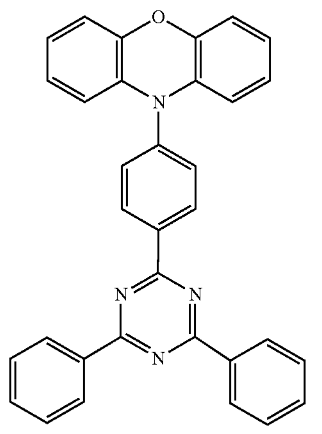

PXZ-TRZ

-continued

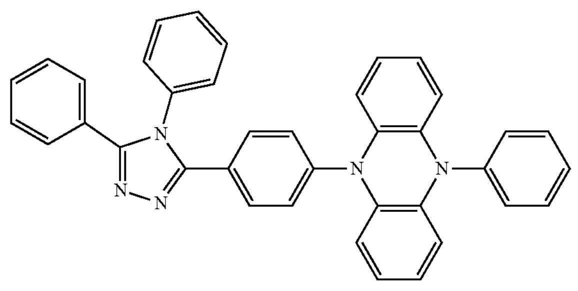

PPZ-3TPT

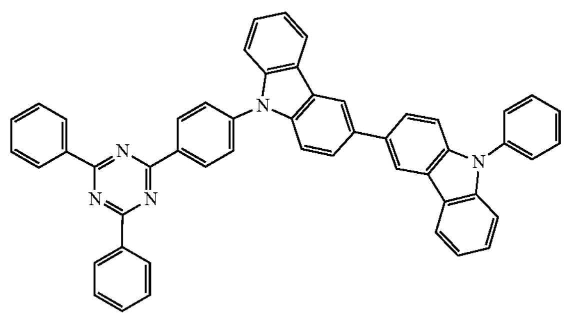

PCCzPTzn

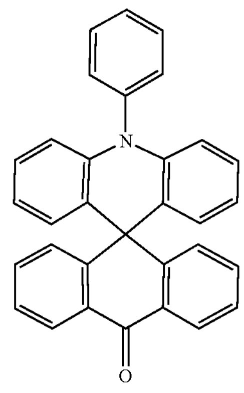

ACRSA

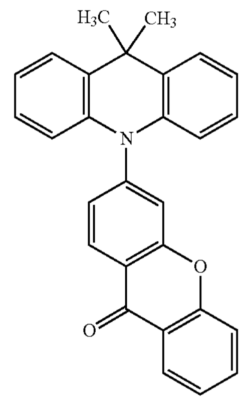

ACRXTN

-continued

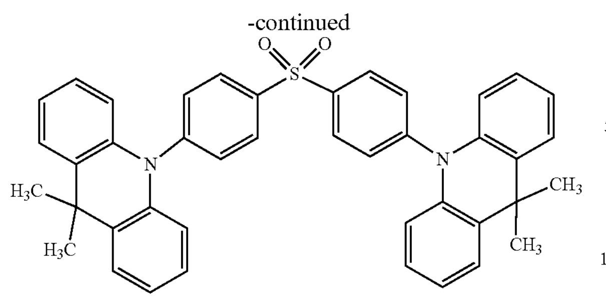

DMAC-DPS

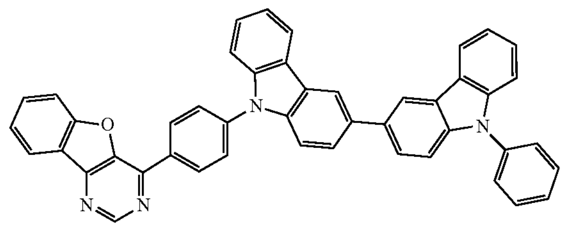

4PCCzPBfpm

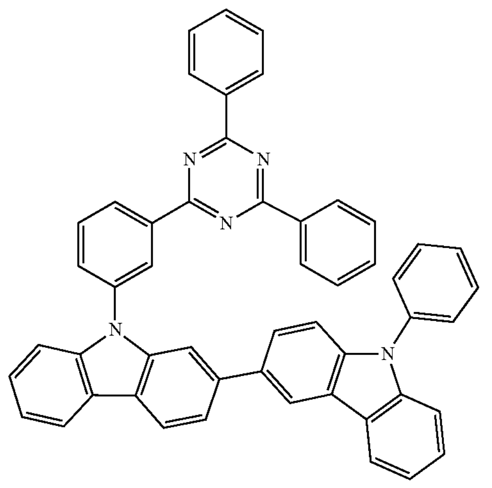

mPCCzPTzn-02

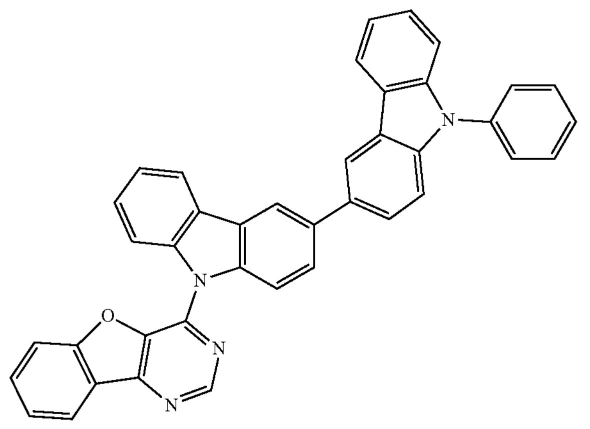

4PCCzBfpm

As the material having a function of converting triplet excitation energy into light emission, a nanostructure of a transition metal compound having a perovskite structure is also given in addition to the above. In particular, a nanostructure of a metal-halide perovskite material is preferable. The nanostructure is preferably a nanoparticle or a nanorod.

As the organic compounds (the host material and the like) used in combination of the above-described light-emitting substance (the guest material) in the light-emitting layers (113, 113*a*, 113*b*, and 113*c*), one or more kinds of substances having a larger energy gap than the light-emitting substance (the guest material) are selected to be used.

Host Material for Fluorescent Light

In the case where the light-emitting substance used in the light-emitting layers (113, 113*a*, 113*b*, and 113*c*) is a fluorescent substance, an organic compound (a host material) used in combination with the light-emitting substance is preferably an organic compound that has a high energy level in a singlet excited state and has a low energy level in a triplet excited state or an organic compound having a high fluorescence quantum yield. Therefore, the hole-transport material (described above) or the electron-transport material (described below) in this embodiment, for example, can be used as long as it is an organic compound that satisfies such a condition.

In terms of a preferable combination with the light-emitting substance (the fluorescent substance), specific examples of the organic compound (the host material) include condensed polycyclic aromatic compounds, such as an anthracene derivative, a tetracene derivative, a phenanthrene derivative, a pyrene derivative, a chrysene derivative, and a dibenzo[g,p]chrysene derivative, although some of them overlap with the above specific examples.

Note that specific examples of the organic compound (the host material) preferably used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N',N',N,N',N',N'',N''-octaphenyldibenzo[g,p]rysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}-anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

Host Material for Phosphorescent Light

In the case where the light-emitting substance used for the light-emitting layers (113, 113*a*, 113*b*, and 113*c*) is a phosphorescent substance, an organic compound having triplet excitation energy (energy difference between a ground state and a triplet excited state) which is higher than that of the light-emitting substance is preferably selected as the organic compound (the host material) used in combination with the light-emitting substance. Note that in the case where a plurality of organic compounds (e.g., a first host material and a second host material (or an assist material)) are used in combination with a light-emitting substance in order to form an exciplex, the plurality of organic compounds are preferably mixed with a phosphorescent substance.

Such a structure makes it possible to efficiently obtain light emission utilizing ExTET (Exciplex-Triplet Energy Transfer), which is energy transfer from an exciplex to a light-emitting substance. Note that a combination of the plurality of organic compounds that easily forms an exciplex is preferably employed, and it is particularly preferable to combine a compound that easily accepts holes (a hole-transport material) and a compound that easily accepts electrons (an electron-transport material).

In terms of a preferable combination with the light-emitting substance (the phosphorescent substance), specific examples of the organic compound (the host material or the assist material) include an aromatic amine, a carbazole derivative, a dibenzothiophene derivative, a dibenzofuran derivative, a zinc- or aluminum-based metal complex, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative, although some of them overlap with the above specific examples.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Any of these is preferable as the host material.

Among the above, specific examples of the metal complexes, which are organic compounds having a high electron-transport property (an electron-transport material), include zinc- and aluminum-based metal complexes, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), and bis(8-quinolinolato)zinc(II) (abbreviation: Znq), and metal complexes having a quinoline skeleton or a benzoquinoline skeleton. Any of these is preferable as the host material.

In addition, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like is given as a preferable example of the host material.

Among the organic compounds, specific examples of the oxadiazole derivative, the triazole derivative, the benzimidazole derivative, the quinoxaline derivative, the dibenzoquinoxaline derivative, and the phenanthroline derivative, which are organic compounds having a high electron-transport property (an electron-transport material), include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(biphenyl-4-yl)-5-(4-tert-butylphenyl)-4-phenyl-4H-1,2,4-triazole (abbreviation: TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOS), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II). Any of these is preferable as the host material.

Among the above, specific examples of a heterocyclic compound having a diazine skeleton, a heterocyclic compound having a triazine skeleton, and a heterocyclic compound having a pyridine skeleton, which are organic compounds having a high electron-transport property (an electron-transport material), include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), and 1,3,5-tri[3-(3-pyridyl)phenyl]benzene (abbreviation: TmPyPB). Any of these is preferable as the host material.

In addition, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) or the like is also preferable as the host material.

Furthermore, for example, 9-phenyl-9'-(4-phenyl-2-quinazolinyl)-3,3'-bi-9H-carbazole (abbreviation: PCCzQz) having a bipolar property, which is an organic compound having a high hole-transport property and a high electron-transport property, can be used as the host material.

<Electron-Transport Layer>

The electron-transport layers (114, 114*a*, and 114*b*) are each a layer that transports the electrons, which are injected from the second electrode 102 or charge-generation layers (106, 106*a*, and 106*b*) by the electron-injection layers (115, 115*a*, and 115*b*) to be described later, to the light-emitting layers (113, 113*a*, and 113*b*). Note that the electron-transport layers (114, 114*a*, and 114*b*) are each a layer containing an electron-transport material. It is preferable that the electron-transport materials used in the electron-transport layers (114, 114*a*, and 114*b*) be substances with an electron mobility higher than or equal to $1\times10^{-6}$ $cm^2/Vs$ in the case where the square root of the electric field strength [V/cm] is 600. Note that other substances can be used as long as the substances have a property of transporting more electrons than holes. Electron-transport layers (114, 114*a*, and 114*b*) each function even with a single-layer structure, but can improve the device characteristics when having a stacked-layer structure of two or more layers as needed.

Electron-Transport Material

As the electron-transport material that can be used for the electron-transport layers (114, 114*a*, and 114*b*), it is possible to use a material having a high electron-transport property (an electron-transport material), such as an organic compound having a structure where an aromatic ring is fused to a furan ring of a furodiazine skeleton, a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

Specific examples of the electron-transport material include metal complexes having a quinoline skeleton or a benzoquinoline skeleton, such as 2-[3'-(dibenzothiophen-4-yl)biphenyl-3-yl]dibenzo[f,h]quinoxaline (abbreviation: 2mDBTBPDBq-II), 5-[3-(4,6-diphenyl-1,3,5-triazin-2-yl)phenyl1]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 4-[3-(dibenzothiophen-4-yl)phenyl]-8-(naphthalen-2-yl)-[1]benzofuro[3,2-d]pyrimidine (abbreviation: 8βN-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 9-[(3'-dibenzothiophen-4-yl)biphenyl-3-yl]naphtho[1',2':4,5]furo[2,3-b]pyrazine (abbreviation: 9mDBtBPNfpr), 8-[3'-(dibenzothiophen-4-yl) (1,1'-biphenyl-3-yl)]naphtho[1',2':4,5]furo[3,2-d]pyrimidine (abbreviation: 8mDBtBPNfpm), 8-[(2,2'-binaphthalen)-6-yl]-4-[3-(dibenzothiophen-4-yl)phenyl]-[1]benzofuro[3,2-d]pyrimidine (abbreviation: 8(βN2)-4mDBtPBfpm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), tris(8-quinolinolato)aluminum(III) (abbreviation: $Alq_3$), $Almq_3$, BeBq2, bis(2-methyl-8-quinolinolato)(4-phenylphenolato)aluminum(III) (abbreviation: BAlq), and bis(8-quinolinolato)zinc(II) (abbreviation: Znq), and metal complexes having an oxazole skeleton or a thiazole skeleton, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Other than the metal complexes, it is possible to use, as the electron-transport material, oxadiazole derivatives such as PBD, OXD-7, and CO11, triazole derivatives such as TAZ and p-EtTAZ, imidazole derivatives (including benzimidazole derivatives) such as TPBI and mDBTBIm-II, an oxazole derivative such as BzOs, phenanthroline derivatives such as Bphen, BCP, and NBphen, quinoxaline derivatives and dibenzoquinoxaline derivatives, such as 2mDBTPDBq-II, 2mDBTBPDBq-II, 2mCzBPDBq, 2CzPDBq-III, 7mDBTPDBq-II, and 6mDBTPDBq-II, pyridine derivatives such as 35DCzPPy and TmPyPB, pyrimidine derivatives such as 4,6mPnP2Pm, 4,6mDBTP2Pm-II, and 4,6mCzP2Pm, and triazine derivatives such as PCCzPTzn and mPCCzPTzn-02.

A high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used as an electron-transport material.

The electron-transport layer (114, 114*a*, or 114*b*) is not limited to a single layer, and may be a stack of two or more layers each made of any of the above substances.

Electron-Injection Layer

The electron-injection layers (115, 115*a*, and 115*b*) are each a layer containing a substance having a high electron-injection property. The electron-injection layers (115, 115*a*, and 115*b*) are each a layer for increasing the efficiency of electron injection from the second electrode 102 and is preferably formed using a material whose LUMO level value has a small difference (0.5 eV or less) from the work function value of the material used for the second electrode 102. Thus, the electron-injection layers (115, 115*a*, and 115*b*) can be formed using an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate. A rare earth metal compound like erbium fluoride ($ErF_3$) can also be used. Electride may also be used for the electron-injection layers (115, 115*a*, and 115*b*). Examples of the electride include a substance in which electrons are added at high concentration to a mixed oxide of calcium and aluminum. Note that any of the substances used in the electron-transport layers (114, 114*a*, and 114*b*), which are given above, can also be used.

A composite material in which an organic compound and an electron donor (donor) are mixed may also be used in the electron-injection layers (115, 115*a*, and 115*b*). Such a composite material is excellent in an electron-injection property and an electron-transport property because electrons are generated in the organic compound by the electron donor. In this case, the organic compound is preferably a material excellent in transporting the generated electrons; specifically, for example, the above-mentioned electron-transport materials (metal complexes, heteroaromatic compounds, and the like) used in the electron-transport layers (114, 114*a*, and 114*b*) can be used.

Any substance showing an electron-donating property with respect to the organic compound can serve as an electron donor. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. A Lewis base such as magnesium oxide can also be used. An organic compound such as tetrathiafulvalene (abbreviation: TTF) can also be used.

Alternatively, a composite material in which an organic compound and a transition metal are mixed may also be used in the electron-injection layers (115, 115*a*, and 115*b*). Note that the organic compound used here preferably has a LUMO (Lowest Unoccupied Molecular Orbital) level higher than or equal to −3.6 eV and lower than or equal to −2.3 eV. Moreover, a material having an unshared electron pair is preferable.

Therefore, the above organic compound is preferably a material having an unshared electron pair, such as a heterocyclic compound having a pyridine skeleton, a diazine skeleton (e.g., pyrimidine or pyrazine), or a triazine skeleton.

Examples of the heterocyclic compound having a pyridine skeleton include 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathocuproine (abbreviation: BCP), 2,9-bis(naphthalen-2-yl)-4,7-diphenyl-1,10-phenanthroline (abbreviation: NBPhen), and bathophenanthroline (abbreviation: Bphen).

Examples of the heterocyclic compound having a diazine skeleton include 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), and 4-{3-[3'-(9H-carbazol-9-yl)]biphenyl-3-yl}benzofuro[3,2-d]pyrimidine (abbreviation: 4mCzBPBfpm).

Examples of the heterocyclic compound having a triazine skeleton include 2-{4-[3-(N-phenyl-9H-carbazol-3-yl)-9H-carbazol-9-yl]phenyl}-4,6-diphenyl-1,3,5-triazine (abbreviation: PCCzPTzn), 2,4,6-tris[3'-(pyridin-3-yl)biphenyl-3-yl]-1,3,5-triazine (abbreviation: TmPPPyTz), and 2,4,6-tris(2-pyridyl)-1,3,5-triazine (abbreviation: 2Py3Tz).

As the transition metal, a material that belongs to Group 5, Group 7, Group 9, or Group 11 in the periodic table is preferably used, and examples include Ag and Cu. Here, the organic compound forms a singly occupied molecular orbital (SOMO) with the transition metal.

To amplify light obtained from the light-emitting layer 113*b*, for example, the optical path length between the second electrode 102 and the light-emitting layer 113*b* is preferably less than one fourth of the wavelength λ of light emitted from the light-emitting layer 113*b*. In that case, the optical path length can be adjusted by changing the thickness of the electron-transport layer 114*b* or the electron-injection layer 115*b*.

When the charge-generation layer 106 is provided between the two EL layers (103*a* and 103*b*) as in the light-emitting device in FIG. 2D, a structure in which a plurality of EL layers are stacked between the pair of electrodes (the structure is also referred to as a tandem structure) can be obtained.

Charge-Generation Layer

The charge-generation layer 106 has a function of injecting electrons into the EL layer 103*a* and injecting holes into the EL layer 103*b* when voltage is applied between the first electrode (anode) 101 and the second electrode (cathode) 102. The charge-generation layer 106 may be either a p-type layer in which an electron acceptor (acceptor) is added to a hole-transport material or an electron-injection buffer layer in which an electron donor (donor) is added to an electron-transport material. Alternatively, both of these layers may be stacked. Furthermore, an electron-relay layer may be provided between the p-type layer and the electron-injection buffer layer. Note that forming the charge-generation layer 106 with the use of any of the above materials can inhibit an increase in driving voltage caused by the stack of the EL layers.

In the case where the charge-generation layer 106 is a p-type layer in which an electron acceptor material is added to a hole-transport material, which is an organic compound, any of the materials described in this embodiment can be used as the hole-transport material. Examples of the electron acceptor material include 7,7,8,8-tetracyano-2,3,5,6-tetrafluoroquinodimethane (abbreviation: $F_4$-TCNQ) and chloranil. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide. Any of the above-described electron acceptor materials may be used. Furthermore, a mixed film obtained by mixing materials of a p-type layer or a stack of films containing the respective materials may be used.

In the case where the charge-generation layer 106 is an electron-injection buffer layer in which an electron donor is added to an electron-transport material, any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, lithium (Li), cesium (Cs), magnesium (Mg), calcium (Ca), ytterbium (Yb), indium (In), lithium oxide ($Li_2O$), cesium carbonate, or the like is preferably used. An organic compound such as tetrathianaphthacene may be used as the electron donor.

When an electron-relay layer is provided between a p-type layer and an electron-injection buffer layer in the charge-generation layer 106, the electron-relay layer contains at least a substance having an electron-transport property and has a function of preventing an interaction between the electron-injection buffer layer and the p-type layer and transferring electrons smoothly. The LUMO level of the substance having an electron-transport property in the electron-relay layer is preferably between the LUMO level of the acceptor substance in the p-type layer and the LUMO level of the substance having an electron-transport property in the electron-transport layer in contact with the charge-generation layer 106. Specifically, the LUMO level of the substance having an electron-transport property in the electron-relay layer is preferably higher than or equal to −5.0 eV, further preferably higher than or equal to −5.0 eV and lower than or equal to −3.0 eV.

Note that as the substance having an electron-transport property in the electron-relay layer, a phthalocyanine-based material or a metal complex having a metal-oxygen bond and an aromatic ligand is preferably used.

Although FIG. 2D illustrates the structure in which two EL layers 103 are stacked, three or more EL layers may be stacked with charge-generation layers each provided between two adjacent EL layers.

Substrate

The light-emitting device described in this embodiment can be formed over a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES), a synthetic resin such as acrylic, polypropylene, polyester, polyvinyl fluoride, polyvinyl chloride, polyamide, polyimide, aramid, epoxy, an inorganic vapor deposition film, and paper.

For fabrication of the light-emitting device in this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (111, 111*a*, and 111*b*), the hole-transport layers (112, 112*a*, and 112*b*), the light-emitting layers (113, 113*a*, 113*b*, and 113*c*), the electron-transport layers (114, 114*a*, and 114*b*), the electron-injection layers (115, 115*a*, and 115*b*)) included in the EL layers and the charge-generation layers (106, 106*a*, and 106*b*) of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a film formation method such as the coating method or the printing method is employed, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Note that materials that can be used for the functional layers (the hole-injection layers (111, 111*a*, and 111*b*), the hole-transport layers (112, 112*a*, and 112*b*), the light-emitting layers (113, 113*a*, 113*b*, and 113*c*), the electron-transport layers (114, 114*a*, and 114*b*), and the electron-injection layers (115, 115*a*, and 115*b*)) included in the EL layers (103, 103*a*, 103*b*, and 103*c*) and the charge-generation layers (106, 106*a*, and 106*b*) of the light-emitting device described in this embodiment are not limited to the materials described in this embodiment, and other materials can be used in combination as long as the functions of the layers are fulfilled.

The structure described in this embodiment can be used in an appropriate combination with any of the structures described in the other embodiments.

Embodiment 2

In this embodiment, specific structure examples and manufacturing methods of a light-emitting apparatus (also referred to as a display panel) of one embodiment of the present invention will be described.

Structure Example 1 of Light-Emitting Apparatus 700

Figure 3A:
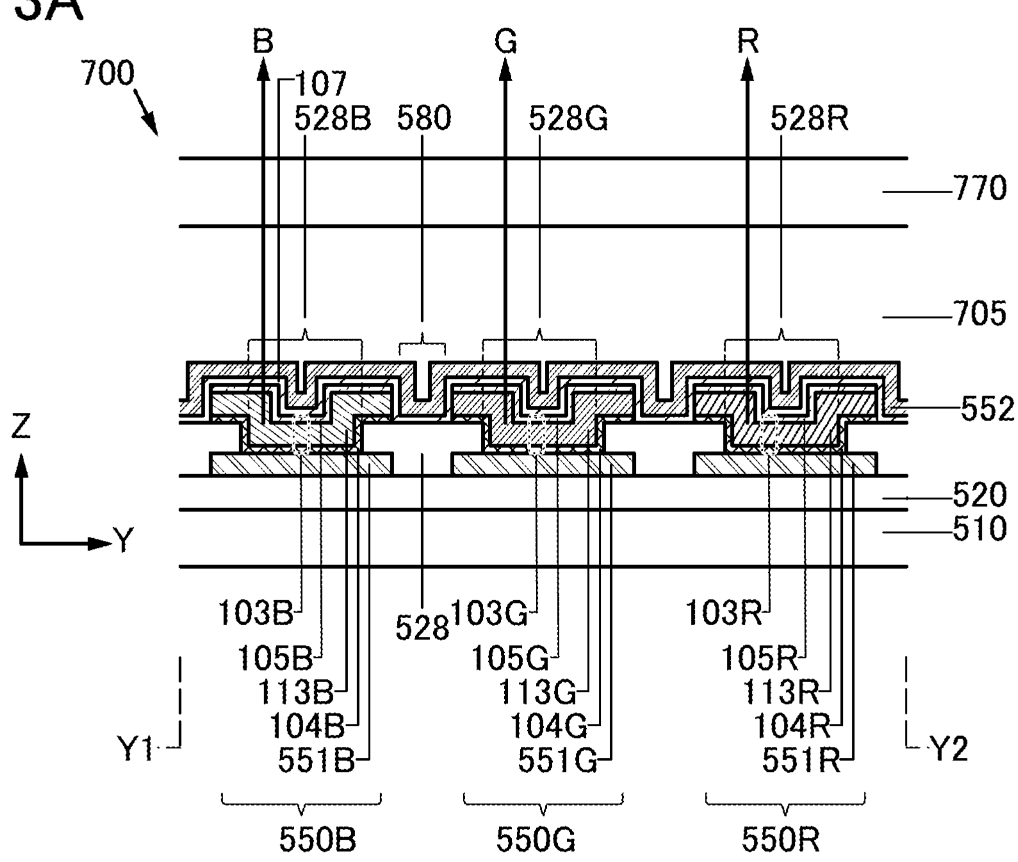
FIG. 3A and FIG. 3B are diagrams illustrating a structure of a light-emitting apparatus of an embodiment.

A light-emitting apparatus 700 illustrated in FIG. 3A includes a light-emitting device 550B, a light-emitting device 550G, a light-emitting device 550R, and a partition 528. The light-emitting device 550B, the light-emitting device 550G, the light-emitting device 550R, and the partition 528 are formed over a functional layer 520 provided over a first substrate 510. The functional layer 520 includes, for example, a driver circuit GD, a driver circuit SD, pixel circuits, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. Specifically, the case is described in which the EL layer 103 in the structure illustrated in FIG. 2A differs between the light-emitting devices.

The light-emitting device 550B includes an electrode 551B, an electrode 552, an EL layer 103B, an oxidation-resistant layer 105B, and the block layer 107. Note that a specific structure of each layer is as described in Embodiment 1. The EL layer 103B has a stacked-layer structure of layers having different functions including a light-emitting layer 113B. The oxidation-resistant layer 105B is included in the EL layer 103B. Although FIG. 3A illustrates only a hole-injection/transport layer 104B and the oxidation-resistant layer 105B as layers of the EL layer 103B including the light-emitting layer 113B, the present invention is not limited thereto. Note that the hole-injection/transport layer 104B represents the layer having the functions of the hole-injection layer and the hole-transport layer described in Embodiment 1 and may have a stacked-layer structure. Note that in this specification, a hole-injection/transport layer in any light-emitting device can be interpreted in the above manner. Similarly, the electron-injection/transport layer is a layer having the functions of the electron-injection layer and the electron-transport layer and may have a stacked-layer structure.

The block layer 107 is formed to cover the EL layer 103B formed over the electrode 551B. Note that as illustrated in FIG. 3A, the EL layer 103B includes the side surface (or the end portion). Thus, the block layer 107 is formed in contact with the side surface (or the end portion) of the EL layer 103B. Accordingly, entry of oxygen, moisture, or constituent elements thereof into the inside through the side surface of the EL layer 103B can be inhibited. Note that the hole-transport material described in Embodiment 1 can be used for the block layer 107.

The electrode 552 is formed over the block layer 107. Note that the electrode 551B and the electrode 552 have an overlap region. The EL layer 103B is positioned between the electrode 551B and the electrode 552. Thus, the electrode 552 is in contact with the side surface (or the end portion) of the EL layer 103B through the block layer 107. This can prevent electrical short circuit between the EL layer 103B and the electrode 552, specifically between the hole-injection/transport layer 104B in the EL layer 103B and the electrode 552.

The EL layer 103B illustrated in FIG. 3A has the same structure as the EL layers 103, 103*a*, 103*b*, and 103*c* described in Embodiment 1. The EL layer 103B is capable of emitting blue light, for example.

The light-emitting device 550G includes an electrode 551G, the electrode 552, an EL layer 103G, an oxidation-resistant layer 105G, and the block layer 107. Note that a specific structure of each layer is as described in Embodiment 1. The EL layer 103G has a stacked-layer structure of layers having different functions including a light-emitting layer 113G. The oxidation-resistant layer 105G is included in the EL layer 103G. Although FIG. 3A illustrates only a hole-injection/transport layer 104G and the oxidation-resistant layer 105G as layers of the EL layer 103G including the light-emitting layer 113G, the present invention is not limited thereto. Note that the hole-injection/transport layer 104G represents the layer having the functions of the hole-injection layer and the hole-transport layer described in Embodiment 1 and may have a stacked-layer structure.

The block layer 107 is formed to cover the EL layer 103G formed over the electrode 551G. Note that as illustrated in FIG. 3A, the EL layer 103G includes the side surface (or the end portion). Thus, the block layer 107 is formed in contact with the side surface (or the end portion) of the EL layer 103G. Accordingly, entry of oxygen, moisture, or constituent elements thereof into the inside through the side surface of the EL layer 103G can be inhibited. Note that the hole-transport material described in Embodiment 1 can be used for the block layer 107.

The electrode 552 is formed over the block layer 107. Note that the electrode 551G and the electrode 552 have an overlap region. The EL layer 103G is positioned between the electrode 551G and the electrode 552. Thus, the electrode 552 is in contact with the side surface of the EL layer 103G through the block layer 107. This can prevent electrical short circuit between the EL layer 103G and the electrode 552, specifically between the hole-injection/transport layer 104G in the EL layer 103G and the electrode 552.

The EL layer 103G illustrated in FIG. 3A has the same structure as the EL layers 103, 103*a*, 103*b*, and 103*c* described in Embodiment 1. The EL layer 103G is capable of emitting green light, for example.

The light-emitting device 550R includes an electrode 551R, an electrode 552, an EL layer 103R, an oxidation-resistant layer 105R, and the block layer 107. Note that a specific structure of each layer is as described in Embodiment 1. The EL layer 103R has a stacked-layer structure of layers having different functions including a light-emitting layer 113R. The oxidation-resistant layer 105R is included in the EL layer 103R. Although FIG. 3A illustrates only a hole-injection/transport layer 104R and the oxidation-resistant layer 105R as layers of the EL layer 103R including the light-emitting layer 113R, the present invention is not limited thereto. Note that the hole-injection/transport layer 104R represents the layer having the functions of the hole-injection layer and the hole-transport layer described in Embodiment 1 and may have a stacked-layer structure.

The block layer 107 is formed to cover the EL layer 103R formed over the electrode 551R. Note that as illustrated in FIG. 3A, the EL layer 103R includes the side surface (or the end portion). Thus, the block layer 107 is formed in contact with the side surface (or the end portion) of the EL layer 103R. Accordingly, entry of oxygen, moisture, or constituent elements thereof into the inside through the side surface of the EL layer 103R can be inhibited. Note that the hole-transport material described in Embodiment 1 can be used for the block layer 107.

The electrode 552 is formed over the block layer 107. Note that the electrode 551R and the electrode 552 have an overlap region. The EL layer 103R is positioned between the electrode 551R and the electrode 552. Thus, the electrode 552 is in contact with the side surface of the EL layer 103R through the block layer 107. This can prevent electrical short circuit between the EL layer 103R and the electrode 552, specifically between the hole-injection/transport layer 104R in the EL layer 103R and the electrode 552.

The EL layer 103R illustrated in FIG. 3A has the same structure as the EL layers 103, 103*a*, 103*b*, and 103*c* described in Embodiment 1. The EL layer 103R is capable of emitting red light, for example.

A space 580 is provided between the EL layer 103B, the EL layer 103G, and the EL layer 103R. In each of the EL layers, particularly the hole-injection layer, which is included in the hole-transport region between the anode and the light-emitting layer, often has high conductivity; therefore, a hole-injection layer formed as a layer shared by adjacent light-emitting devices might lead to crosstalk. Thus, providing the space 580 between the EL layers as shown in this structure example can suppress occurrence of crosstalk between adjacent light-emitting devices.

When electrical continuity is established between the EL layer 103B, the EL layer 103G, and the EL layer 103R in a light-emitting apparatus (display panel) with a high resolution exceeding 1000 ppi, crosstalk occurs, resulting in a narrower color gamut that the light-emitting apparatus is capable of reproducing. Providing the space 580 in a high-resolution display panel with more than 1000 ppi, preferably more than 2000 ppi, or further preferably in an ultrahigh-resolution display panel with more than 5000 ppi allows the display panel to express vivid colors.

Figure 3B:
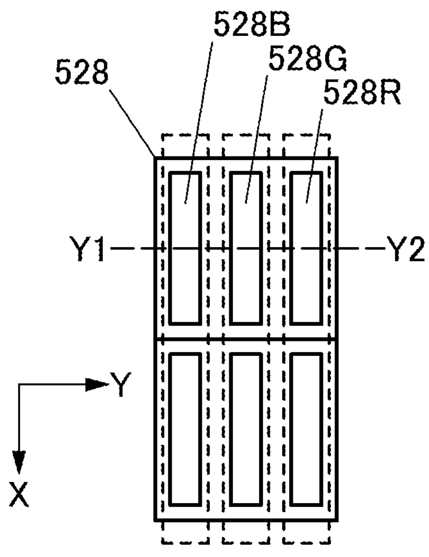

FIG. 3B is a top view of the light-emitting apparatus in FIG. 3A in the X-Y direction, and a Y1-Y2 cross section corresponds to FIG. 3A. As illustrated in FIG. 3B, the partition 528 has an opening 528B, an opening 528G, and an opening 528R. As illustrated in FIG. 3A, the opening 528B overlaps the electrode 551B, the opening 528G overlaps the electrode 551G, and the opening 528R overlaps the electrode 551R.

The EL layers 103B, 103G, and 103R are processed to be separated by patterning using a photolithography method; hence, a high-resolution light-emitting apparatus (display panel) can be fabricated. An end portion of the EL layer (the side surfaces of the stacked layers of the EL layer) processed by patterning using a photolithography method has substantially one surface (or is positioned on substantially the same plane). In this case, the width of the space 580 between the EL layers is preferably 5 μm or less, further preferably 1 μm or less.

In the EL layer, particularly the hole-injection layer, which is included in the hole-transport region between the anode and the light-emitting layer, often has high conductivity; thus, a hole-injection layer formed as a layer shared by adjacent light-emitting devices might lead to crosstalk. Therefore, processing the EL layers to be separated by patterning using a photolithography method as shown in this structure example can suppress occurrence of crosstalk between adjacent light-emitting devices.

Example 1 of Method of Manufacturing Light-Emitting Apparatus

Figure 4A:
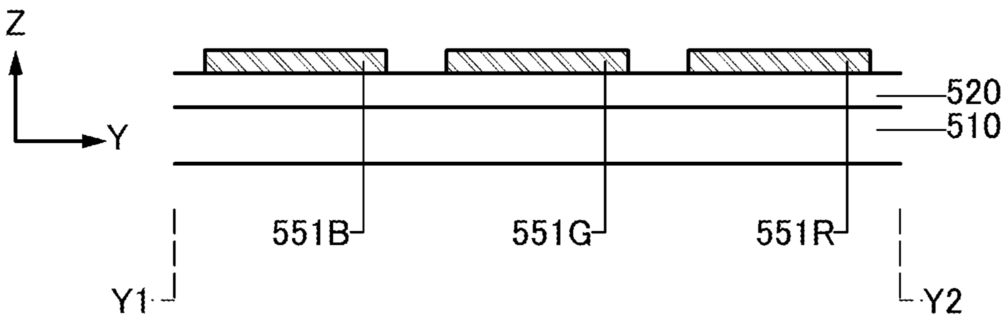
FIG. 4A and FIG. 4B are diagrams illustrating a method of manufacturing a light-emitting apparatus of an embodiment.

The electrode 551B, the electrode 551G, and the electrode 551R are formed as illustrated in FIG. 4A. For example, a conductive film is formed over the functional layer 520 over the first substrate 510 and processed into predetermined shapes by a photolithography method.

The conductive film can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method includes a metal organic CVD (MOCVD) method.

The conductive film may be processed by a nanoimprinting method, a sandblasting method, a lift-off method, or the like as well as a photolithography method described above. Alternatively, island-shaped thin films may be directly formed by a film formation method using a shielding mask such as a metal mask. Here, “island shape” refers to a state in which layers formed using the same material in the same step are separated from each other when seen from above.

There are two typical processing methods using a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when exposure is performed by scanning with a beam such as an electron beam.

For etching of a thin film using a resist mask, a dry etching method, a wet etching method, a sandblast method, or the like can be used.

Figure 4B:
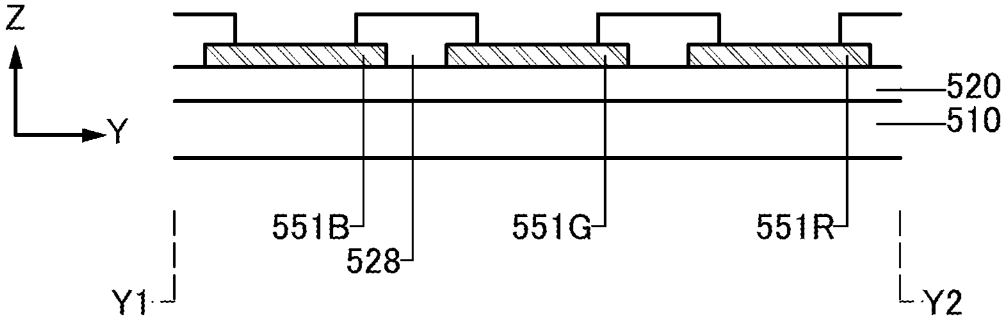

Next, as illustrated in FIG. 4B, the partition 528 is formed between the electrode 551B and the electrode 551G. For example, the partition 528 can be formed in such a manner that an insulating film covering the electrode 551B, the electrode 551G, and the electrode 551R is formed, and openings are formed by a photolithography method to partly expose the electrode 551B, the electrode 551G, and the electrode 551R. Examples of a material that can be used for the partition 528 include an inorganic material, an organic material, and a composite material of an inorganic material and an organic material. Specifically, it is possible to use an inorganic oxide film, an inorganic nitride film, an inorganic oxynitride film, or the like, or a stacked-layer structure in which two or more films selected from the above are stacked. More specifically, it is possible to use a silicon oxide film, a film containing acrylic, a film containing polyimide, or the like, or a stacked-layer structure in which two or more films selected from the above are stacked.

Figure 5A:
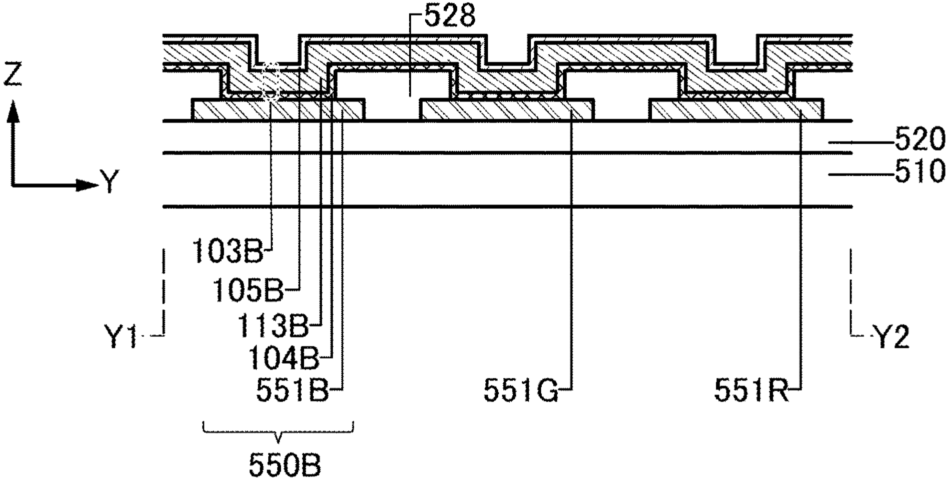
FIG. 5A to FIG. 5C are diagrams illustrating a method of manufacturing a light-emitting apparatus of an embodiment.

Then, as illustrated in FIG. 5A, the EL layer 103B is formed over the electrode 551B, the electrode 551G, the electrode 551R, and the partition 528. Note that in this structure example, the EL layer 103B includes the light-emitting layer 113B, the hole-injection/transport layer 104B, and the oxidation-resistant layer 105B. For example, the EL layer 103B is formed by a vacuum evaporation method over the electrode 551B, the electrode 551G, the electrode 551R, and the partition 528 so as to cover them.

Note that the oxidation-resistant layer 105B is formed with an oxidation-resistant material. Specifically, a composite material obtained by adding an electron-acceptor material to a hole-transport material, which is an organic compound described in Embodiment 1 as a material that can be used for the charge-generation layer of the EL layer, or a stacked-layer structure of a hole-transport material and an electron-acceptor material can be used. As the electron-acceptor material, the material described in Embodiment 1 as an organic acceptor material for the hole-injection layer can be used. The use of the metal oxide as the electron-acceptor material can improve the oxidation resistance.

As the metal oxide, oxides of metals that belong to Group 4 to Group 8 of the periodic table can be given. Specific examples are vanadium oxide, niobium oxide, tantalum oxide, chromium oxide, molybdenum oxide, tungsten oxide, manganese oxide, and rhenium oxide. As the organic compound, the material given as an example of the hole-transport material can be used.

Setting the compositions of the metal oxide and the organic compound included in the oxidation-resistant layer 105B to predetermined values can inhibit elution of the oxidation-resistant layer 105B at the time of forming a resist over the oxidation-resistant layer 105B in a later step. Note that the compositions of the metal oxide and the organic compound used for the oxidation-resistant layer 105B are set in consideration of the thickness and the transmittance of the oxidation-resistant layer 105B; the weight ratio of the organic compound to the metal oxide is preferably 1:100 to 100:1, further preferably 1:20 to 20:1.

Figure 5B:
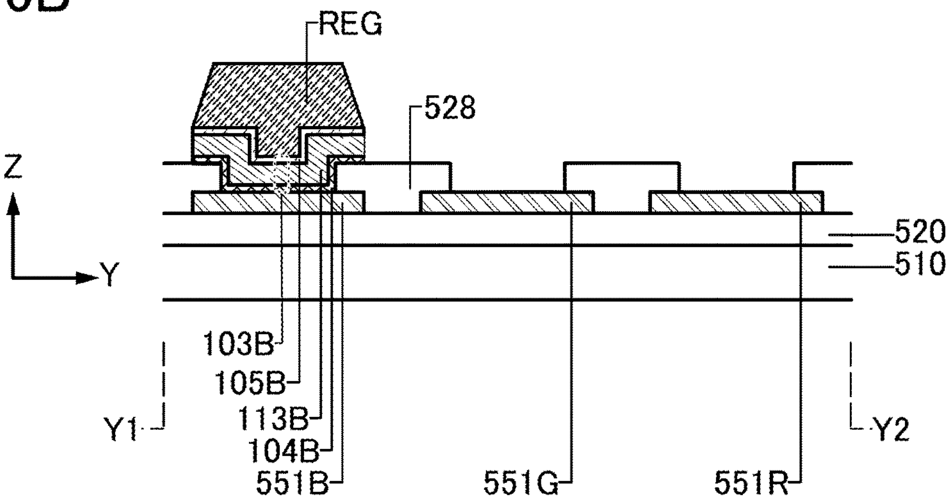

Then, the EL layer 103B over the electrode 551B is processed to have a predetermined shape as illustrated in FIG. 5B. For example, a resist is formed by a photolithography method, and the EL layer 103B over the electrode 551G and the EL layer 103B over the electrode 551R are removed by etching, whereby the electrode 551B is processed into a shape having a side surface (or an exposed side surface) or a band-like shape extending in a direction intersecting with the horizontal direction of the figure. Specifically, dry etching is performed using a resist REG formed over the EL layer 103B overlapping with the electrode 551B (see FIG. 5B). The partition 528 can be used as an etching stopper.

Figure 5C:
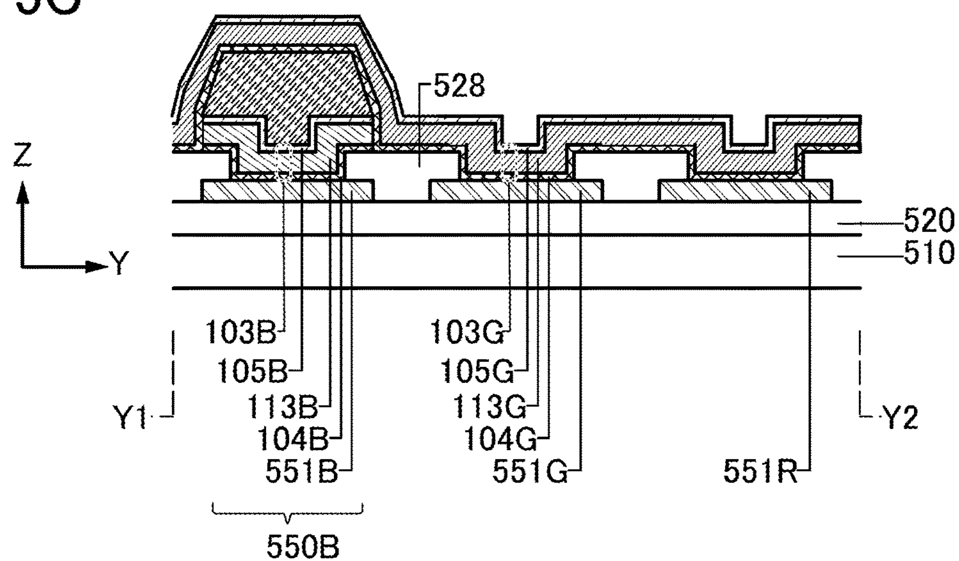

Next, as illustrated in FIG. 5C, in a state where the resist REG is formed, the EL layer 103G (including the light-emitting layer 113G, the hole-injection/transport layer 104G, and the oxidation-resistant layer 105G) is formed over the resist REG, the electrode 551G, the electrode 551R, and the partition 528. For example, the EL layer 103G is formed by a vacuum evaporation method over the resist REG, the electrode 551G, the electrode 551R, and the partition 528 to cover them. Note that the oxidation-resistant layer 105G is formed with a composite material containing a metal oxide and an organic compound (a hole-transport material) as well as the oxidation-resistant layer 105B.

Figure 6A:
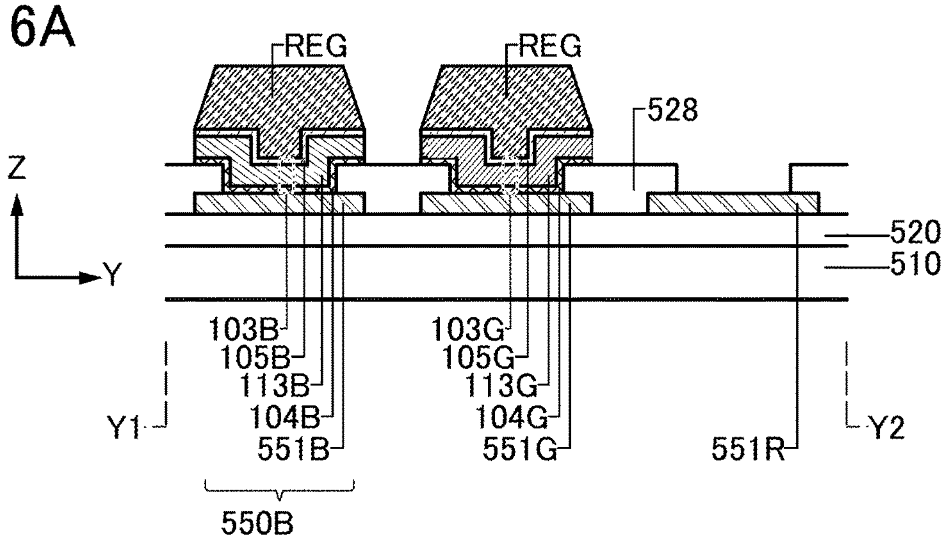
FIG. 6A to FIG. 6C are diagrams illustrating a method of manufacturing a light-emitting apparatus of an embodiment.

Then, the EL layer 103G over the electrode 551G is processed to have a predetermined shape as illustrated in FIG. 6A. For example, a resist is formed by a photolithography method over the EL layer 103G over the electrode 551G, and the EL layer 103G over the electrode 551B and the EL layer 103G over the electrode 551R are removed by etching, whereby the EL layer 103G is processed into a shape having a side surface (or an exposed side surface) or a band-like shape extending in a direction intersecting with the horizontal direction of the figure. Specifically, dry etching is performed using a resist REG formed over the EL layer 103G overlapping with the electrode 551G. The partition 528 can be used as an etching stopper.

Figure 6B:
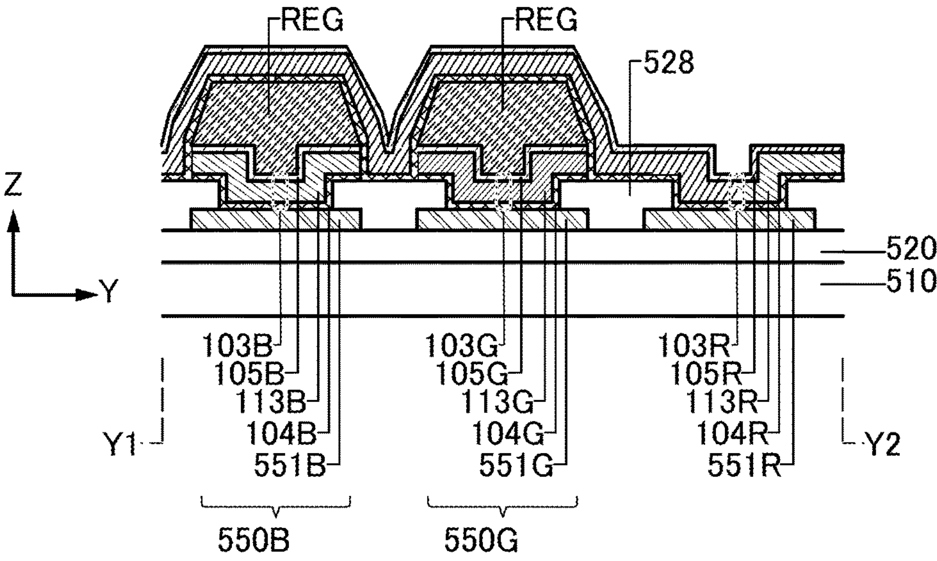

Next, as illustrated in FIG. 6B, in a state where the resist REG is formed over the electrode 551B and the electrode 551G, the EL layer 103R (including the light-emitting layer 113R, the hole-injection/transport layer 104R, and the oxidation-resistant layer 105R) is formed over the resist REG, the electrode 551R, and the partition 528. For example, the EL layer 103R is formed by a vacuum evaporation method over the electrode 551R, the resist REG, and the partition 528 to cover them. Note that the oxidation-resistant layer 105R is formed with a composite material containing a metal oxide and an organic compound (a hole-transport material) as well as the oxidation-resistant layer 105B.

Figure 6C:
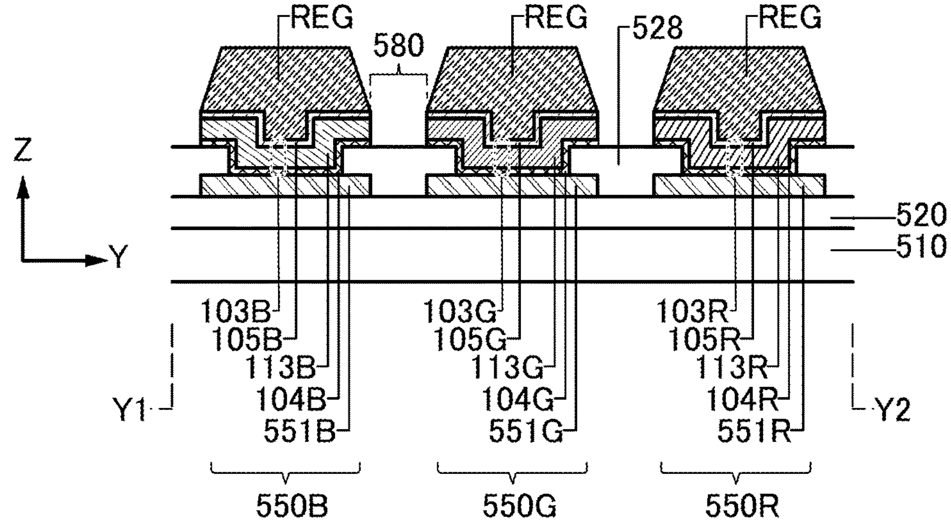

Then, the EL layer 103R over the electrode 551R is processed to have a predetermined shape as illustrated in FIG. 6C. For example, a resist is formed by a photolithography method over the EL layer 103R over the electrode 551R, and the EL layer 103R over the electrode 551B and the EL layer 103R over the electrode 551G are removed by etching, whereby the EL layer 103R is processed into a shape having a side surface (or an exposed side surface) or a band-like shape extending in a direction intersecting with the horizontal direction of the figure. Specifically, dry etching is performed using a resist REG formed over the EL layer 103R overlapping with the electrode 551R. The partition 528 can be used as an etching stopper.

Preferably, the hole-injection/transport layer 104B, the light-emitting layer 113B, and the oxidation-resistant layer 105B are firstly formed over the electrode 551B, then the hole-injection/transport layer 104G, the light-emitting layer 113G, and the oxidation-resistant layer 105G are formed over the electrode 551G, and lastly the hole-injection/transport layer 104R, the light-emitting layer 113R, and the oxidation-resistant layer 105R are formed over the electrode 551R, as illustrated in FIG. 5A, FIG. 5B, and FIG. 5C and FIG. 6A, FIG. 6B, and FIG. 6C.

In the above steps, when the hole-injection/transport layer 104B, the light-emitting layer 113B, and the oxidation-resistant layer 105B over the electrode 551G and the hole-injection/transport layer 104B, the light-emitting layer 113B, and the oxidation-resistant layer 105B over the electrode 551R are removed by etching, the surfaces of the electrode 551G and the electrode 551R are also exposed to the etching gas. When the hole-injection/transport layer 104G, the light-emitting layer 113G, and the oxidation-resistant layer 105G over the electrode 551G are removed by etching, the surface of the electrode 551R is also exposed to the etching. Consequently, the surface of the electrode 551B is not exposed to the etching, whereas the surface of the electrode 551G is exposed to the etching once and the surface of the electrode 551R is exposed to the etching twice.

The surface of an electrode might be damaged by being exposed to the etching. Furthermore, a light-emitting device formed using an electrode whose surface is damaged might have degraded characteristics. Note that the degree of influence of the surface state of an electrode on the characteristics of a light-emitting device depends on the structure, materials, and the like of the light-emitting device. Among the light-emitting device 550B, the light-emitting device 550G, and the light-emitting device 550R, characteristics of the light-emitting device 550B are most likely to be affected by the surface state of the electrode in some cases.

Accordingly, forming the hole-injection/transport layer 104B, the light-emitting layer 113B, and the oxidation-resistant layer 105B over the electrode 551B firstly can prevent the surface of the electrode 551B from being exposed to the etching; hence, the characteristics of the light-emitting device 550B, which is most likely affected by the surface state of the electrode, can be prevented from deteriorating.

Figure 7A:
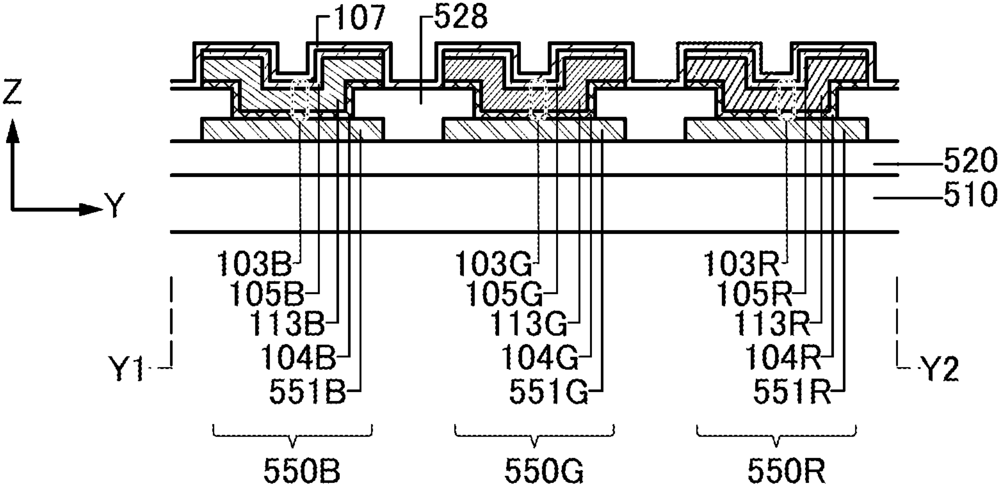
FIG. 7A and FIG. 7B are diagrams illustrating a method of manufacturing a light-emitting apparatus of an embodiment.

Next, as illustrated in FIG. 7A, the block layer 107 is formed over the oxidation-resistant layer 105B, the oxidation-resistant layer 105G, the oxidation-resistant layer 105R, and the partition 528. For example, the block layer 107 is formed by a vacuum evaporation method over the oxidation-resistant layer 105B, the oxidation-resistant layer 105G, the oxidation-resistant layer 105R, and the partition 528 to cover them. In that case, the block layer 107 is formed in contact with the side surfaces of the EL layers (103B, 103G, and 103R) as illustrated in FIG. 7A. This can inhibit entry of oxygen, moisture, and constituent elements thereof into the inside of the EL layers (103B, 103G, and 103R) through their side surfaces. As a material used for the block layer 107, the hole-transport material described in Embodiment 1 can be used.

Figure 7B:
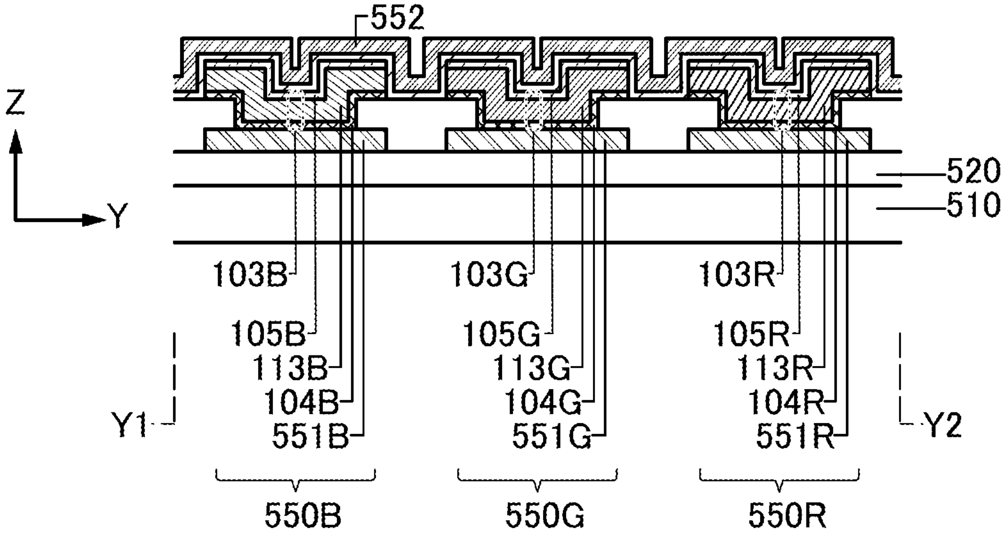

Next, as illustrated in FIG. 7B, the electrode 552 is formed over the block layer 107. The electrode 552 is formed by a vacuum evaporation method, for example. The electrode 552 is formed over the block layer 107. The electrode 552 is in contact with the side surfaces of the EL layers (103B, 103G, and 103R) through the block layer 107. Thus, the EL layers (103B, 103G, and 103R) and the electrode 552, specifically the hole-injection/transport layers (104B, 104G, and 104R) in the EL layers (103B, 103G, and 103R) and the electrode 552 can be prevented from being electrically short-circuited.

Through the above steps, the EL layer 103B, the EL layer 103G, and the EL layer 103R in the light-emitting device 550B, the light-emitting device 550G, and the light-emitting device 550R can be processed to be separated from each other.

The EL layers 103B, 103G, and 103R are processed to be separated by patterning using a photolithography method; hence, a high-resolution light-emitting apparatus (display panel) can be fabricated. The end portion of the EL layer (the side surfaces of the stacked layers of the EL layer) processed by patterning using a photolithography method has substantially one surface (or is positioned on substantially the same plane).

In the EL layer, particularly the hole-injection layer, which is included in the hole-transport region between the anode and the light-emitting layer, often has high conductivity; therefore, a hole-injection layer formed as a layer shared by adjacent light-emitting devices might lead to crosstalk. Thus, processing the EL layers to be separated by patterning using a photolithography method as shown in this structure example can suppress occurrence of crosstalk between adjacent light-emitting devices.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white light-emitting device. Note that a combination of white light-emitting devices and coloring layers (e.g., color filters) achieves a light-emitting device of full-color display.

Structures of light-emitting devices can be classified roughly into a single structure and a tandem structure. A device having a single structure includes one EL layer between a pair of electrodes, and the EL layer preferably includes one or more light-emitting layers. To obtain white light emission, two or more light-emitting layers that emit light of complementary colors are selected. For example, when emission colors of a first light-emitting layer and a second light-emitting layer are complementary colors, a light-emitting device can be configured to emit white light as a whole. The same applies to a light-emitting device including three or more light-emitting layers.

A device having a tandem structure includes two or more EL layers between a pair of electrodes, and each of the EL layers preferably includes one or more light-emitting layers. White light emission is obtained by combining light from the light-emitting layers in a plurality of EL layers. Note that a structure for obtaining white light emission is similar to that in the case of a single structure. In a device having a tandem structure, an intermediate layer such as a charge-generation layer is preferably provided between a plurality of EL layers.

When the white light-emitting device (having a single structure or a tandem structure) and a light-emitting device having an SBS structure are compared to each other, the latter can have lower power consumption than the former. To reduce power consumption, a light-emitting device having an SBS structure is preferably used. Meanwhile, the white light-emitting device is preferable in terms of lower manufacturing cost or higher manufacturing yield because the manufacturing process of the white light-emitting device is simpler than that of a light-emitting device having an SBS structure.

Structure Example 2 of Light-Emitting Apparatus 700

Figure 8:
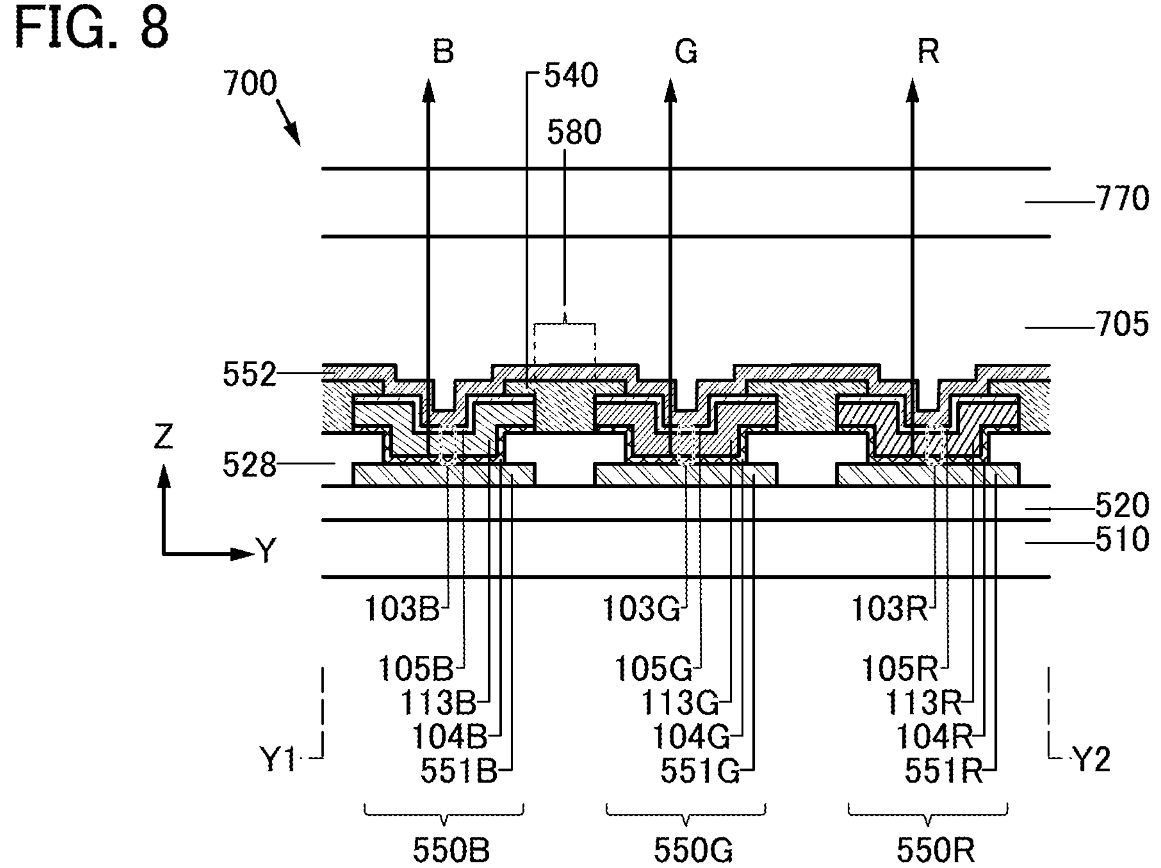
FIG. 8 is a diagram illustrating a light-emitting apparatus of an embodiment.

The light-emitting apparatus 700 illustrated in FIG. 8 includes the light-emitting device 550B, the light-emitting device 550G, the light-emitting device 550R, and the partition 528. The light-emitting device 550B, the light-emitting device 550G, the light-emitting device 550R, and the partition 528 are formed over the functional layer 520 provided over the first substrate 510. The functional layer 520 includes, for example, the driver circuit GD, the driver circuit SD, the pixel circuits, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. Specifically, the case is described in which the EL layer 103 in the structure illustrated in FIG. 2A differs between the light-emitting devices.

Note that specific structures of the light-emitting devices illustrated in FIG. 8 are the same as the structures of the light-emitting devices 550B, 550G, and 550R described using FIG. 3.

As illustrated in FIG. 8, the space 580 is provided between the light-emitting devices, for example, between the light-emitting device 550B and the light-emitting device 550G. An insulating layer 540 is formed in the space 580.

For example, by patterning using a photolithography method, the EL layer 103B (including the hole-injection/transport layer 104B and the oxidation-resistant layer 105B), the EL layer 103G (including the hole-injection/transport layer 104G and the oxidation-resistant layer 105G), and the EL layer 103R (including the hole-injection/transport layer 104R and the oxidation-resistant layer 105R) are separated, and then, by patterning using a photolithography method, the insulating layer 540 can be formed in the space 580 over the partition 528. Furthermore, the electrode 552 can be formed over the EL layers (103B, 103G, and 103R) and the insulating layer 540.

Note that in this structure, the block layer (107 in FIG. 3A) described in Structure example 1 becomes unnecessary because the EL layers are separated by the insulating layer 540.

The EL layers in this structure (the EL layers 103B, 103G, and 103R) are processed to be separated by patterning using a photolithography method; hence, an end portion of the processed EL layer (the side surfaces of the stacked layers of the EL layer) has substantially one surface (or is positioned on substantially the same plane).

In the EL layer, particularly the hole-injection layer, which is included in the hole-transport region between the anode and the light-emitting layer, often has high conductivity; thus, a hole-injection layer formed as a layer shared by adjacent light-emitting devices might lead to crosstalk. Therefore, processing the EL layers to be separated by patterning using a photolithography method as shown in this structure example can suppress occurrence of crosstalk between adjacent light-emitting devices.

Structure Example 3 of Light-Emitting Apparatus 700

Figure 9A:
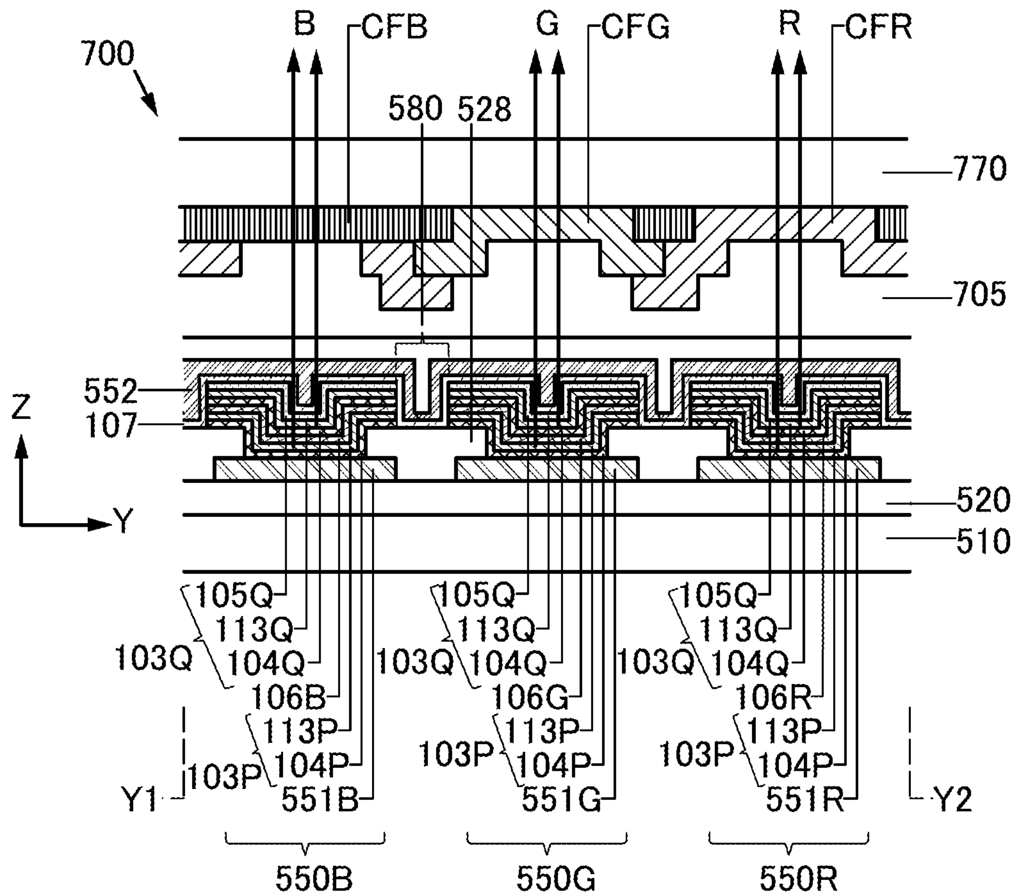
FIG. 9A and FIG. 9B are diagrams illustrating a light-emitting apparatus of an embodiment.

A light-emitting apparatus 700 illustrated in FIG. 9A includes a light-emitting device 550B, a light-emitting device 550G, a light-emitting device 550R, and a partition 528. The light-emitting device 550B, the light-emitting device 550G, the light-emitting device 550R, and the partition 528 are formed over a functional layer 520 provided over a first substrate 510. The functional layer 520 includes, for example, a driver circuit GD, a driver circuit SD, pixel circuits, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. Specifically, the case where the light-emitting devices share the EL layer 103 having the structure illustrated in FIG. 2B, i.e., a tandem structure is described.

The light-emitting device 550B has a stacked-layer structure illustrated in FIG. 9A, which includes the electrode 551B, the electrode 552, EL layers (103P and 103Q (including an oxidation-resistant layer 105Q)), a charge-generation layer 106B, and the block layer 107. Note that a specific structure of each layer is as described in Embodiment 1. The electrode 551B and the electrode 552 overlap with each other. The EL layer 103P and the EL layer 103Q are stacked with the charge-generation layer 106B therebetween, and the EL layer 103P, the EL layer 103Q, and the charge-generation layer 106B are positioned between the electrode 551B and the electrode 552. Note that each of the EL layers 103P and 103Q has a stacked-layer structure of layers having different functions including light-emitting layers (113P and 113Q), like the EL layers 103, 103*a*, 103*b*, and 103*c* described in Embodiment 1. The EL layer 103P is capable of emitting blue light, for example, and the EL layer 103Q is capable of emitting yellow light, for example.

FIG. 9A illustrates only the light-emitting layer 113P and a hole-injection/transport layer 104P as layers included in the EL layer 103P and only the light-emitting layer 113Q, a hole-injection/transport layer 104Q, and the oxidation-resistant layer 105Q as layers included in the EL layer 103Q. Thus, in the following description, the term "EL layer" (the EL layer 103P and the EL layer 103Q) is used for convenience to describe the layers included in the EL layer as well.

The block layer 107 is formed to cover the EL layer 103P, the EL layer 103Q, and the charge-generation layer 106B which are formed over the electrode 551B. Note that as illustrated in FIG. 9A, the EL layer 103P, the EL layer 103Q, and the charge-generation layer 106B include side surfaces (or end portions). Thus, the block layer 107 is formed in contact with the side surfaces (or the end portions) of the EL layer 103P, the EL layer 103Q, and the charge-generation layer 106B. Accordingly, entry of oxygen, moisture, or constituent elements thereof into the inside of the EL layer 103P, the EL layer 103Q, and the charge-generation layer 106B through their side surfaces can be inhibited. Note that the hole-transport material described in Embodiment 1 can be used for the block layer 107.

The electrode 552 is formed over the block layer 107. Note that the electrode 551B and the electrode 552 overlap with each other. The EL layer 103P, the EL layer 103Q, and the charge-generation layer 106B are included between the electrode 551B and the electrode 552. Thus, the electrode 552 is in contact with the side surfaces (or the end portions) of the EL layer 103P, the EL layer 103Q, and the charge-generation layer 106B through the block layer 107. This can prevent electrical short circuit between the EL layer 103P and the electrode 552, specifically between the hole-injection/transport layer 104P included in the EL layer 103P and the electrode 552, between the EL layer 103Q and the electrode 552, specifically between the hole-injection/transport layer 104Q included in the EL layer 103Q and the electrode 552, or between the charge-generation layer 106B and the electrode 552.

The light-emitting device 550G has a stacked-layer structure illustrated in FIG. 9A, which includes the electrode 551G, the electrode 552, the EL layers (103P and 103Q (including the oxidation-resistant layer 105Q)), a charge-generation layer 106G, and the block layer 107. Note that a specific structure of each layer is as described in Embodiment 1. The electrode 551G and the electrode 552 overlap with each other. The EL layer 103P and the EL layer 103Q are stacked with the charge-generation layer 106G therebetween, and the EL layer 103P, the EL layer 103Q, and the charge-generation layer 106G are included between the electrode 551G and the electrode 552.

The block layer 107 is formed to cover the EL layer 103P, the EL layer 103Q, and the charge-generation layer 106G which are formed over the electrode 551G. Note that as illustrated in FIG. 9A, the EL layer 103P, the EL layer 103Q, and the charge-generation layer 106G include side surfaces (or end portions). Thus, the block layer 107 is formed in contact with the side surfaces (or the end portions) of the EL layer 103P, the EL layer 103Q, and the charge-generation layer 106G. Accordingly, entry of oxygen, moisture, or constituent elements thereof into the inside of the EL layer 103P, the EL layer 103Q, and the charge-generation layer 106G through their side surfaces can be inhibited. Note that the hole-transport material described in Embodiment 1 can be used for the block layer 107.

The electrode 552 is formed over the block layer 107. Note that the electrode 551G and the electrode 552 overlap with each other. The EL layer 103P, the EL layer 103Q, and the charge-generation layer 106G are included between the electrode 551G and the electrode 552. Thus, the electrode 552 is in contact with the side surfaces (or the end portions) of the EL layer 103P, the EL layer 103Q, and the charge-generation layer 106G through the block layer 107. This can prevent electrical short circuit between the EL layer 103P and the electrode 552, specifically between the hole-injection/transport layer 104P included in the EL layer 103P and the electrode 552, between the EL layer 103Q and the electrode 552, specifically between the hole-injection/transport layer 104Q included in the EL layer 103Q and the electrode 552, or between the charge-generation layer 106G and the electrode 552.

The light-emitting device 550R has a stacked-layer structure illustrated in FIG. 9A, which includes the electrode 551R, the electrode 552, EL layers (103P and 103Q (including an oxidation-resistant layer 105Q)), a charge-generation layer 106R, and the block layer 107. Note that a specific structure of each layer is as described in Embodiment 1. The electrode 551R and the electrode 552 overlap with each other. The EL layer 103P and the EL layer 103Q are stacked with the charge-generation layer 106R therebetween, and the EL layer 103P, the EL layer 103Q, and the charge-generation layer 106R are positioned between the electrode 551R and the electrode 552.

The block layer 107 is formed to cover the EL layer 103P, the EL layer 103Q, and the charge-generation layer 106R which are formed over the electrode 551R. Note that as illustrated in FIG. 9A, the EL layer 103P, the EL layer 103Q, and the charge-generation layer 106R include side surfaces (or end portions). Thus, the block layer 107 is formed in contact with the side surfaces (or the end portions) of the EL layer 103P, the EL layer 103Q, and the charge-generation layer 106R. Accordingly, entry of oxygen, moisture, or constituent elements thereof into the inside of the EL layer 103P, the EL layer 103Q, and the charge-generation layer 106R through their side surfaces can be inhibited. Note that the hole-transport material described in Embodiment 1 can be used for the block layer 107.

The electrode 552 is formed over the block layer 107. Note that the electrode 551R and the electrode 552 overlap with each other. The EL layers (103P and 103Q) and the charge-generation layer 106R are included between the electrode 551R and the electrode 552. Note that the electrode 552 is in contact with the side surfaces (or the end portions) of the EL layers (103P and 103Q) and the charge-generation layer 106R through the block layer 107. This can prevent electrical short circuit between the EL layer 103P and the electrode 552, specifically between the hole-injection/transport layer 104P included in the EL layer 103P and the electrode 552, between the EL layer 103Q and the electrode 552, specifically between the hole-injection/transport layer 104Q included in the EL layer 103Q and the electrode 552, or between the charge-generation layer 106R and the electrode 552.

The EL layers (103P and 103Q) and the charge-generation layer 106 included in each of the light-emitting devices are processed to be separated between the light-emitting devices by patterning using a photolithography method; hence, the end portion of the EL layer (the side surfaces of the stacked layers of the EL layer) processed by patterning using a photolithography method has substantially one surface (or is positioned on substantially the same plane).

The EL layers (103P and 103Q) and the charge-generation layer 106, which are included in each light-emitting device, includes the space 580 between one light-emitting device and the adjacent light-emitting device. The charge-generation layers 106R and the hole-injection layers included in the hole-transport regions in the EL layers (103P and 103Q) often have high conductivity; therefore, these layers formed as layers shared by adjacent light-emitting devices might cause crosstalk. Thus, providing the space 580 as shown in this structure example can suppress occurrence of crosstalk between adjacent light-emitting devices.

When electrical continuity is established between the EL layer 103B, the EL layer 103G, and the EL layer 103R in a light-emitting apparatus (display panel) with a high resolution exceeding 1000 ppi, crosstalk occurs, resulting in a narrower color gamut that the light-emitting apparatus is capable of reproducing. Providing the space 580 in a high-resolution display panel with more than 1000 ppi, preferably more than 2000 ppi, or further preferably in an ultrahigh-resolution display panel with more than 5000 ppi allows the display panel to express vivid colors.

In this structure example, the light-emitting device 550B, the light-emitting device 550G, and the light-emitting device 550R each emit white light. Accordingly, the second substrate 770 includes a coloring layer CFB, a coloring layer CFG, and a coloring layer CFR. Note that these coloring layers may be provided to partly overlap with each other as illustrated in FIG. 9A. When the coloring layers partly overlap with each other, the overlap portion can function as a light-blocking film. In this structure example, a material that preferentially transmits blue light (B) is used for the coloring layer CFB, a material that preferentially transmits green light (G) is used for the coloring layer CFG, and a material that preferentially transmits red light (R) is used for the coloring layer CFR, for example.

Figure 9B:
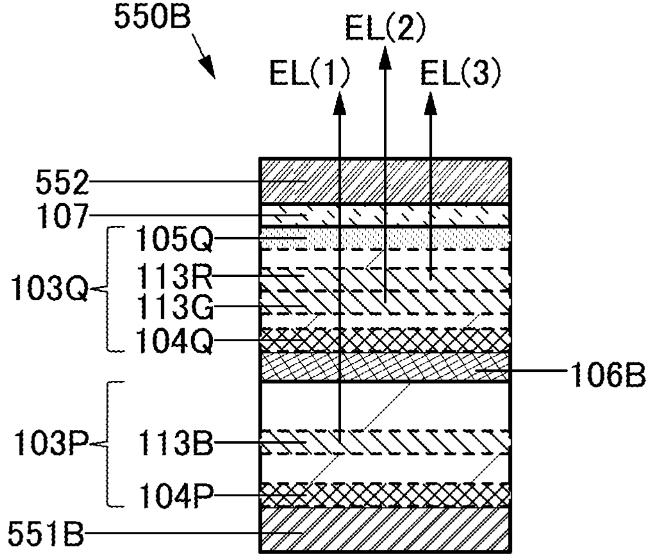

FIG. 9B illustrates a structure of the light-emitting device 550B in the case where each of the light-emitting devices 550B, 550G, and 550R is a light-emitting device that emits white light. The EL layer 103P and the EL layer 103Q are stacked over the electrode 551B, with the charge-generation layer 106B therebetween. The EL layer 103P includes, for example, the light-emitting layer 113B that emits blue light EL(1) as the light-emitting layer 113P, and the EL layer 103Q includes, for example, the light-emitting layer 113G that emits green light EL(2) and the light-emitting layer 113R that emits red light EL(3) as the light-emitting layer 113Q.

Note that a color conversion layer can be used instead of the coloring layer. For example, nanoparticles or quantum dots can be used for the color conversion layer.

For example, a color conversion layer that converts blue light into green light can be used instead of the coloring layer CFG. Thus, white light emitted from the light-emitting device 550G can be converted into green light. Moreover, a color conversion layer that converts blue light into red light can be used instead of the coloring layer CFR. Thus, white light emitted from the light-emitting device 550R can be converted into red light.

Structure Example 4 of Light-Emitting Apparatus 700

A light-emitting apparatus 700 illustrated in FIG. 10A includes a light-emitting device 550B, a light-emitting device 550G, a light-emitting device 550R, and a partition 528. The light-emitting device 550B, the light-emitting device 550G, the light-emitting device 550R, and the partition 528 are formed over a functional layer 520 provided over a first substrate 510. The functional layer 520 includes, for example, a driver circuit GD, a driver circuit SD, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. This device structure is suitable particularly for the case where light-emitting devices each have what is called a tandem structure of the EL layers (103P and 103Q) illustrated in FIG. 2B.

Figure 10:
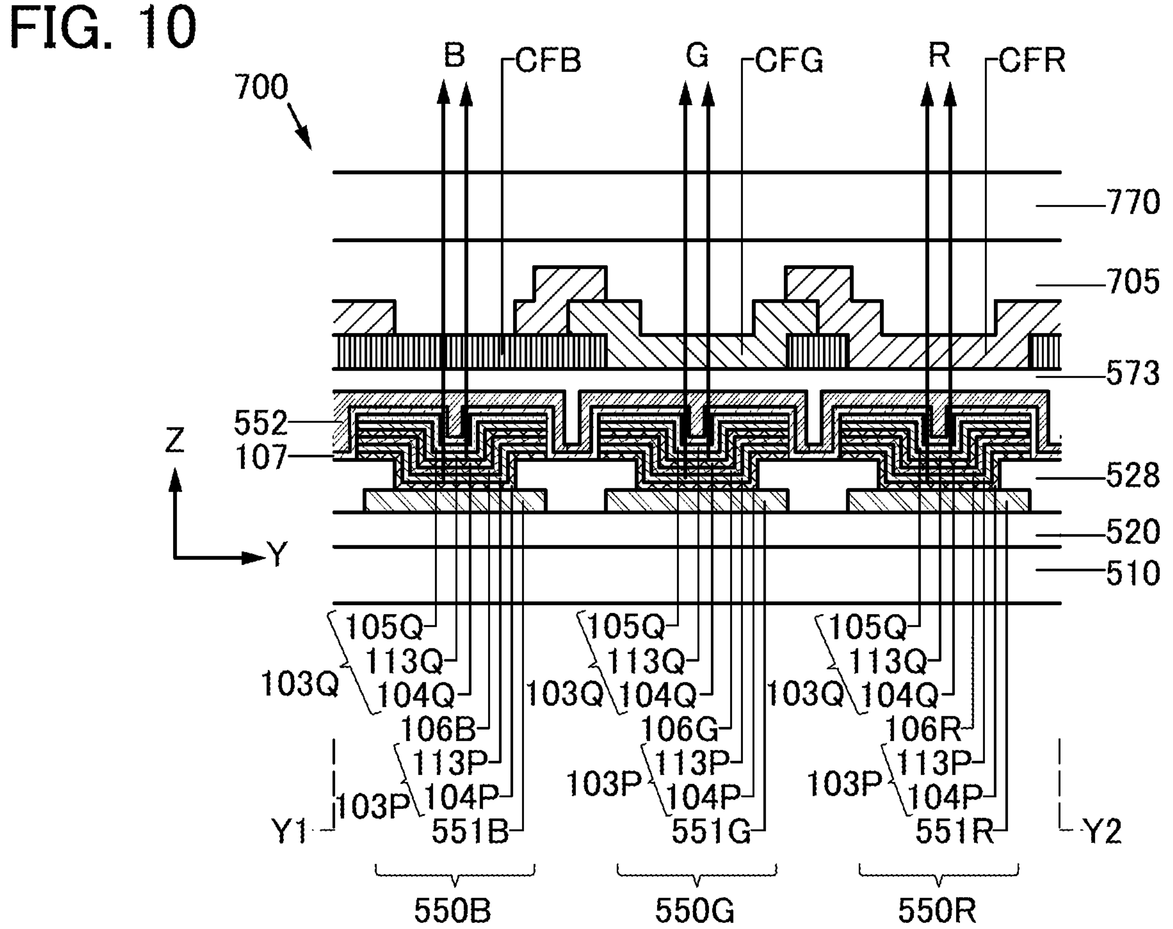
FIG. 10 is a diagram illustrating a light-emitting apparatus of an embodiment.

Note that specific structures of the light-emitting devices illustrated in FIG. 10 are the same as the structures of the light-emitting devices 550B, 550G, and 550R described using FIG. 9, and each of the light-emitting devices emits white light.

The light-emitting apparatus in this structure example is different from the light-emitting apparatus illustrated in FIG. 9 in including the coloring layer CFB, the coloring layer CFG, and the coloring layer CFR formed over the light-emitting devices over the first substrate 510.

In other words, a first insulating layer 573 is provided over the electrode 552 of each light-emitting device formed over the first substrate 510, and the coloring layer CFB, the coloring layer CFG, and the coloring layer CFR are provided over the first insulating layer 573.

The second insulating layer 705 is provided over the coloring layer CFB, the coloring layer CFG, and the coloring layer CFR. The second insulating layer 705 includes a region sandwiched between the second substrate 770 and the first substrate 510 on the side closer to the coloring layers (CFB, CFG, and CFR), which is provided with the functional layer 520, the light-emitting devices (550B, 550G, and 550R), and the coloring layers CFB, CFG, and CFR. The second insulating layer 705 has a function of attaching the first substrate 510 and the second substrate 770.

For the first insulating layer 573 and the second insulating layer 705, an inorganic material, an organic material, a composite material of an inorganic material and an organic material, or the like can be used.

As the inorganic material, an inorganic oxide film, an inorganic nitride film, an inorganic oxynitride film, and the like, or a stacked-layer structure obtained by stacking some of these films can be used. For example, a film including any of a silicon oxide film, a silicon nitride film, a silicon oxynitride film, an aluminum oxide film, and the like, or a film having a stacked-layer structure obtained by stacking any of these films can be used. Note that a silicon nitride film is a dense film and has an excellent function of inhibiting diffusion of impurities. Alternatively, for an oxide semiconductor (e.g., an IGZO film), a stacked-layer structure of an aluminum oxide film and an IGZO film over the aluminum oxide film, for example, can be used.

As the organic material, polyester, polyolefin, polyamide, polyimide, polycarbonate, polysiloxane, acrylic, and the like, or a layered material or a composite material including two or more of resins selected from the above can be used. Alternatively, an organic material such as a reactive curable adhesive, a photo-curable adhesive, a thermosetting adhesive, and/or an anaerobic adhesive can be used.

Example 2 of Method of Manufacturing Light-Emitting Apparatus

Next, a method of manufacturing the light-emitting apparatus illustrated in FIG. 10 will be described with reference to FIG. 11 and FIG. 12.

Figure 11A:
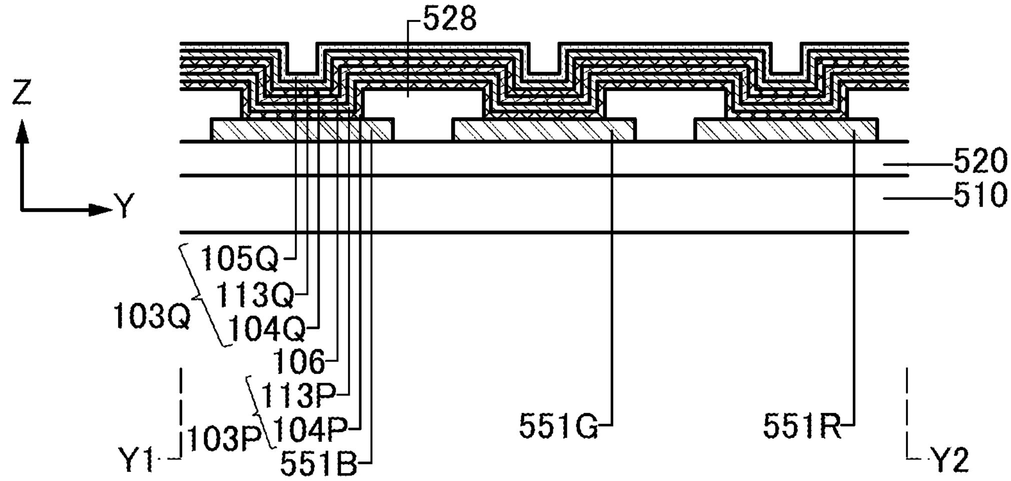
FIG. 11A to FIG. 11C are diagrams illustrating a method of manufacturing a light-emitting apparatus of an embodiment.

As illustrated in FIG. 11A, over the electrodes (551B, 551G, and 551R) and the partition 528 (see FIG. 4B) formed over the first substrate 510, the EL layer 103P (including the light-emitting layer 113P and the hole-injection/transport layer 104P), the charge-generation layer 106, and the EL layer 103Q (including the light-emitting layer 113Q, the hole-injection/transport layer 104Q, and the oxidation-resistant layer 105Q) are formed so as to cover the electrodes and the partition 528.

Note that the oxidation-resistant layer 105Q included in the EL layer 103Q is formed with an oxidation-resistant material. Specifically, a composite material obtained by adding an electron-acceptor material to a hole-transport material, which is an organic compound described in Embodiment 1 as a material that can be used for the charge-generation layer of the EL layer, or a stacked-layer of a hole-transport material and an electron-acceptor material can be used. As the electron-acceptor material, the material described in Embodiment 1 as an organic acceptor material for the hole-injection layer can be used. The use of the metal oxide as the electron-acceptor material can improve the oxidation resistance.

As the metal oxide, oxides of metals that belong to Group 4 to Group 8 of the periodic table can be given. Specific examples are vanadium oxide, niobium oxide, tantalum oxide, chromium oxide, molybdenum oxide, tungsten oxide, manganese oxide, and rhenium oxide. As the organic compound, the material given as an example of the hole-transport material can be used.

Setting the compositions of the metal oxide and the organic compound included in the oxidation-resistant layer 105Q to predetermined values can inhibit elution of the oxidation-resistant layer 105Q at the time of forming a resist over the oxidation-resistant layer 105Q in a later step. Note that the compositions of the metal oxide and the organic compound used for the oxidation-resistant layer 105Q are set in consideration of the thickness and the transmittance of the oxidation-resistant layer 105Q; the weight ratio of the organic compound to the metal oxide is preferably 1:100 to 100:1, further preferably 1:20 to 20:1.

Figure 11B:
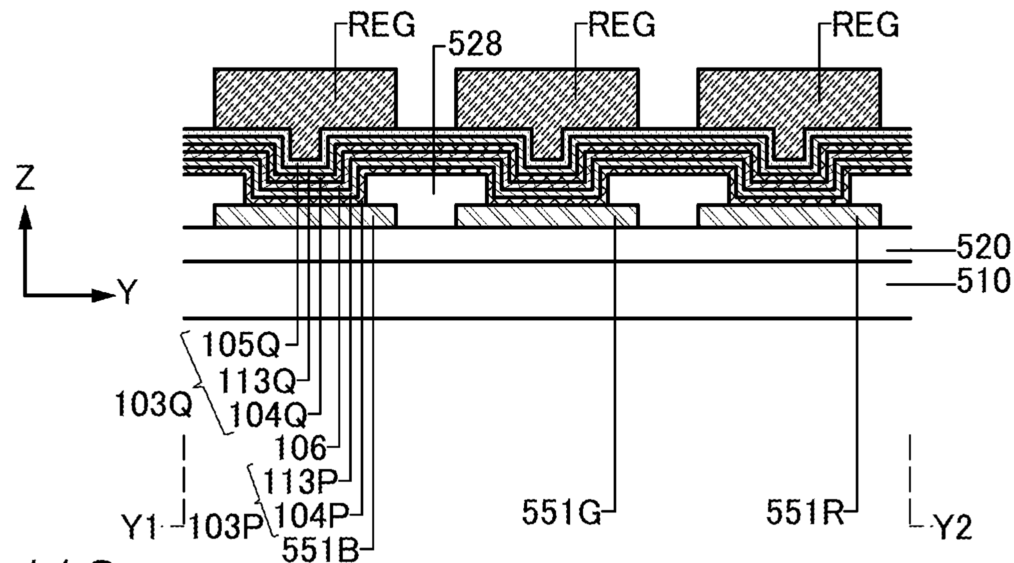
Figure 11C:
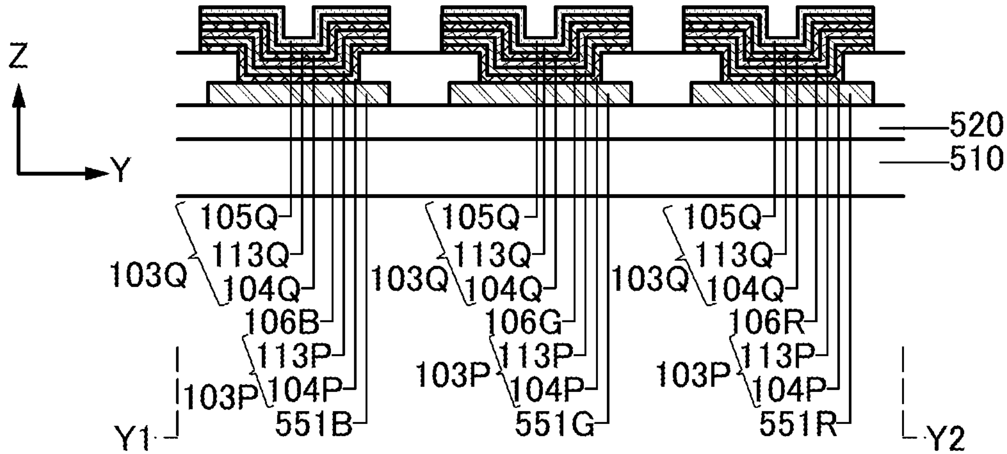

Next, the EL layer 103P (including the light-emitting layer 113P and the hole-injection/transport layer 104P), the charge-generation layer 106, and the EL layer 103Q (including the light-emitting layer 113Q, the hole-injection/transport layer 104Q, and the oxidation-resistant layer 105Q) over the electrodes (551B, 551G, and 551R) are processed to have a predetermined shape as illustrated in FIG. 11B. For example, the resist REG is formed by a photolithography method over the EL layer 103Q (including the light-emitting layer 113Q, the hole-injection/transport layer 104Q, and the oxidation-resistant layer 105Q) over the electrodes (551G, 551B, and 551R), and then the EL layer 103P (including the light-emitting layer 113P and the hole-injection/transport layer 104P), the charge-generation layer 106, and the EL layer 103Q (including the light-emitting layer 113Q, the hole-injection/transport layer 104Q, and the oxidation-resistant layer 105Q), over which the resist REG is not formed, are removed by etching, whereby the EL layer 103P is processed into a shape having a side surface (or an exposed side surface) or a band-like shape extending in a direction intersecting with the horizontal direction of the figure. Specifically, dry etching is performed using the resist REG formed over the EL layer 103Q (including the light-emitting layer 113Q, the hole-injection/transport layer 104Q, and the oxidation-resistant layer 105Q) (see FIG. 11C). The partition 528 can be used as an etching stopper.

In the above manner, the EL layers 103P (each including the light-emitting layer 113P and the hole-injection/transport layer 104P), the charge-generation layers (106B, 106G, and 106R), and EL layers 103Q (each including the light-emitting layer 113Q, the hole-injection/transport layer 104Q, and the oxidation-resistant layer 105Q) in the light-emitting device 550B, the light-emitting device 550G, and the light-emitting device 550R can be formed to be separated by one patterning step using a photolithography method.

Figure 12A:
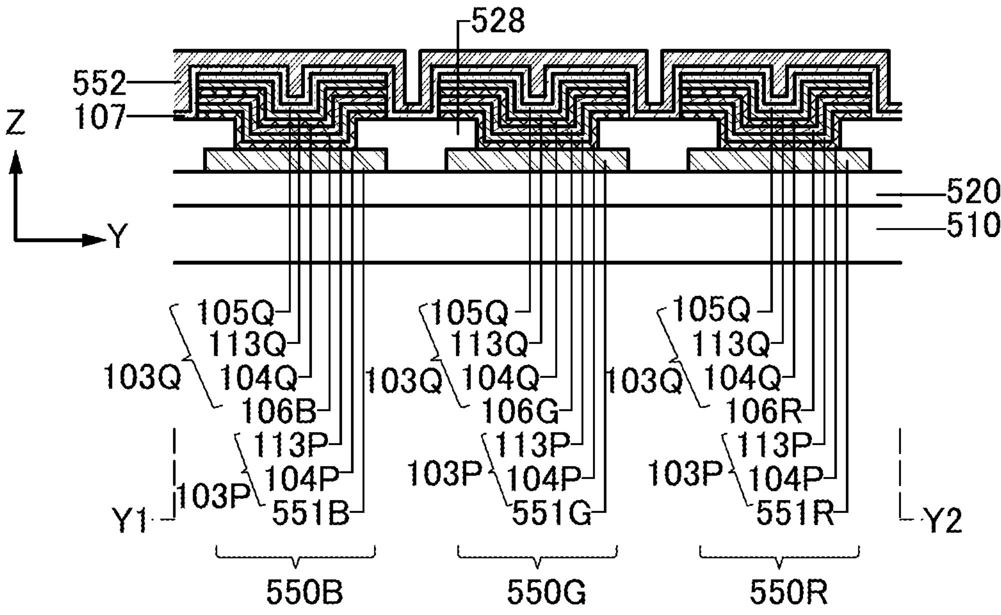
FIG. 12A and FIG. 12B are diagrams illustrating a method of manufacturing a light-emitting apparatus of an embodiment.

Next, the block layer 107 and the electrode 552 are formed over the EL layer 103P (including the light-emitting layer 113P and the hole-injection/transport layer 104P), the charge-generation layer (106B, 106G, and 106R), the EL layer 103Q (including the light-emitting layer 113Q, the hole-injection/transport layer 104Q, and the oxidation-resistant layer 105Q), and the partition 528 as illustrated in FIG. 12A. For example, the block layer 107 and the electrode 552 are formed by a vacuum evaporation method.

As a material used for the block layer 107, the hole-transport material described in Embodiment 1 can be used.

Note that the block layer 107 is also formed on side surfaces exposed by etching the EL layer 103P (including the light-emitting layer 113P and the hole-injection/transport layer 104P), the charge-generation layers (106B, 106G, and 106R), and the EL layer 103Q (including the light-emitting layer 113Q, the hole-injection/transport layer 104Q, and the oxidation-resistant layer 105Q).

The electrode 552 is formed over the block layer 107. Note that the electrode 552 is in contact with side surfaces of the EL layer 103P (including the light-emitting layer 113P and the hole-injection/transport layer 104P), the charge-generation layer (106B, 106G, and 106R), and the EL layer 103Q (including the light-emitting layer 113Q, the hole-injection/transport layer 104Q, and the oxidation-resistant layer 105Q) through the block layer 107. This can prevent electrical short circuit between the EL layer 103P and the electrode 552, specifically between the hole-injection/transport layer 104P included in the EL layer 103P and the electrode 552, between the EL layer 103Q and the electrode 552, specifically between the hole-injection/transport layer 104Q included in the EL layer 103Q and the electrode 552, or between the charge-generation layer (106B, 106G, and 106R) and the electrode 552.

The EL layers (103P and 103Q) and the charge-generation layer 106 included in the light-emitting devices are processed to be separated between the light-emitting devices by patterning using a photolithography method; thus, a high-resolution light-emitting apparatus (display panel) can be fabricated. The end portion of the EL layer (the side surfaces of the stacked layers of the EL layer) processed by patterning using a photolithography method has substantially one surface (or is positioned on substantially the same plane).

The charge-generation layers (106B, 106G, and 106R) and the hole-injection layer included in the hole-transport region in the EL layers (103P and 103Q) often have high conductivity; therefore, these layers formed as layers shared by adjacent light-emitting devices might lead to crosstalk. Thus, processing the EL layers to be separated by patterning using a photolithography method as shown in this structure example can suppress occurrence of crosstalk between adjacent light-emitting devices.

Figure 12B:
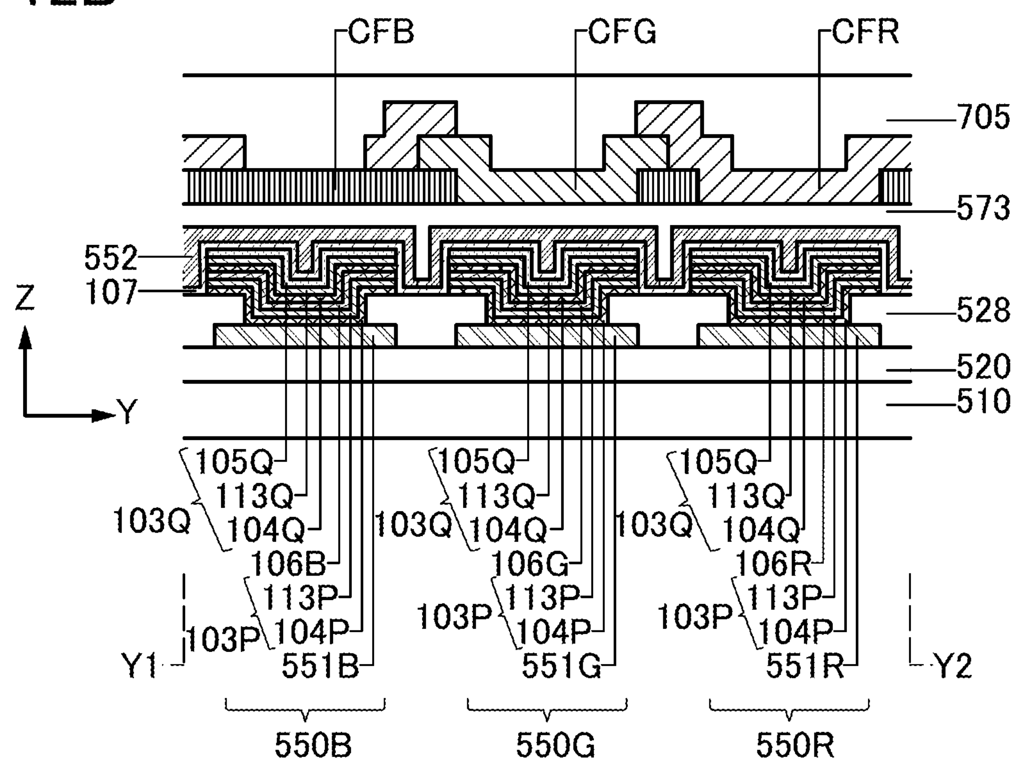

Note that specific structures of the light-emitting devices illustrated in FIG. 12B are the same as the structures of the light-emitting devices 550B, 550G, and 550R described using FIG. 12A.

The light-emitting apparatus in this structure example is different from the light-emitting apparatus illustrated in FIG. 12A in including the coloring layer CFB, the coloring layer CFG, and the coloring layer CFR formed over the light-emitting devices over the first substrate 510.

In other words, the first insulating layer 573 is provided over the electrode 552 of each light-emitting device formed over the first substrate 510, and the coloring layer CFB, the coloring layer CFG, and the coloring layer CFR are provided over the first insulating layer 573.

The second insulating layer 705 is provided over the coloring layer CFB, the coloring layer CFG, and the coloring layer CFR. The second insulating layer 705 is provided on the coloring layer (CFB, CFG, and CFR) side of the first substrate 510 including the functional layer 520, the light-emitting devices (550B, 550G, and 550R), the coloring layer CFB, the coloring layer CFG, and the coloring layer CFR. Note that the second insulating layer 705 may include a region sandwiched with the second substrate, and may have a function of bonding the first substrate 510 and the second substrate.

Structure Example 5 of Light-Emitting Apparatus 700

The light-emitting apparatus 700 illustrated in FIG. 13A includes the light-emitting device 550B, the light-emitting device 550G, the light-emitting device 550R, and the partition 528. The light-emitting device 550B, the light-emitting device 550G, the light-emitting device 550R, and the partition 528 are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. This device structure is suitable particularly for the case where the light-emitting devices share the EL layer 103 having the structure illustrated in FIG. 2B, i.e., a tandem structure.

Figure 13:
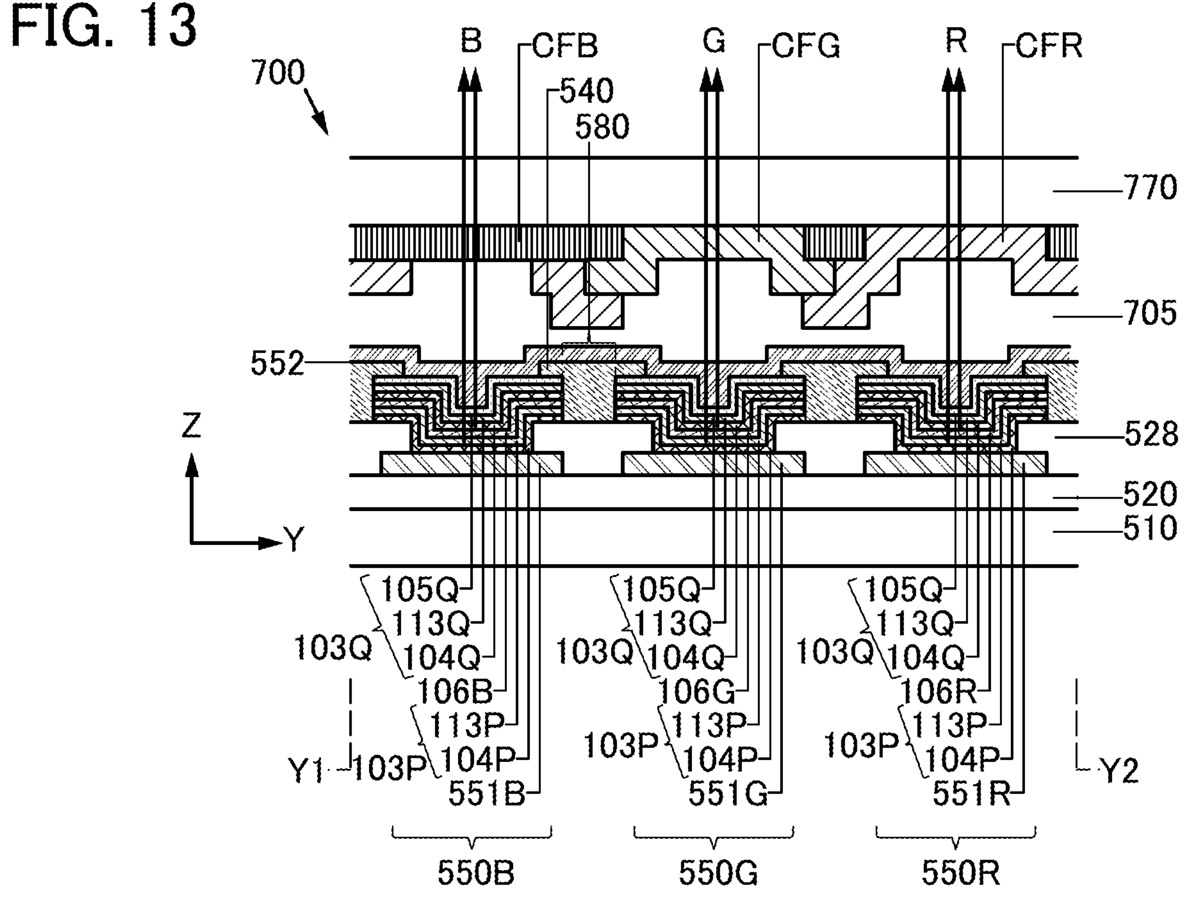
FIG. 13 is a diagram illustrating a light-emitting apparatus of an embodiment.

As illustrated in FIG. 13, the space 580 is provided between the light-emitting devices, for example, between the light-emitting device 550B and the light-emitting device 550G. The insulating layer 540 is formed in the space 580.

For example, the insulating layer 540 can be formed in the space 580 over the partition 528 by a photolithography method after the EL layer 103P (including the light-emitting layer 113P and the hole-injection/transport layer 104P), the charge-generation layers (106B, 106G, and 106R), and the EL layer 103Q (including the light-emitting layer 113Q, the hole-injection/transport layer 104Q, and the oxidation-resistant layer 105Q) are separately formed by patterning using a photolithography method. Furthermore, the electrode 552 can be formed over the EL layer 103Q (including the light-emitting layer 113Q, the hole-injection/transport layer 104Q, and the oxidation-resistant layer 105Q) and the insulating layer 540.

Note that in this structure, the block layer (107 in FIG. 9) described in Structure example 3 becomes unnecessary because the EL layers are separated by the insulating layer 540.

The EL layers (103P and 103Q) and the charge-generation layer 106 included in the light-emitting devices are processed to be separated between the light-emitting devices by patterning using a photolithography method; thus, a high-resolution light-emitting apparatus (display panel) can be fabricated. The end portion of the EL layer (the side surfaces of the stacked layers of the EL layer) processed by patterning using a photolithography method has substantially one surface (or is positioned on substantially the same plane).

The charge-generation layers (106B, 106G, and 106R) and the hole-injection layer included in the hole-transport region in the EL layers (103P and 103Q) often have high conductivity; therefore, these layers formed as layers shared by adjacent light-emitting devices might lead to crosstalk. Thus, processing the EL layers to be separated by patterning using a photolithography method as shown in this structure example can suppress occurrence of crosstalk between adjacent light-emitting devices.

Embodiment 3

In this embodiment, a light-emitting apparatus of one embodiment of the present invention will be described with reference to FIG. 14 to FIG. 16. The light-emitting apparatus 700 illustrated in FIG. 14 to FIG. 16 includes the light-emitting device described in Embodiment 1. The light-emitting apparatus 700 described in this embodiment can be referred to as a display panel because it can be used in a display portion of an electronic device and the like.

Figure 14A:
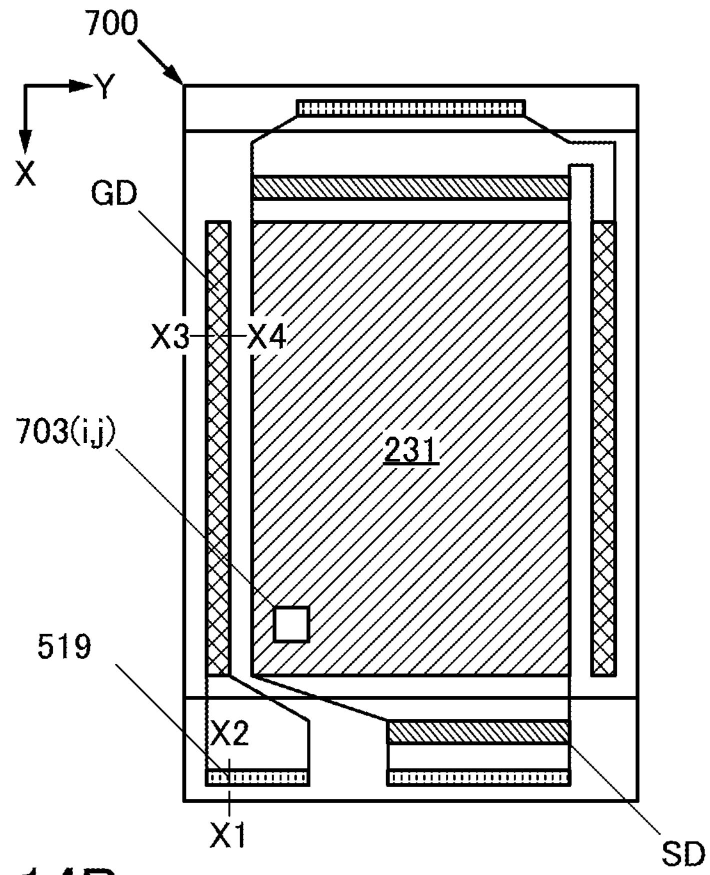
FIG. 14A and FIG. 14B are diagrams illustrating a light-emitting apparatus of an embodiment.
Figure 14B:
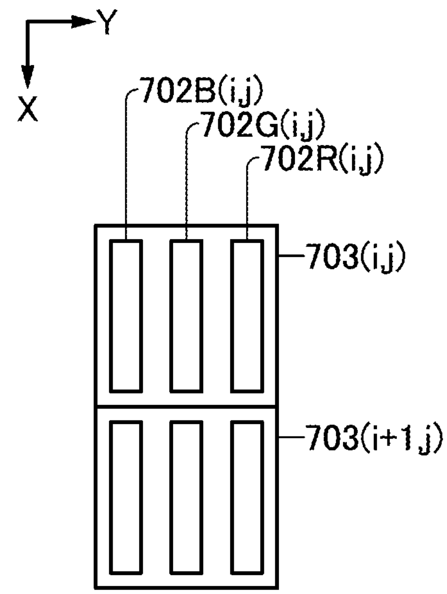

As illustrated in FIG. 14A, the light-emitting apparatus 700 described in this embodiment includes a display region 231, and the display region 231 includes a pixel 703(*i*,*j*). A pixel set 703(*i*+1,j) adjacent to the pixel 703(*i*,*j*) is provided as illustrated in FIG. 14B.

Note that a plurality of pixels can be used in the pixel 703(*i*,*j*). For example, a plurality of pixels that show colors of different hues can be used. Note that a plurality of pixels can be referred to as subpixels. In addition, a set of subpixels can be referred to as a pixel.

Such a structure enables additive mixture or subtractive mixture of colors shown by the plurality of pixels. Alternatively, it is possible to express a color of a hue that an individual pixel cannot show.

Specifically, a pixel 702B(ij) for showing blue, the pixel 702G(ij) for showing green, and a pixel 702R(ij) for showing red can be used in the pixel 703(*ij*). The pixel 702B(ij), the pixel 702G(ij), and the pixel 702R(ij) can each be referred to as a subpixel.

A pixel for showing white or the like in addition to the above set may be used in the pixel 703(*i,j*). Moreover, a pixel for showing cyan, a pixel for showing magenta, and a pixel for showing yellow may be used in the pixel 703(*ij*).

A pixel that emits infrared light in addition to the above set may be used in the pixel 703(*i,j*). Specifically, a pixel that emits light including light with a wavelength greater than or equal to 650 nm and less than or equal to 1000 nm can be used in the pixel 703(*ij*).

The light-emitting apparatus 700 includes the driver circuit GD and the driver circuit SD around the display region 231 in FIG. 14A. The light-emitting apparatus 700 also includes a terminal 519 electrically connected to the driver circuit GD, the driver circuit SD, and the like. The terminal 519 can be electrically connected to a flexible printed circuit FPC1 (see FIG. 16), for example.

The driver circuit GD has a function of supplying a first selection signal and a second selection signal. For example, the driver circuit GD is electrically connected to a conductive film G1(*i*) to supply the first selection signal, and is electrically connected to a conductive film G2(*i*) to supply the second selection signal. The driver circuit SD has a function of supplying an image signal and a control signal, and the control signal includes a first level and a second level. For example, the driver circuit SD is electrically connected to a conductive film S1*g*(j) to supply the image signal, and is electrically connected to a conductive film S2*g*(j) to supply the control signal.

Figure 16A:
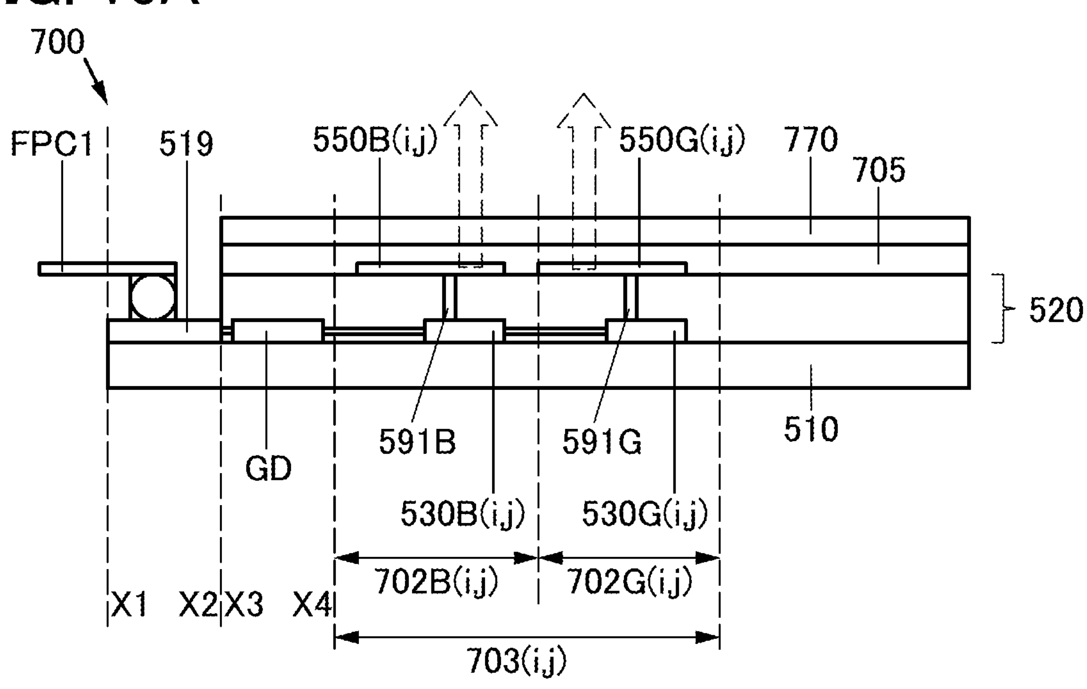
FIG. 16A and FIG. 16B are diagrams illustrating a light-emitting apparatus of an embodiment.

As illustrated in FIG. 16A, the light-emitting apparatus 700 includes the functional layer 520 between the first substrate 510 and the second substrate 770. The functional layer 520 includes, for example, the driver circuit GD, the driver circuit SD, and the like, and wirings that electrically connect these circuits. Although FIG. 16A illustrates the functional layer 520 including a pixel circuit 530B(ij), a pixel circuit 530G(ij), and the driver circuit GD, the functional layer 520 is not limited thereto.

Each pixel circuit (e.g., the pixel circuit 530B(ij) and the pixel circuit 530G(ij) in FIG. 16A) included in the functional layer 520 is electrically connected to a light-emitting device (e.g., a light-emitting device 550B(ij) and a light-emitting device 550G(ij) in FIG. 16A) formed over the functional layer 520. The second insulating layer 705 is provided over the functional layer 520 and the light-emitting devices, and the second insulating layer 705 has a function of attaching the second substrate 770 and the functional layer 520.

As the second substrate 770, a substrate where touch sensors are arranged in a matrix can be used. For example, a substrate provided with capacitive touch sensors or optical touch sensors can be used as the second substrate 770. Thus, the light-emitting apparatus of one embodiment of the present invention can be used as a touch panel.

Figure 15A:
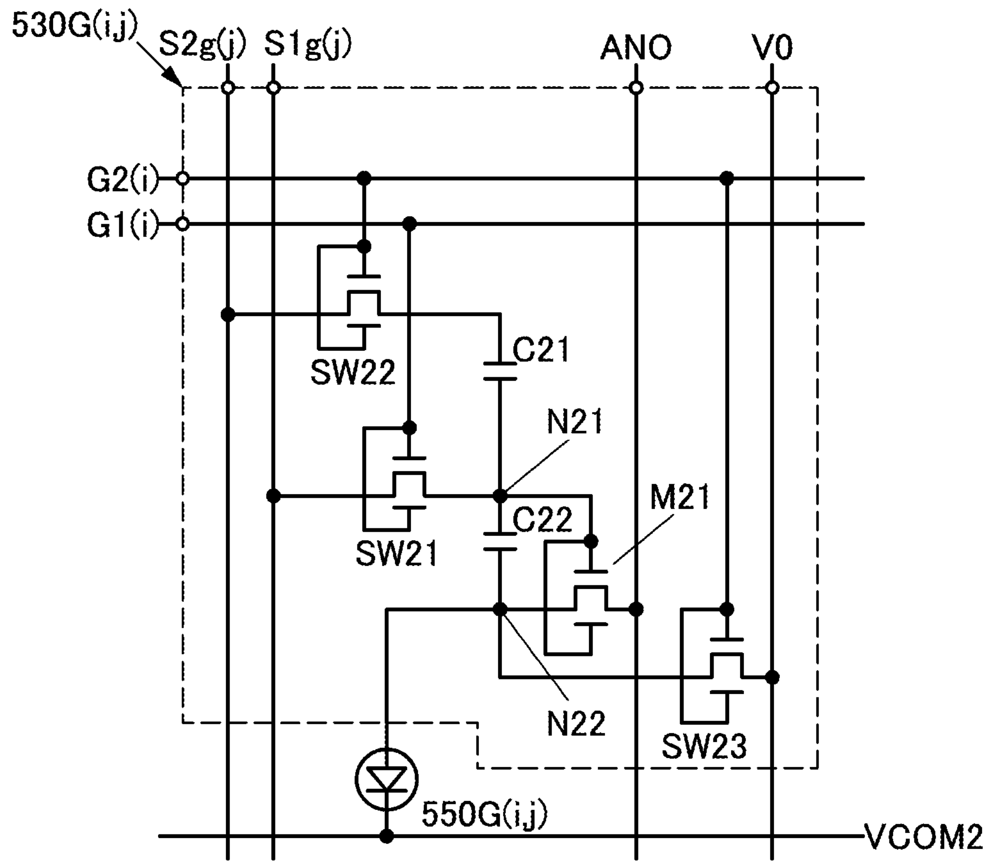
FIG. 15A and FIG. 15B are diagrams illustrating a light-emitting apparatus of an embodiment.

FIG. 15A illustrates a specific configuration of the pixel circuit 530G(ij).

As illustrated in FIG. 15A, the pixel circuit 530G(ij) includes a switch SW21, a switch SW22, a transistor M21, a capacitor C21, and a node N21. The pixel circuit 530G(ij) includes a node N22, a capacitor C22, and a switch SW23.

The transistor M21 includes a gate electrode electrically connected to the node N21, a first electrode electrically connected to the light-emitting device 550G(ij), and a second electrode electrically connected to a conductive film ANO.

The switch SW21 includes a first terminal electrically connected to the node N21 and a second terminal electrically connected to the conductive film S1*g*(j), and has a function of controlling its on/off state on the basis of the potential of the conductive film G1(*i*).

The switch SW22 includes a first terminal electrically connected to the conductive film S2*g*(j), and has a function of controlling its on/off state on the basis of the potential of the conductive film G2(*i*).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the light-emitting device 550G(ij) can be controlled with the potential of the node N21.

Figure 15B:
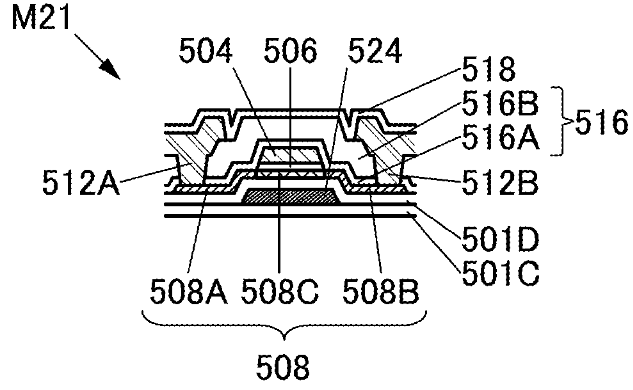

FIG. 15B illustrates an example of a specific structure of the transistor M21 described in FIG. 15A. As the transistor M21, a bottom-gate transistor, a top-gate transistor, or the like can be used as appropriate.

The transistor illustrated in FIG. 15B includes a semiconductor film 508, a conductive film 504, a conductive film 512A, and a conductive film 512B. The transistor is formed over an insulating film 501C, for example.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping the region 508C and has a function of a gate electrode.

The insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other.

A conductive film 524 can be used in the transistor. The conductive film 524 includes a region where the semiconductor film 508 is positioned between the conductive film 504 and the conductive film 524. The conductive film 524 has a function of a second gate electrode. An insulating film 501D is positioned between the semiconductor film 508 and the conductive film 524 and has a function of a second gate insulating film.

Note that in a step of forming the semiconductor film used in the transistor of the pixel circuit, the semiconductor film used in the transistor of the driver circuit can be formed. A semiconductor film with the same composition as the semiconductor film used in the transistor of the pixel circuit can be used in the driver circuit, for example.

For the semiconductor film 508, a semiconductor containing an element of Group 14 can be used. Specifically, a semiconductor containing silicon can be used for the semiconductor film 508.

Hydrogenated amorphous silicon can be used for the semiconductor film 508. Microcrystalline silicon or the like can also be used for the semiconductor film 508. In such cases, it is possible to provide a light-emitting apparatus having less display unevenness than a light-emitting apparatus (or a display panel) using polysilicon for the semiconductor film 508, for example. Moreover, it is easy to increase the size of the light-emitting apparatus.

Polysilicon can be used for the semiconductor film 508. In this case, for example, the field-effect mobility of the transistor can be higher than that of a transistor using hydrogenated amorphous silicon for the semiconductor film 508. For another example, the driving capability can be higher than that of a transistor using hydrogenated amorphous silicon for the semiconductor film 508. For another example, the aperture ratio of the pixel can be higher than that in the case of employing a transistor using hydrogenated amorphous silicon for the semiconductor film 508.

For another example, the reliability of the transistor can be higher than that of a transistor using hydrogenated amorphous silicon for the semiconductor film 508.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over a substrate where the pixel circuit is formed. The number of components of an electronic device can be reduced.

Single crystal silicon can be used for the semiconductor film 508. In this case, for example, the resolution can be higher than that of a light-emitting apparatus (or a display panel) using hydrogenated amorphous silicon for the semiconductor film 508. For another example, it is possible to provide a light-emitting apparatus having less display unevenness than a light-emitting apparatus using polysilicon for the semiconductor film 508. For another example, smart glasses or a head-mounted display can be provided.

A metal oxide can be used for the semiconductor film 508. In this case, the pixel circuit can hold an image signal for a longer time than a pixel circuit including a transistor that uses hydrogenated amorphous silicon for the semiconductor film. Specifically, a selection signal can be supplied at a frequency lower than 30 Hz, preferably lower than 1 Hz, further preferably less than once per minute while flickering is suppressed. Consequently, fatigue of a user of an electronic device can be reduced. Furthermore, power consumption for driving can be reduced.

An oxide semiconductor can be used for the semiconductor film 508. Specifically, an oxide semiconductor containing indium, an oxide semiconductor containing indium, gallium, and zinc, or an oxide semiconductor containing indium, gallium, zinc, and tin can be used for the semiconductor film 508.

The use of an oxide semiconductor for the semiconductor film achieves a transistor having a lower leakage current in the off state than a transistor using hydrogenated amorphous silicon for the semiconductor film. Thus, a transistor using an oxide semiconductor for the semiconductor film is preferably used as a switch or the like. Note that a circuit in which a transistor using an oxide semiconductor for the semiconductor film is used as a switch is capable of retaining a potential of a floating node for a longer time than a circuit in which a transistor using hydrogenated amorphous silicon for the semiconductor film is used as a switch.

Figure 16B:
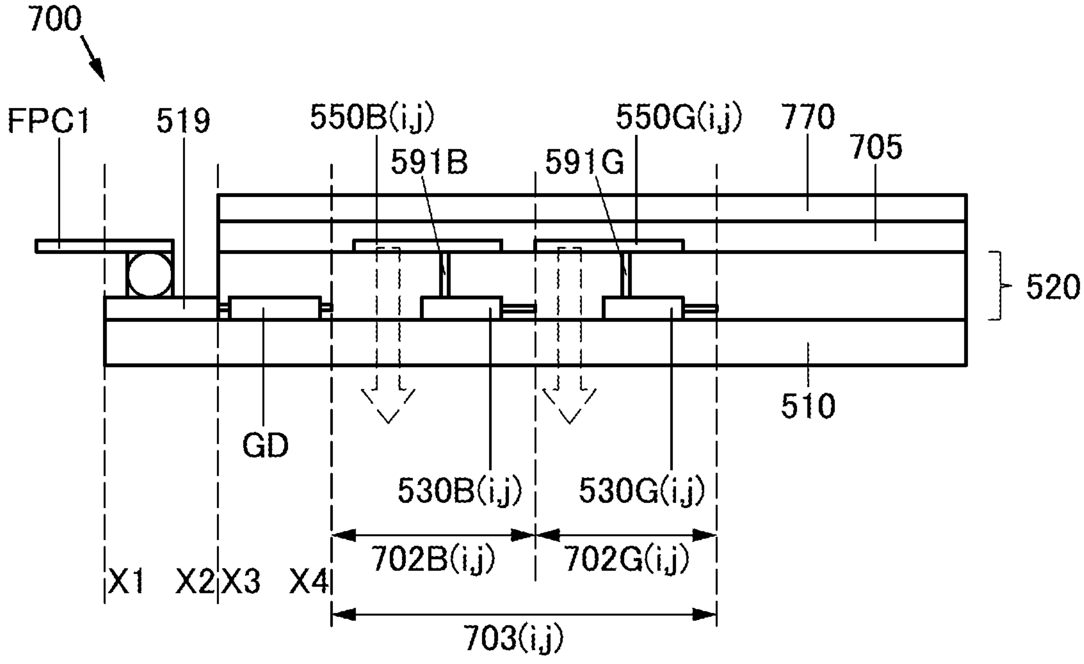

Although the light-emitting apparatus in FIG. 16A has a structure in which light is extracted from the second substrate 770 side (top emission structure), a light-emitting apparatus may have a structure in which light is extracted from the first substrate 510 side (bottom emission structure) as illustrated in FIG. 16B. In a bottom-emission light-emitting apparatus, the first electrode is formed as a transflective electrode and the second electrode is formed as a reflective electrode.

Although FIG. 16A and FIG. 16B illustrate active-matrix light-emitting apparatuses, the structure of the light-emitting device described in Embodiment 1 may be applied to a passive-matrix light-emitting apparatus illustrated in FIG. 17.

Figure 17A:
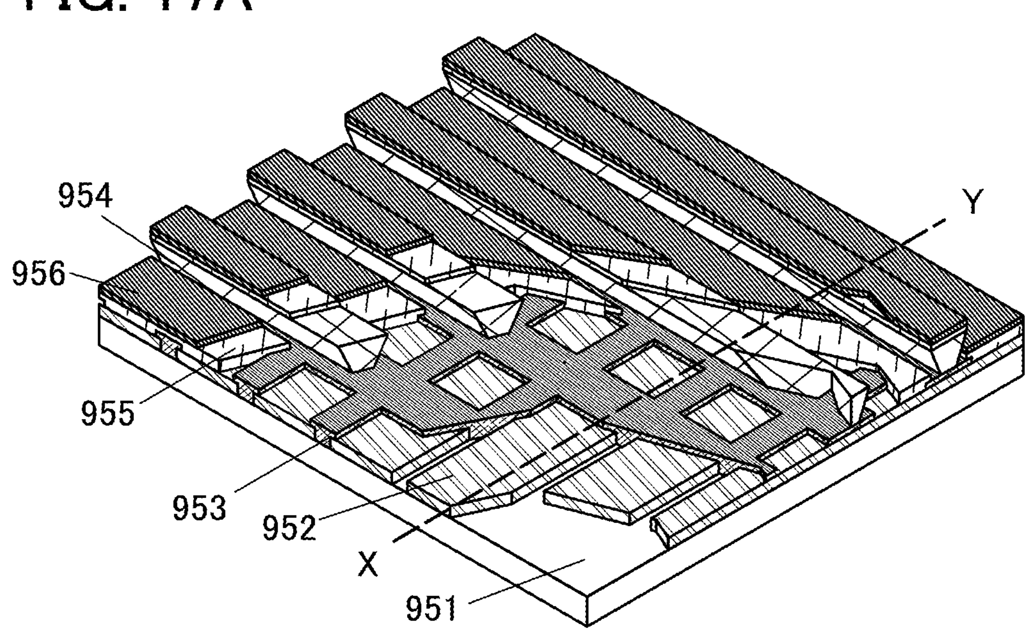
FIG. 17A and FIG. 17B are diagrams illustrating a light-emitting apparatus of an embodiment.
Figure 17B:
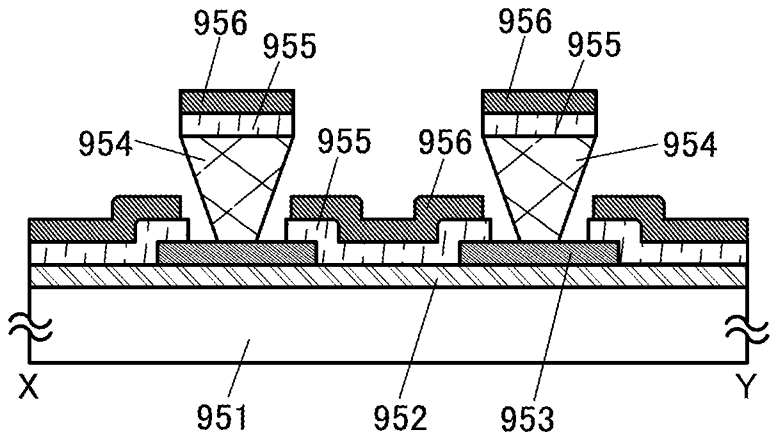

FIG. 17A is a perspective view illustrating the passive-matrix light-emitting apparatus, and FIG. 17B shows a cross section along the line X-Y in FIG. 17A. In FIG. 17, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section of the partition layer 954 in the short axis direction is trapezoidal, and the lower base (the side in contact with the insulating layer 953) is shorter than the upper base. The partition layer 954 thus provided can prevent defects in the light-emitting device due to static electricity or the like.

Note that the structure described in this embodiment can be used in an appropriate combination with any of the structures described in the other embodiments.

Embodiment 4

In this embodiment, structures of an electronic device of one embodiment of the present invention will be described with reference to FIG. 18 to FIG. 20.

Figure 18A:
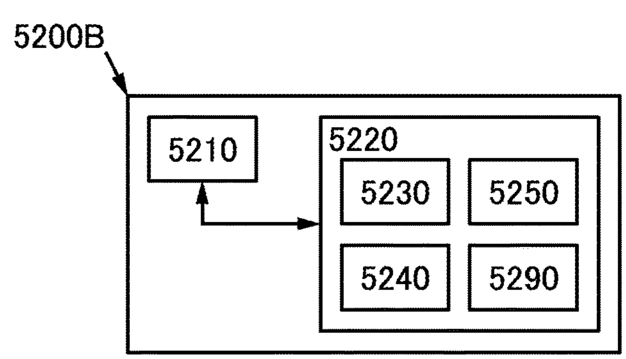
FIG. 18A to FIG. 18E are diagrams illustrating electronic devices of embodiments.
Figure 18B:
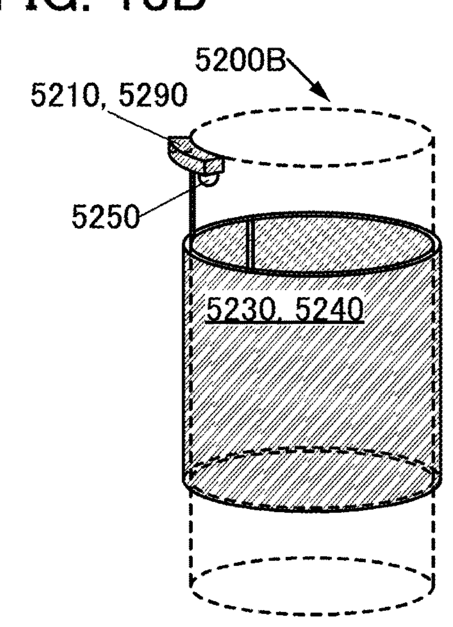
Figure 18C:
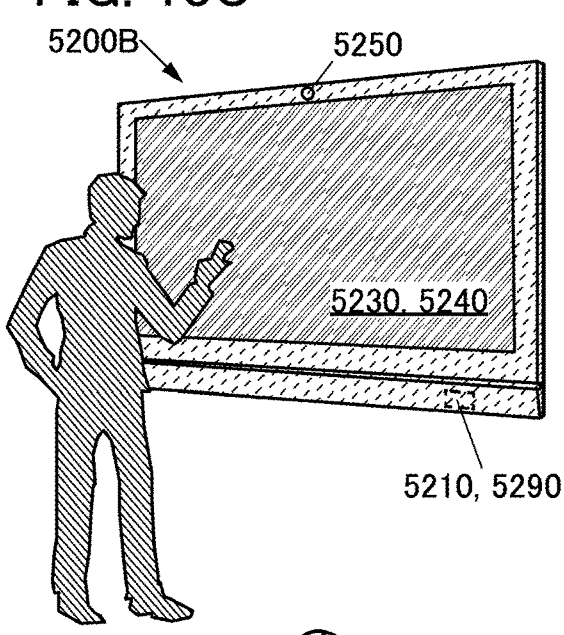
Figure 18D:
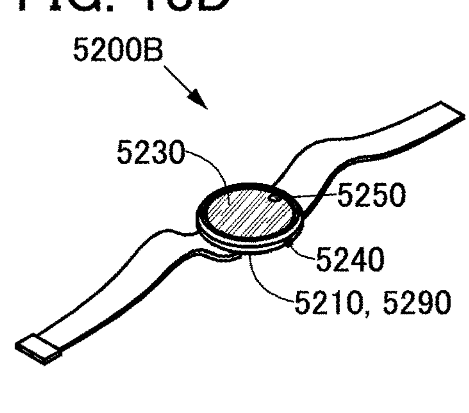
Figure 18E:
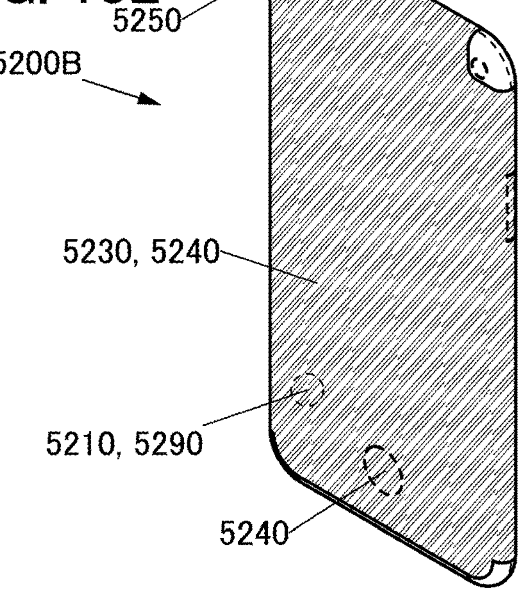
Figure 19A:
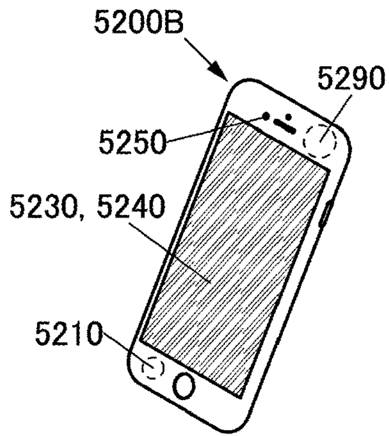
FIG. 19A to FIG. 19E are diagrams illustrating electronic devices of embodiments.
Figure 19B:
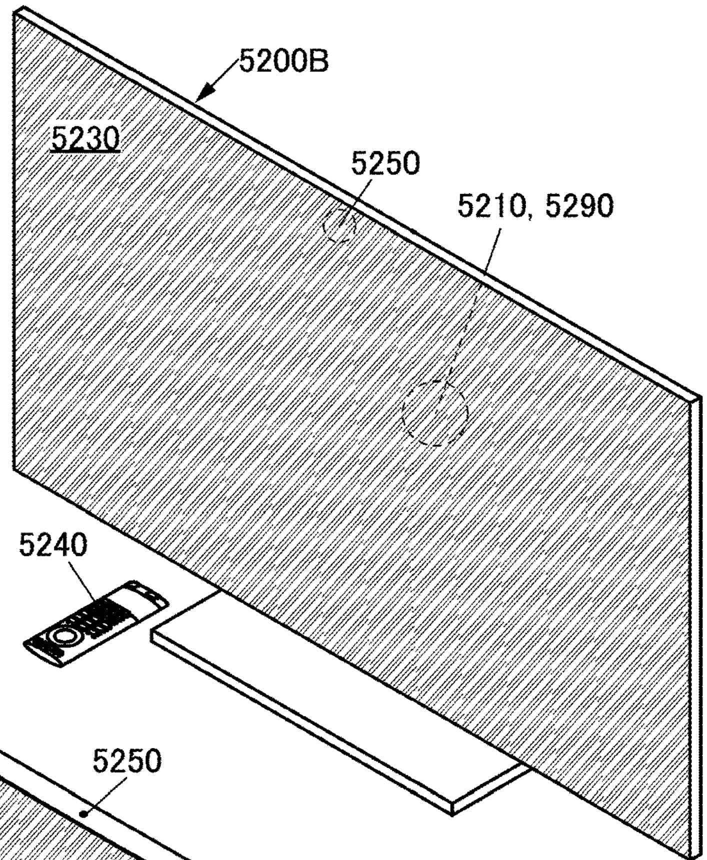
Figure 19C:
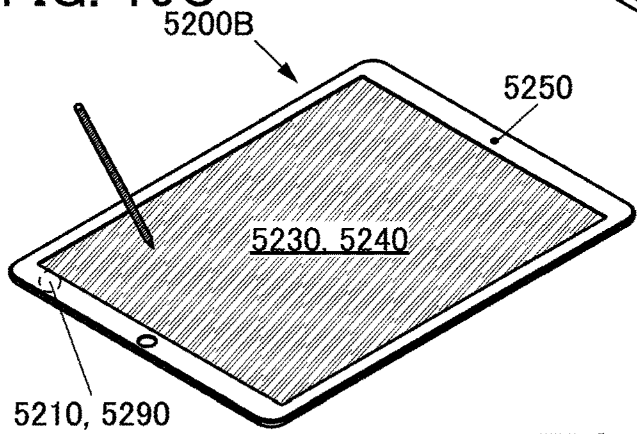
Figure 19E:
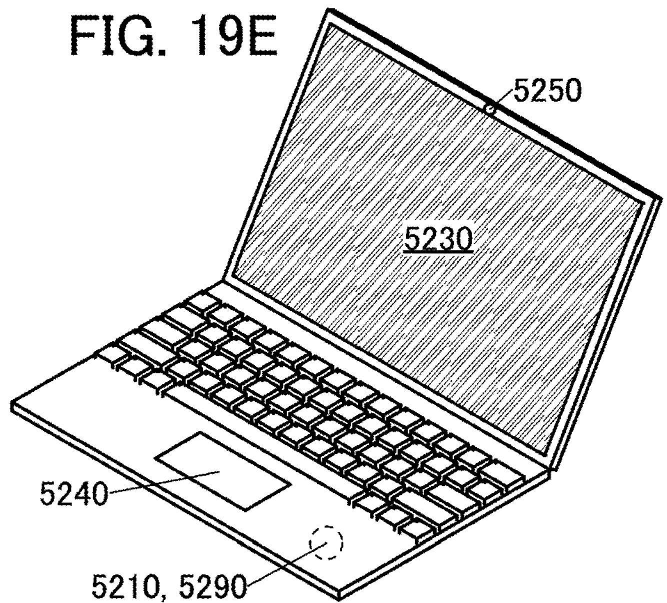
Figure 19D:
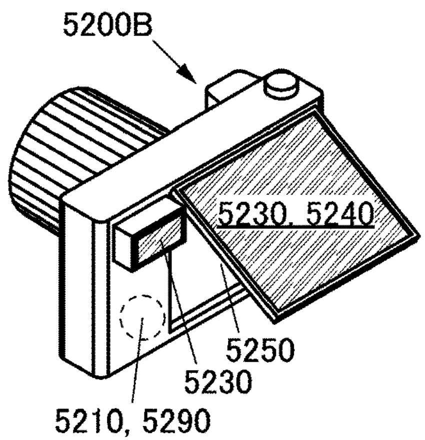
Figure 20A:
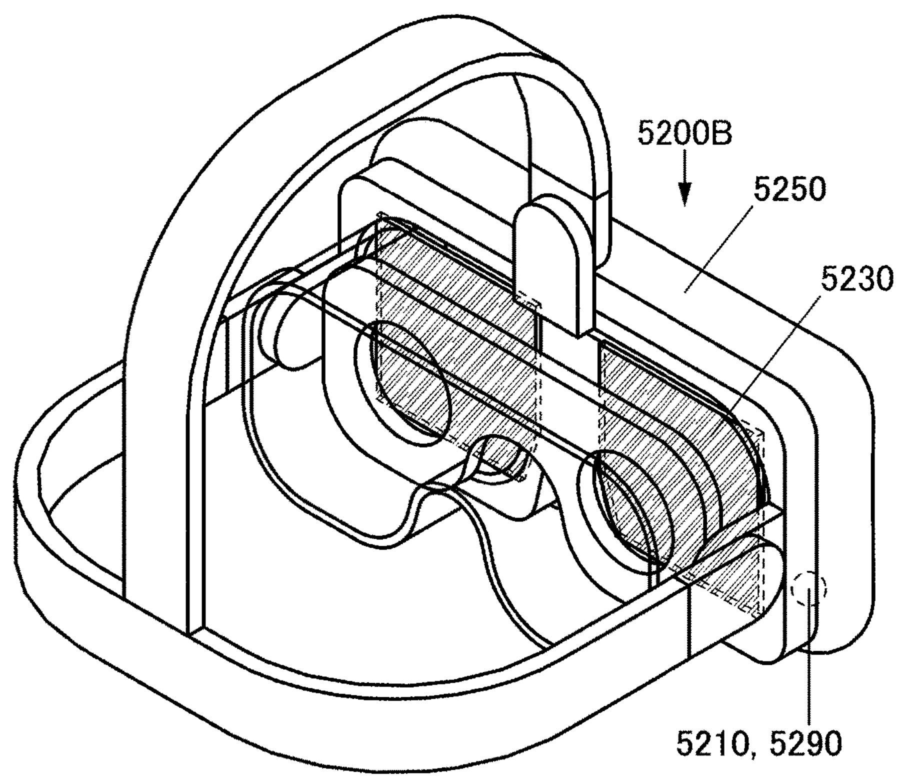
FIG. 20A and FIG. 20B are diagrams illustrating electronic devices of embodiments.
Figure 20B:
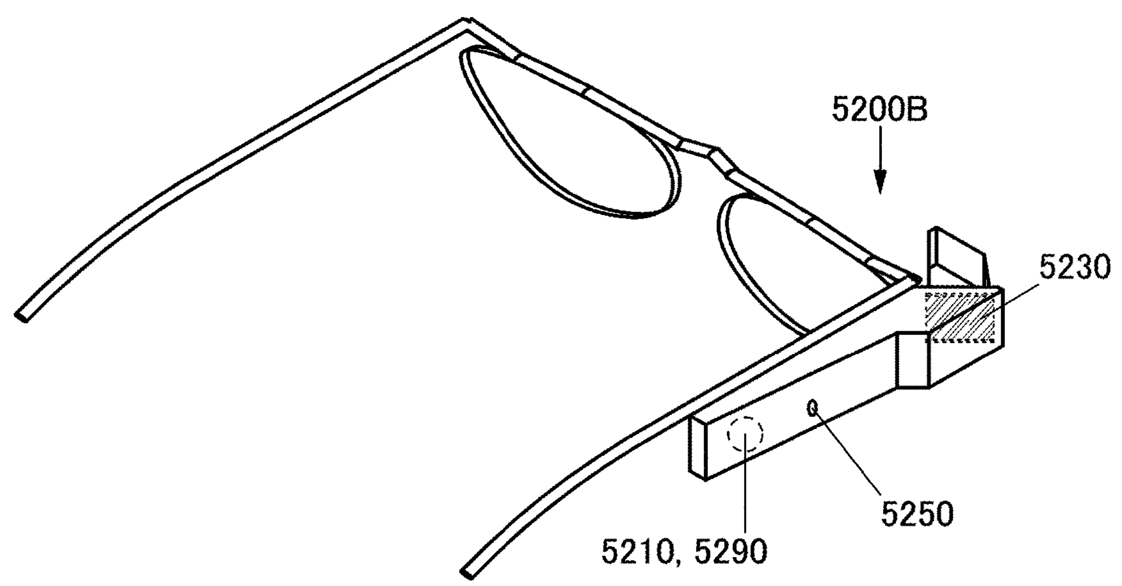

FIG. 18 to FIG. 20 are diagrams illustrating structure examples of electronic devices of embodiments of the present invention. FIG. 18A is a block diagram of the electronic device, and FIG. 18B to FIG. 18E are perspective views illustrating structures of the electronic devices. FIG. 19A to FIG. 19E are perspective views illustrating structures of the electronic devices. FIG. 20A and FIG. 20B are perspective views illustrating structures of the electronic devices.

An electronic device 5200B described in this embodiment includes an arithmetic device 5210 and an input/output device 5220 (see FIG. 18A).

The arithmetic device 5210 has a function of being supplied with operation data and has a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the electronic device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image data. For example, the display panel described in Embodiment 2 can be used for the display portion 5230.

The sensing portion 5250 has a function of supplying sensing data. For example, the sensing portion 5250 has a function of sensing a surrounding environment where the electronic device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

FIG. 18B illustrates an electronic device having an outer shape along a cylindrical column or the like. An example of such an electronic device is digital signage. The display panel of one embodiment of the present invention can be used for the display portion 5230. Note that the electronic device has a function of changing its display method in accordance with the illuminance of a usage environment. Furthermore, the electronic device has a function of changing displayed content in response to sensed existence of a person. This allows the electronic device to be provided on a column of a building, for example. The electronic device can display advertising, guidance, or the like. The electronic device can be used for digital signage or the like.

FIG. 18C illustrates an electronic device having a function of generating image data on the basis of the path of a pointer used by the user. Examples of such an electronic device include an electronic blackboard, an electronic bulletin board, and digital signage. Specifically, the display panel with a diagonal size of 20 inches or longer, preferably 40 inches or longer, and further preferably 55 inches or longer can be used. Alternatively, a plurality of display panels can be arranged and used as one display region. Alternatively, a plurality of display panels can be arranged and used as a multiscreen.

FIG. 18D illustrates an electronic device that is capable of receiving data from another device and displaying the data on the display portion 5230 as a wrist-watch-type portable information terminal. As an example, a smart watch (registered trademark) or the like is given. Specifically, the electronic device can display several options, or allow a user to choose some from the options and send a reply to the data transmitter. Alternatively, for example, the electronic device has a function of changing its display method in accordance with the illuminance of a usage environment. Thus, the power consumption of a smartwatch can be reduced, for example. Alternatively, an image can be displayed on a smartwatch even in an environment under strong external light, e.g., outdoors in fine weather, for example, so that the smartwatch can be suitably used FIG. 18E illustrates an electronic device including the display portion 5230 having a surface gently curved along a side surface of a housing. An example of such an electronic device is a mobile phone. The display portion 5230 includes a display panel, and the display panel has a function of performing display on the front surface, the side surfaces, the top surface, and the rear surface, for example. Thus, for example, a mobile phone can display data not only on the front surface but also on the side surfaces, the top surface, and the rear surface.

FIG. 19A illustrates an electronic device that is capable of receiving data via the Internet and displaying the data on the display portion 5230. An example of such an electronic device is a smartphone. For example, a created message can be checked on the display portion 5230. The created message can be sent to another device. The electronic device has a function of changing its display method in accordance with the illuminance of a usage environment, for example. Thus, the power consumption of a smartphone can be reduced. A smartphone can display an image on the display portion 5230 to be suitably used even in an environment under strong external light, e.g., outdoors in fine weather, for example.

FIG. 19B illustrates an electronic device that can use a remote controller as the input portion 5240. An example of such an electronic device is a television system. For example, the electronic device can receive data from a broadcast station or via the Internet and display the data on the display portion 5230. An image of a user can be taken using the sensing portion 5250. The image of the user can be transmitted. The electronic device can acquire a viewing history of the user and provide it to a cloud service. The electronic device can acquire recommendation data from a cloud service and display the data on the display portion 5230. A program or a moving image can be displayed on the basis of the recommendation data. The electronic device has a function of changing its display method in accordance with the illuminance of a usage environment, for example. Accordingly, for example, the display portion 5230 can display an image to be suitably used even when irradiated with strong external light that enters a room in fine weather.

FIG. 19C illustrates an electronic device that is capable of receiving educational materials via the Internet and displaying them on the display portion 5230. An example of such an electronic device is a tablet computer. An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another electronic device. When the electronic device is placed on a stand or the like, the display portion 5230 can be used as a subdisplay. Thus, for example, a tablet computer can display an image to be suitably used even in an environment under strong external light, e.g., outdoors in fine weather.

FIG. 19D illustrates an electronic device including a plurality of display portions 5230. An example of such an electronic device is a digital camera. For example, the display portion 5230 can display an image that the sensing portion 5250 is capturing. A captured image can be displayed on the display portion 5230. A captured image can be decorated using the input portion 5240. A message can be attached to a captured image. A captured image can be transmitted via the Internet. The electronic device has a function of changing its shooting conditions in accordance with the illuminance of a usage environment. Accordingly, for example, the display portion 5230 can display an object in such a manner that an image is favorably viewed even in an environment under strong external light, e.g., outdoors in fine weather.

FIG. 19E illustrates an electronic device in which the electronic device of this embodiment is used as a master to control another electronic device used as a slave. An example of such an electronic device is a portable personal computer. As an example, part of image data can be displayed on the display portion 5230 and another part of the image data can be displayed on a display portion of another electronic device. Image signals can be supplied to another electronic device. With the communication portion 5290, data to be written can be obtained from an input portion of another electronic device. Thus, a large display region can be utilized by using a portable personal computer, for example.

FIG. 20A illustrates an electronic device including the sensing portion 5250 that senses an acceleration or a direction. An example of such an electronic device is a goggles-type electronic device. The sensing portion 5250 can supply data on the position of the user or the direction in which the user faces. The electronic device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on display portion 5230, for example.

FIG. 20B illustrates an electronic device including the sensing portion 5250 that senses an acceleration or a direction. An example of such an electronic device is a glasses-type electronic device. The sensing portion 5250 can supply data on the position of the user or the direction in which the user faces. The electronic device can generate image data in accordance with the position of the user or the direction in which the user faces. Accordingly, the data can be shown together with a real-world scene, for example. An augmented reality image can be displayed on a glasses-type electronic device.

Note that this embodiment can be combined with any of the other embodiments described in this specification as appropriate.

Embodiment 5

Figure 21A:
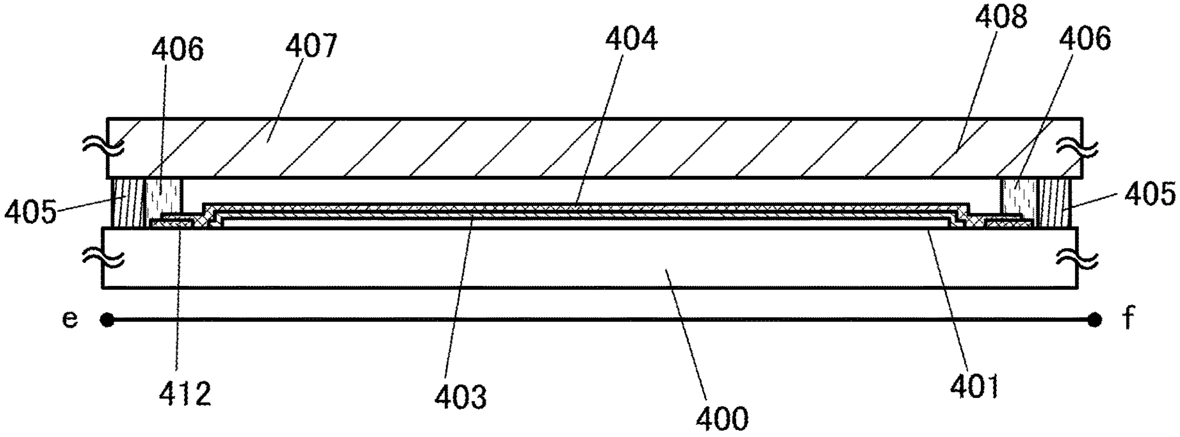
FIG. 21A and FIG. 21B are diagrams illustrating electronic devices of embodiments.
Figure 21B:
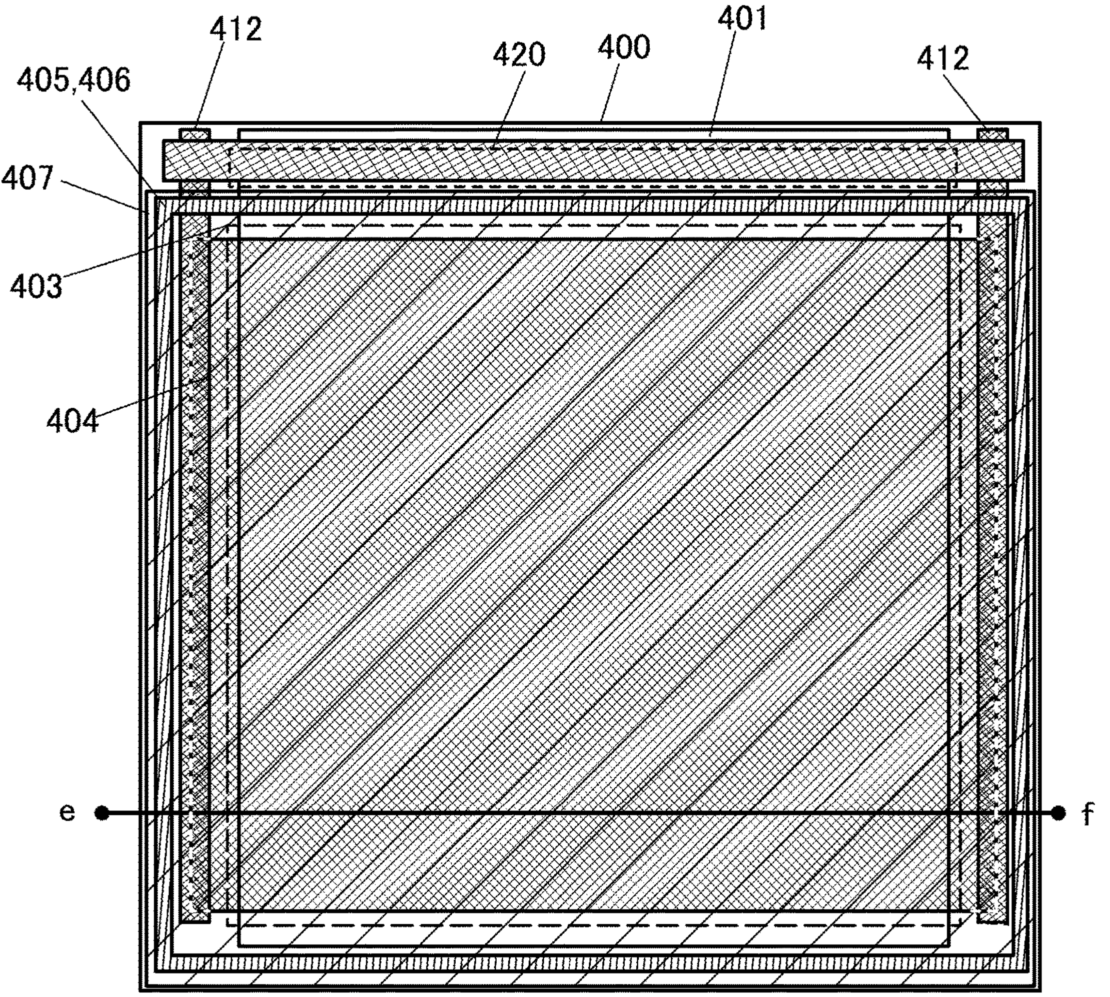

In this embodiment, a structure in which the light-emitting device described in Embodiment 2 is used for a lighting device will be described with reference to FIG. 21. FIG. 21A is a cross-sectional view taken along e-f in FIG. 21B which is a top view of a lighting device.

In the lighting device in this embodiment, a first electrode 401 is formed over a substrate 400 which is a support and has a light-transmitting property. The first electrode 401 corresponds to the first electrode 101 in Embodiment 1. In the case where light emission is extracted from the first electrode 401 side, the first electrode 401 is formed with a material having a light-transmitting property.

A pad 412 for supplying a voltage to a second electrode 404 is formed over the substrate 400.

An EL layer 403 is formed over the first electrode 401. The structure of the EL layer 403 corresponds to, for example, the structure of the EL layer 103 in Embodiment 1 or the structure in which the EL layers 103*a*, 103*b*, and 103*c* and the charge-generation layers 106 (106*a* and 106*b*) are combined. Note that for these structures, the corresponding description can be referred to.

The second electrode 404 is formed to cover the EL layer 403. The second electrode 404 corresponds to the second electrode 102 in Embodiment 1. In the case where light-emission is extracted from the first electrode 401 side, the second electrode 404 is formed with a material having high reflectivity. The second electrode 404 is supplied with a voltage when connected to the pad 412.

As described above, the lighting device described in this embodiment includes a light-emitting device including the first electrode 401, the EL layer 403, and the second electrode 404. Since the light-emitting device is a light-emitting device with a high emission efficiency, the lighting device in this embodiment can be a lighting device with low power consumption.

The substrate 400 over which the light-emitting device having the above structure is formed is fixed to a sealing substrate 407 with a sealant 405 and a sealant 406 and sealing is performed, whereby the lighting device is completed. It is possible to use only either the sealant 405 or the sealant 406. In addition, the inner sealant 406 (not illustrated in FIG. 21B) can be mixed with a desiccant, which enables moisture to be adsorbed, resulting in improved reliability.

When parts of the pad 412 and the first electrode 401 are provided to extend to the outside of the sealant 405 and the sealant 406, those can serve as external input terminals. An IC chip 420 mounted with a converter or the like may be provided over the external input terminals.

Embodiment 6

Figure 22:
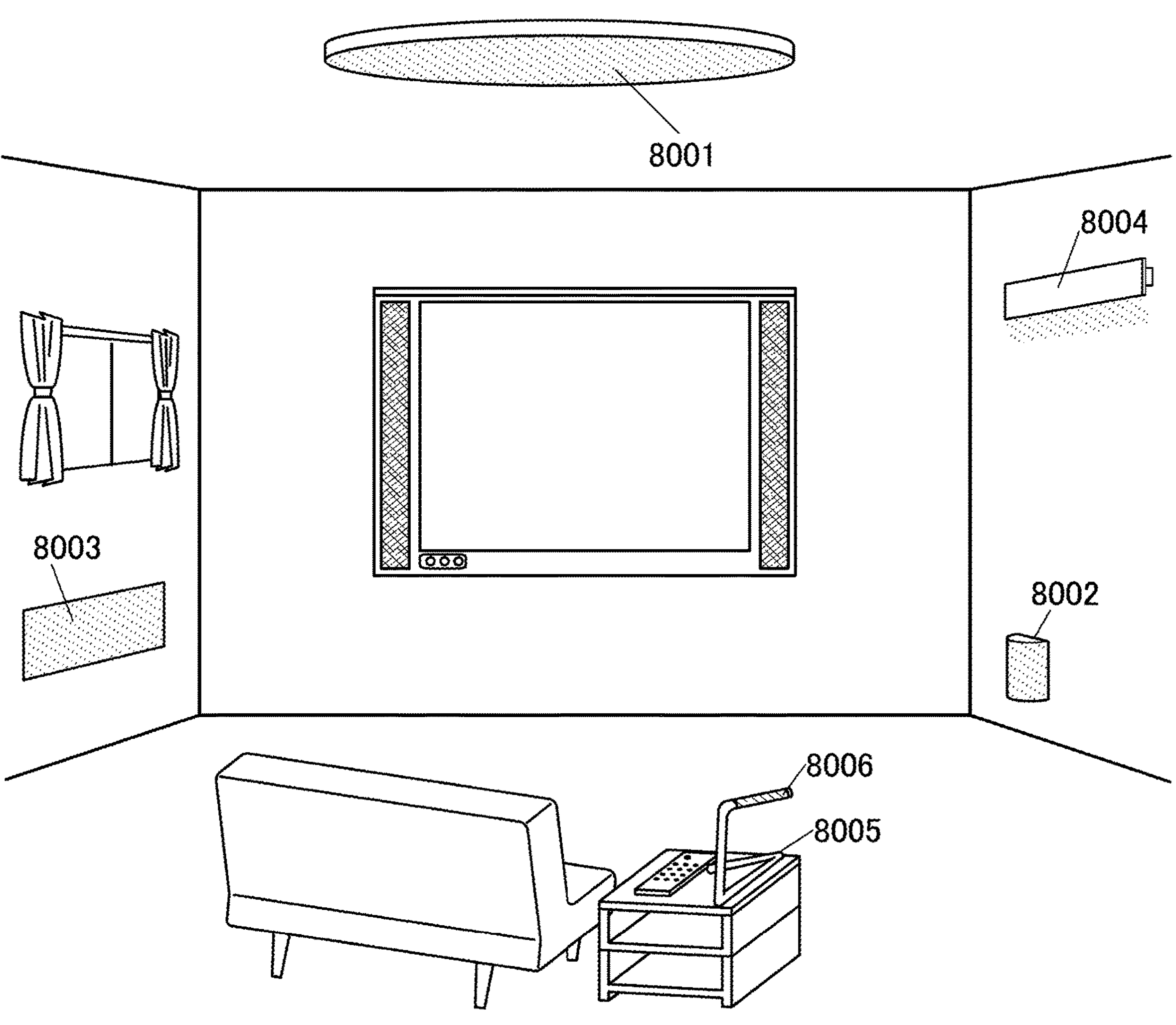
FIG. 22 is a diagram illustrating electronic devices of embodiments.

In this embodiment, application examples of lighting devices fabricated using the light-emitting apparatus of one embodiment of the present invention or the light-emitting device, which is part of the light-emitting apparatus, will be described with reference to FIG. 22.

A ceiling light 8001 can be used as an indoor lighting device. Examples of the ceiling light 8001 include a direct-mount light and an embedded light. Such lighting devices are fabricated using the light-emitting apparatus and a housing or a cover in combination. Other than that, application to a cord pendant light (light that is suspended from the ceiling by a cord) is also possible.

A foot light 8002 lights the floor so that safety on the floor can be improved. It can be effectively used in a bedroom, on a staircase, or in a passage, for example. In that case, the size or shape of the foot light can be changed in accordance with the area or structure of a room. The foot light can be a stationary lighting device made from the combination of the light-emitting apparatus and a support.

A sheet-like lighting 8003 is a thin sheet-like lighting device. The sheet-like lighting, which is attached to a wall when used, is space-saving and thus can be used for a wide variety of applications. Furthermore, the area of the sheet-like lighting can be easily increased. The sheet-like lighting can also be used on a wall or housing having a curved surface.

In addition, a lighting device 8004 in which the light from a light source is controlled to be only in a desired direction can be used.

A desk lamp 8005 includes a light source 8006. As the light source 8006, the light-emitting apparatus of one embodiment of the present invention or the light-emitting device, which is part of the light-emitting apparatus, can be used.

In addition to the above examples, when the light-emitting apparatus of one embodiment of the present invention or the light-emitting device which, is part of the light-emitting apparatus, is used as a part of furniture in a room, a lighting device with functions of furniture can be obtained.

As described above, a variety of lighting devices that include the light-emitting apparatus can be obtained. Note that these lighting devices are also embodiments of the present invention.

The structures described in this embodiment can be used in an appropriate combination with any of the structures described in the other embodiments.

REFERENCE NUMERALS

100: light-emitting device, 101: first electrode, 102: second electrode, 103, 103*a*, 103*b*, 103*c*: EL layer, 103B,

103G, 103R: EL layer, 103P, 103Q: EL layer, 104, 104*a*, 104*b*: hole-injection/transport layer, 104B, 104G, 104R: hole-injection/transport layer, 104P, 104Q: hole-injection/transport layer, 105, 105B, 105G, 105R: oxidation-resistant layer, 106, 106B, 106G, 106R: charge-generation layer, 107: block layer, 108: electron-injection/transport layer, 111, 111*a*, 11*lb*: hole-injection layer, 112, 112*a*, 112*b*: hole-transport layer, 113, 113*a*, 113*b*, 113*c*: light-emitting layer, 114, 114*b*: electron-transport layer, 115, 115*b*: electron-injection layer, 231: display region, 400: substrate, 401: first electrode, 403: EL layer, 404: second electrode, 405, 406: sealant, 407: sealing substrate, 412: pad, 420: IC chip, 501C: insulating film, 501D: insulating film, 504: conductive film, 506: insulating film, 508: semiconductor film, 508A: region, 508B: region, 508C: region, 510: substrate, 512A: conductive film, 512B: conductive film, 519: terminal, 520: functional layer, 524: conductive film, 528: partition, 528B: opening, 528G: opening, 528R: opening, 530B: pixel circuit, 530G: pixel circuit, 540: insulating layer, 550B: light-emitting device, 550G: light-emitting device, 550R: light-emitting device, 551B: electrode, 551G: electrode, 551R: electrode, 552: electrode, 573: insulating layer, 580: space, 700: light-emitting apparatus, 702B: pixel, 702G: pixel, 702R: pixel, 703: pixel, 705: insulating layer, 770: substrate, 951: substrate, 952: electrode, 953: insulating layer, 954: partition layer, 955: EL layer, 956: electrode, 5200B: electronic device, 5210: arithmetic device, 5220: input/output device, 5230: display portion, 5240: input portion, 5250: sensing portion, 5290: communication portion, 8001: ceiling light, 8002: foot light, 8003: sheet-like lighting, 8004: lighting device, 8005: desk lamp, 8006: light source This application is based on Japanese Patent Application Serial No. 2020-210174 filed on Dec. 18, 2020, the entire contents are hereby incorporated herein by reference.

The invention claimed is:

1. A light-emitting device comprising a first electrode, a hole-injection layer, a hole-transport layer, a light-emitting layer, an electron-transport layer, an electron-injection layer, an oxidation-resistant layer, a block layer, and a second electrode, wherein the hole-injection layer is located between the first electrode and the hole-transport layer, wherein the hole-transport layer is located between the hole-injection layer and the light-emitting layer, wherein the light-emitting layer is located between the hole-transport layer and the electron-transport layer, wherein the electron-transport layer is located between the light-emitting layer and the electron-injection layer, wherein the electron-injection layer is located between the electron-transport layer and the oxidation-resistant layer, wherein the oxidation-resistant layer is located between the electron-injection layer and the second electrode, wherein the block layer is in contact with a side surface of the hole-injection layer, a side surface of the hole-transport layer, a side surface of the light-emitting layer, a side surface of the electron-transport layer, a side surface of the electron-injection layer, a side surface of the oxidation-resistant layer, a top surface of the oxidation-resistant layer, and the second electrode, wherein the second electrode faces the side surface of the hole-injection layer, the side surface of the hole-transport layer, the side surface of the light-emitting layer, the side surface of the electron-transport layer, the side surface of the electron-injection layer, the side surface of the oxidation-resistant layer, and the top surface of the oxidation-resistant layer through the block layer, and wherein the block layer comprises a hole-transport material.

2. The light-emitting device according to claim 1, wherein the oxidation-resistant layer comprises any one or a plurality of oxides of metals belonging to Group 4 to Group 8 of the periodic table and an organic compound having an electron-withdrawing group.

3. The light-emitting device according to claim 1, wherein the oxidation-resistant layer comprises any one or a plurality of a molybdenum oxide, a vanadium oxide, a niobium oxide, a tantalum oxide, a chromium oxide, a tungsten oxide, a manganese oxide, a rhenium oxide, 7,7,8,8-tetracyano-2,3,5,6-tetrafluoroquinodimethane, 3,6-difluoro-2,5,7,7,8,8-hexacyanoquinodimethane, chloranil, 2,3,6,7,10,11-hexacyano-1,4,5,8,9,12-hexaazatriphenylene, 1,3,4,5,7,8-hexafluorotetracyano-naphthoquinodimethane, and 2-(7-dicyano methylen-1,3,4,5,6,8,9,10-octafluoro-7H-pyren-2-ylidene) malononitrile.

4. A light-emitting apparatus comprising:

the light-emitting device according to claim 1; and a transistor or a substrate.

5. A light-emitting apparatus comprising:

a first light-emitting device;

a second light-emitting device; and a partition, wherein the first light-emitting device comprises a first electrode, a hole-injection layer, a hole-transport layer, a light-emitting layer, an electron-transport layer, an electron-injection layer, an oxidation-resistant layer, a block layer, and a second electrode, wherein the hole-injection layer is located between the first electrode and the hole-transport layer, wherein the hole-transport layer is located between the hole-injection layer and the light-emitting layer, wherein the light-emitting layer is located between the hole-transport layer and the electron-transport layer, wherein the electron-transport layer is located between the light-emitting layer and the electron-injection layer, wherein the electron-injection layer is located between the electron-transport layer and the oxidation-resistant layer, wherein the oxidation-resistant layer is located between the electron-injection layer and the second electrode, wherein the block layer is in contact with a side surface of the hole-injection layer, a side surface of the hole-transport layer, a side surface of the light-emitting layer, a side surface of the electron-transport layer, a side surface of the electron-injection layer, a side surface of the oxidation-resistant layer, a top surface of the oxidation-resistant layer, and the second electrode, wherein the second electrode faces the side surface of the hole-injection layer, the side surface of the hole-transport layer, the side surface of the light-emitting layer, the side surface of the electron-transport layer, the side surface of the electron-injection layer, the side surface of the oxidation-resistant layer, and the top surface of the oxidation-resistant layer through the block layer, wherein the second light-emitting device comprises a third electrode and the second electrode, wherein the partition comprises a first opening and a second opening, wherein the first opening and the first electrode overlap each other, wherein the second opening and the third electrode overlap each other, and wherein the block layer comprises a hole-transport material.

6. The light-emitting apparatus according to claim 5, wherein the oxidation-resistant layer comprises any one or a plurality of oxides of metals belonging to Group 4 to Group 8 of the periodic table and an organic compound having an electron-withdrawing group.

7. The light-emitting apparatus according to claim 5, wherein the oxidation-resistant layer comprises any one or a plurality of a molybdenum oxide, a vanadium oxide, a niobium oxide, a tantalum oxide, a chromium oxide, a tungsten oxide, a manganese oxide, a rhenium oxide, 7,7,8,8-tetracyano-2,3,5,6-tetrafluoroquinodimethane, 3,6-difluoro-2,5,7,7,8,8-hexacyanoquinodimethane, chloranil, 2,3,6,7,10,11-hexacyano-1,4,5,8,9,12-hexaazatriphenylene, 1,3,4,5,7,8-hexafluorotetracyano-naphthoquinodimethane, and 2-(7-dicyano methylen-1,3,4,5,6,8,9,10-octafluoro-7H-pyren-2-ylidene) malononitrile.

8. An electronic device comprising:

the light-emitting apparatus according to claim 5; and a sensor, an operation button, a speaker, or a microphone.

9. A lighting device comprising:

the light-emitting apparatus according to claim 5; and a housing.

* * * * *